(12) United States Patent
Cho et al.

(10) Patent No.: US 11,994,910 B2
(45) Date of Patent: May 28, 2024

(54) ELECTRONIC DEVICE INCLUDING FLEXIBLE DISPLAY

(71) Applicant: Samsung Electronics Co., Ltd., Suwon-si (KR)

(72) Inventors: Joongyeon Cho, Suwon-si (KR); Hyunsuk Kim, Suwon-si (KR); Soohyun Seo, Suwon-si (KR); Jihyung Jung, Suwon-si (KR); Nakhyun Choi, Suwon-si (KR); Yangwook Kim, Suwon-si (KR); Byounguk Yoon, Suwon-si (KR); Hyunju Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 314 days.

(21) Appl. No.: 17/375,581

(22) Filed: Jul. 14, 2021

(65) Prior Publication Data
US 2022/0019264 A1    Jan. 20, 2022

Related U.S. Application Data

(63) Continuation of application No. PCT/KR2021/008837, filed on Jul. 9, 2021.

(30) Foreign Application Priority Data

Jul. 14, 2020  (KR) .................. 10-2020-0086553
Jun. 1, 2021   (KR) .................. 10-2021-0070799

(51) Int. Cl.
*G06F 1/16*    (2006.01)
*H04M 1/02*    (2006.01)
(Continued)

(52) U.S. Cl.
CPC .............. *G06F 1/1652* (2013.01); *G06F 1/16* (2013.01); *G06F 1/1624* (2013.01);
(Continued)

(58) Field of Classification Search
CPC ........ G06F 1/1652; G06F 1/16; G06F 1/1656; G06F 1/1686; G06F 1/1688;
(Continued)

(56) References Cited

U.S. PATENT DOCUMENTS 7,697,281 B2   4/2010  Dabov et al.
8,126,170 B2   2/2012  Yeates et al.
(Continued)

FOREIGN PATENT DOCUMENTS

CN    101459704 A  *  6/2009  ............... H04B 1/38
CN    102123187 A     7/2011
(Continued)

OTHER PUBLICATIONS

International Search Report dated Oct. 26, 2021, issued in International Application No. PCT/KR2021/008837.
(Continued)

*Primary Examiner* — Douglas M Wilson
(74) *Attorney, Agent, or Firm* — Jefferson IP Law, LLP

(57) ABSTRACT

An electronic device is provided. The electronic device includes a first structure, a second structure coupled to the first structure so as to be slidable in a first direction or a second direction opposite to the first direction, a display that is at least partially disposed on the second structure and that moves relative to the first structure together with the second structure, in which a size of an area of the display exposed on a front side of the electronic device is changed in response to a sliding motion of the second structure, and a driving unit that connects part of the first structure and part of the second structure and generates an elastic force in the
(Continued)

first direction or the second direction in response to a movement of the second structure.

17 Claims, 27 Drawing Sheets

(51) Int. Cl.
*H05K 5/00* (2006.01)
*H05K 5/02* (2006.01)
*G06F 3/041* (2006.01)
*G09F 9/30* (2006.01)

(52) U.S. Cl.
CPC .......... *G06F 1/1656* (2013.01); *G06F 1/1686* (2013.01); *G06F 1/1688* (2013.01); *G06F 1/1698* (2013.01); *G06F 3/041* (2013.01); *G09F 9/30* (2013.01); *G09F 9/301* (2013.01); *H04M 1/0235* (2013.01); *H04M 1/0237* (2013.01); *H04M 1/026* (2013.01); *H04M 1/0268* (2013.01); *H05K 5/0004* (2013.01); *H05K 5/0217* (2013.01)

(58) Field of Classification Search
CPC ...... G06F 1/1698; G06F 3/041; G06F 1/1624; G09F 9/30; G09F 9/301; H04M 1/0235; H04M 1/0237; H04M 1/026; H04M 1/0268; H05K 5/0004; H05K 5/0217
See application file for complete search history.

(56) References Cited

U.S. PATENT DOCUMENTS

| | | | |
|---|---|---|---|
| 8,199,471 | B2 | 6/2012 | Bemelmans et al. |
| 8,250,724 | B2 | 8/2012 | Dabov et al. |
| 8,457,333 | B2 | 6/2013 | Yeates et al. |
| 8,711,566 | B2 | 4/2014 | O'Brien |
| 8,825,122 | B2 | 9/2014 | Huang et al. |
| 8,947,304 | B2 | 2/2015 | Park et al. |
| 9,195,272 | B2 | 11/2015 | O'Brien |
| 9,521,321 | B1 | 12/2016 | Kozko |
| 10,180,702 | B2 | 1/2019 | Dabov et al. |
| 10,270,952 | B2 | 4/2019 | Liu et al. |
| 10,419,589 | B2 | 9/2019 | Fan et al. |
| 10,481,641 | B2 | 11/2019 | Lee et al. |
| 10,686,971 | B1 | 6/2020 | Yoo et al. |
| 10,743,427 | B2 | 8/2020 | Huang |
| 10,775,844 | B2 | 9/2020 | Dabov et al. |
| 10,804,608 | B2 | 10/2020 | Seo et al. |
| 10,868,264 | B2 | 12/2020 | Shin et al. |
| 10,878,728 | B2 | 12/2020 | Yoon |
| 10,880,417 | B1 | 12/2020 | Song et al. |
| 10,887,438 | B2 | 1/2021 | Baek et al. |
| 11,003,207 | B2 | 5/2021 | Kim et al. |
| 11,042,192 | B2 | 6/2021 | Choi et al. |
| 11,056,769 | B2 | 7/2021 | Jeon et al. |
| 11,158,929 | B2 | 10/2021 | Shi et al. |
| 11,212,379 | B2 | 12/2021 | Baek et al. |
| 11,252,826 | B2 | 2/2022 | Park et al. |
| 11,283,910 | B2 | 3/2022 | Lee |
| 11,416,037 | B2 | 8/2022 | Choi et al. |
| 11,452,459 | B2 | 9/2022 | Jung et al. |
| 2010/0177020 | A1 | 7/2010 | Bemelmans et al. |
| 2012/0329531 | A1 | 12/2012 | Park et al. |
| 2013/0058063 | A1 | 3/2013 | O'Brien |
| 2013/0070396 | A1 | 3/2013 | Huang et al. |
| 2018/0167540 | A1 | 6/2018 | Liu et al. |
| 2019/0041909 | A1 | 2/2019 | Pakula et al. |
| 2019/0103656 | A1 | 4/2019 | Shi et al. |
| 2019/0243424 | A1 | 8/2019 | Lee et al. |
| 2019/0253543 | A1 | 8/2019 | Fan et al. |
| 2019/0261519 | A1 | 8/2019 | Park et al. |
| 2019/0268455 | A1 | 8/2019 | Baek et al. |
| 2019/0305237 | A1 | 10/2019 | Shin et al. |
| 2019/0317550 | A1 | 10/2019 | Kim et al. |
| 2019/0319416 | A1 | 10/2019 | Zhang et al. |
| 2020/0020255 | A1 | 1/2020 | Yoon |
| 2020/0046235 | A1 | 2/2020 | Jung et al. |
| 2020/0120814 | A1 | 4/2020 | Huang |
| 2020/0144699 | A1 | 5/2020 | Jeon et al. |
| 2020/0144722 | A1 | 5/2020 | Seo et al. |
| 2020/0177773 | A1 | 6/2020 | Yoo et al. |
| 2020/0371558 | A1 | 11/2020 | Kim et al. |
| 2020/0383247 | A1 | 12/2020 | Jin et al. |
| 2021/0098723 | A1 | 4/2021 | Shin et al. |
| 2021/0126993 | A1 | 4/2021 | Baek et al. |
| 2021/0195008 | A1 | 6/2021 | Lee |
| 2021/0219437 | A1 | 7/2021 | Kim et al. |
| 2021/0223820 | A1* | 7/2021 | Yoo ............... G06F 1/1681 |
| 2021/0232180 | A1 | 7/2021 | Pakula et al. |
| 2021/0250432 | A1 | 8/2021 | Lim et al. |
| 2021/0263552 | A1 | 8/2021 | Kim et al. |
| 2022/0069444 | A1 | 3/2022 | Shi et al. |
| 2022/0279666 | A1 | 9/2022 | Park et al. |
| 2022/0337688 | A1* | 10/2022 | Sang ............... G06F 1/1652 |
| 2022/0382331 | A1 | 12/2022 | Choi et al. |
| 2023/0008000 | A1 | 1/2023 | Song et al. |

FOREIGN PATENT DOCUMENTS

| | | |
|---|---|---|
| CN | 111243440 A | 6/2020 |
| EP | 2 775 376 A1 | 9/2014 |
| KR | 10-2011-0107412 A | 9/2011 |
| KR | 10-2012-0040932 A | 4/2012 |
| KR | 10-2012-0140373 A | 12/2012 |
| KR | 10-2015-0105717 A | 9/2015 |
| KR | 10-2017-0025520 A | 3/2017 |
| KR | 10-1733497 B1 | 5/2017 |
| KR | 10-2018-0093628 A | 8/2018 |
| KR | 10-2019-0060305 A | 6/2019 |
| KR | 10-2019-0086305 A | 7/2019 |
| KR | 10-2019-0094412 A | 8/2019 |
| KR | 10-2019-0096026 A | 8/2019 |
| KR | 10-2019-0101184 A | 8/2019 |
| KR | 10-2019-0101605 A | 9/2019 |
| KR | 10-2019-0105858 A | 9/2019 |
| KR | 10-2019-0113128 A | 10/2019 |
| KR | 10-2019-0119719 A | 10/2019 |
| KR | 10-2019-0143029 A | 12/2019 |
| KR | 10-2020-0007366 A | 1/2020 |
| KR | 10-2020-0041970 A | 4/2020 |
| KR | 10-2020-0051399 A | 5/2020 |
| KR | 10-2020-0052096 A | 5/2020 |
| KR | 10-2106296 B1 | 5/2020 |
| KR | 10-2020-0081906 A | 7/2020 |
| WO | 2021/187641 A1 | 9/2021 |

OTHER PUBLICATIONS

International Search Report dated Nov. 4, 2021, issued in International Application No. PCT/KR2021/008963.

International Search Report dated Nov. 12, 2021, issued in International Application No. PCT/KR2021/008962.

European Search Report dated Nov. 6, 2023, issued in European Application No. 21842472.9.

European Search Report dated Nov. 22, 2023, issued in European Application No. 21842226.9.

European Search Report dated Nov. 20, 2023, issued in European Application No. 21841677.4.

Indian Office Action dated Mar. 26, 2024, issued in Indian Application No. 202317006989.

U.S. Office Action dated Jan. 31, 2024, issued in U.S. Appl. No. 18/149,483.

* cited by examiner

ELECTRONIC DEVICE INCLUDING FLEXIBLE DISPLAY

CROSS-REFERENCE TO RELATED APPLICATION(S)

This application is a continuation application, claiming priority under § 365(c), of an International application No. PCT/KR2021/008837, filed on Jul. 9, 2021, which is based on and claims the benefit of a Korean patent application number 10-2020-0086553, filed on Jul. 14, 2020, in the Korean Intellectual Property Office, and of a Korean patent application number 10-2021-0070799, filed on Jun. 1, 2021, in the Korean Intellectual Property Office, the disclosure of each of which is incorporated by reference herein in its entirety.

BACKGROUND

1. Field

The disclosure relates to an electronic device including a flexible display.

2. Description of Related Art

An electronic device may include a flexible display. The electronic device may expand a display area visually exposed on the exterior of the electronic device. For example, the flexible display may be disposed in a curved, foldable, or rollable form in the electronic device.

The above information is presented as background information only to assist with an understanding of the disclosure. No determination has been made, and no assertion is made, as to whether any of the above might be applicable as prior art with regard to the disclosure.

SUMMARY

Recently, various forms of electronic devices have been developed to ensure an expanded display area without affecting portability. For example, the electronic devices may include an electronic device of a slidable type in which a fixed structure and a sliding structure are developed relative to each other in a sliding manner or an electronic device of a foldable type in which a first housing and a second housing are disposed to be folded or unfolded.

In the case of the electronic device of the slidable type among the various forms of electronic devices, the sliding structure may move relative to the fixed structure, and accordingly an area of a flexible display exposed on a front side of the electronic device may be expanded or reduced.

Aspects of the disclosure are to address at least the above-mentioned problems and/or disadvantages and to provide at least the advantages described below. Accordingly, an aspect of the disclosure is to provide an electronic device capable of being changed to an expanded state or a reduced state through a driving unit (e.g., a spring module) disposed between a sliding structure moving together with a display and a fixed structure supporting the sliding structure.

Additional aspects will be set forth in part in the description which follows and, in part, will be apparent from the description, or may be learned by practice of the presented embodiments.

In accordance with an aspect of the disclosure, an electronic device is provided. The electronic device includes a first structure, a second structure coupled to the first structure so as to be slidable in a first direction or a second direction opposite to the first direction, a display that is at least partially disposed on the second structure and that moves relative to the first structure together with the second structure, in which a size of an area of the display exposed on a front side of the electronic device is changed in response to a sliding motion of the second structure, and a driving unit that connects part of the first structure and part of the second structure and generates an elastic force in the first direction or the second direction in response to a movement of the second structure. The first structure includes a rear member that forms part of a rear side of the electronic device and a bracket disposed between the rear member and the second structure and configured such that a partial area faces the second structure. The driving unit is disposed between the second structure and the bracket and has one portion coupled to the second structure and another portion coupled to the bracket.

In accordance with another aspect of the disclosure, an electronic device is provided. The electronic device includes a first structure including a bracket, and a rear member and a side member coupled to the bracket to surround part of the bracket, a second structure coupled to the first structure so as to be slidable in a first direction or a second direction opposite to the first direction, a display that is at least partially disposed on the second structure and that moves relative to the first structure together with the second structure, in which a size of an exposed area of the display that forms a front side of the electronic device is changed in response to a sliding motion of the second structure, and a driving unit that is disposed between the bracket and the second structure and that generates an elastic force in the first direction or the second direction in response to a movement of the second structure. The driving unit includes a first support portion coupled to the bracket, a second support portion coupled to the second structure, and an elastic portion that connects the first support portion and the second support portion and that is compressed or uncompressed with a change in a distance between the first support portion and the second support portion. The electronic device includes a first state in which the exposed area has a first size and a second state in which the exposed area is expanded to a second size larger than the first size as the second structure moves in the first direction by a predetermined distance in the first state. The driving unit is configured to generate the elastic force in a direction opposite to a moving direction of the second structure in a specified section and generate the elastic force in the same direction as the moving direction of the second structure after the specified section, when the electronic device is changed to the first state or the second state.

The driving unit may be disposed on the rear surface of the sliding structure. Accordingly, the electronic device according to the various embodiments of the disclosure may ensure a mounting space of the electronic device.

Furthermore, a user may operate the driving unit by sliding the display or the sliding structure. Accordingly, the electronic device according to the various embodiments of the disclosure may improve a feeling of use or intuition in a process in which the electronic device is used.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout of the drawings, like reference numerals will be understood to refer to like parts, components, and structures.

DETAILED DESCRIPTION

The following description with reference to accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications, of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
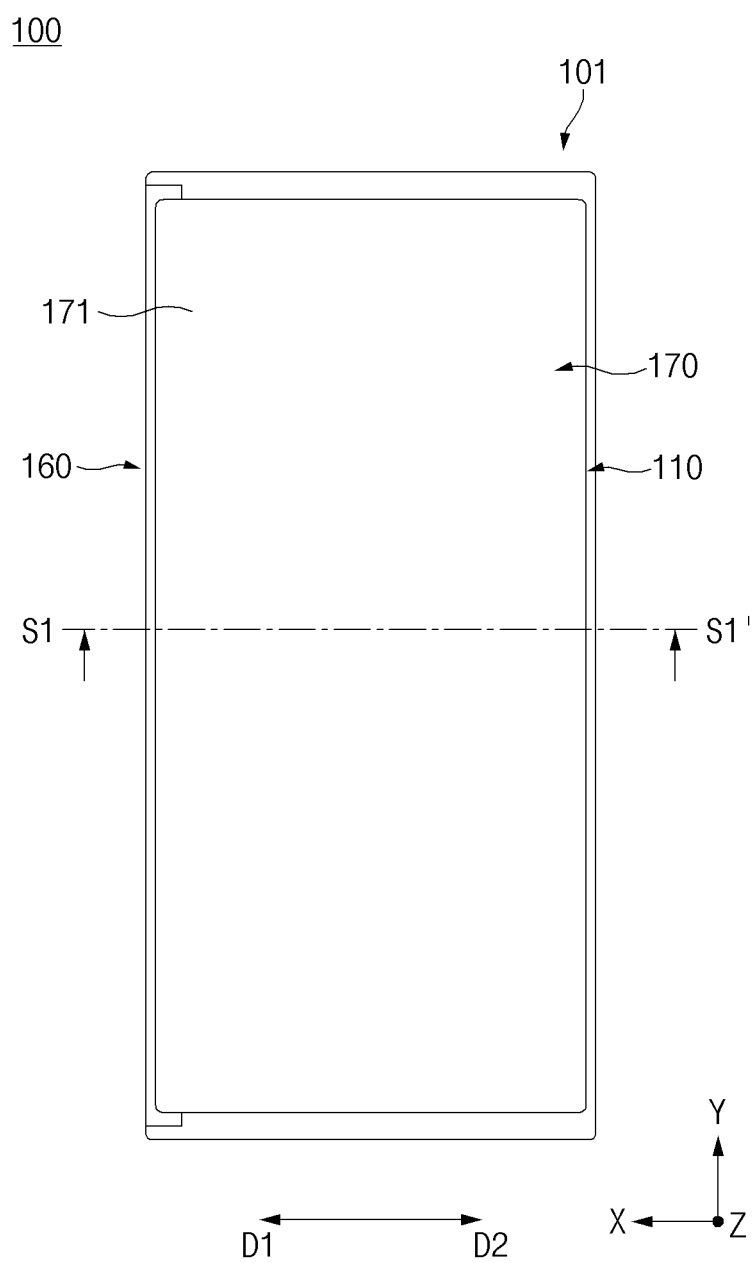
FIG. 1 illustrates a first state of an electronic device according to an embodiment of the disclosure.
Figure 2:
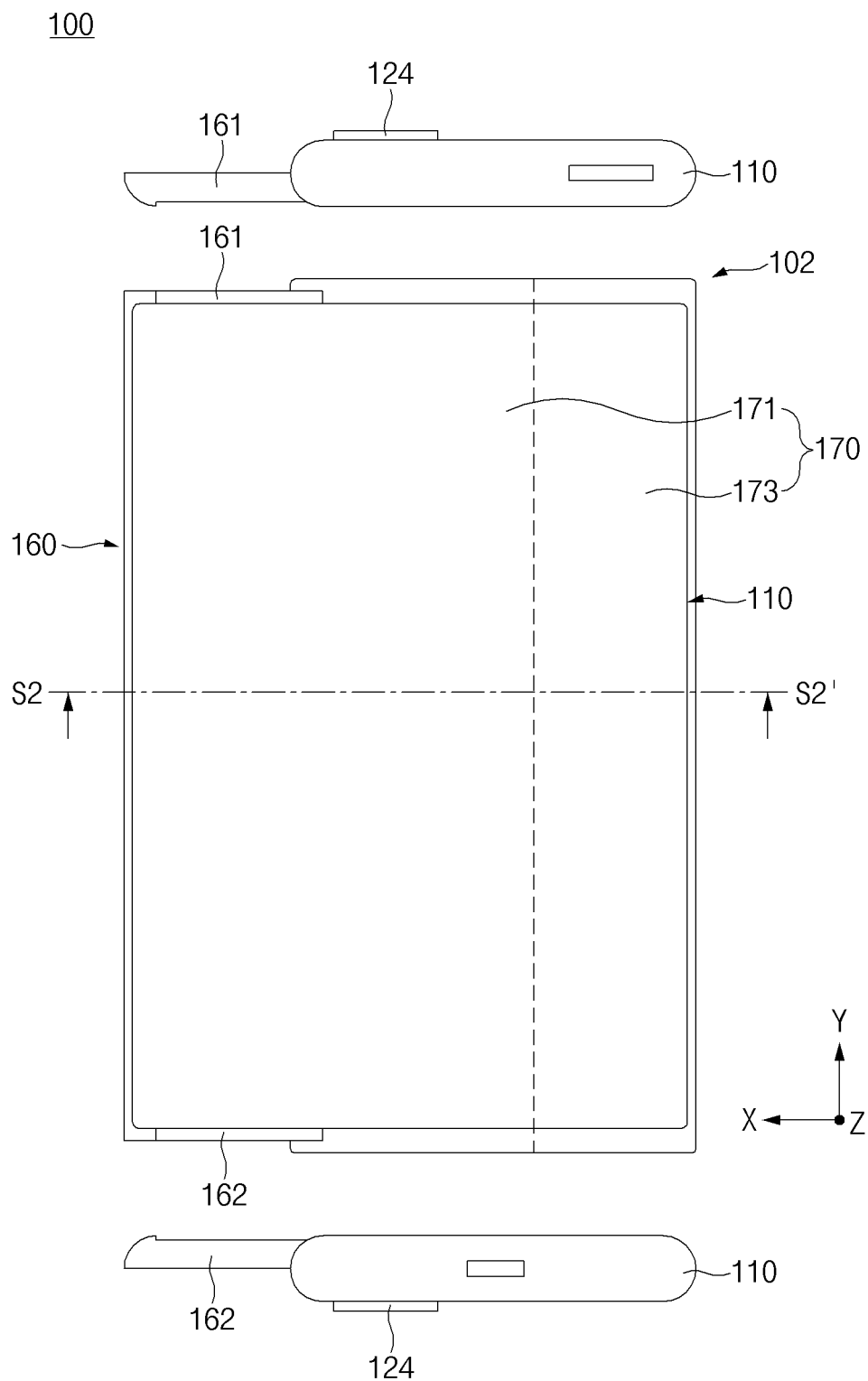
FIG. 2 illustrates a second state of an electronic device according to an embodiment of the disclosure.

FIG. 1 illustrates a first state of an electronic device according to an embodiment of the disclosure. FIG. 2 illustrates a second state of the electronic device according to an embodiment of the disclosure.

Referring to FIGS. 1 and 2, the electronic device 100 according to an embodiment may include a first structure 110, a second structure 160, and a display 170.

In an embodiment, the electronic device 100 may be an electronic device of a slidable type or a rollable type and may include the first state 101 (e.g., a closing mode, a reduction mode, or a slide-in mode) and the second state 102 (e.g., an opening mode, an expansion mode, or a slide-out mode). For example, the first state 101 and the second state 102 of the electronic device 100 may be determined depending on the position of the second structure 160 relative to the first structure 110 or the area of the display 170 exposed on a front side of the electronic device 100. In various embodiments, the electronic device 100 may be changed (or, switched) between the first state 101 and the second state 102 by a user operation or a mechanical operation.

In an embodiment, the first state 101 may refer to a state in which the area (or, size) of the display 170 that is exposed on the front side (e.g., the side facing the +Z-axis direction) of the electronic device 100 (or, that forms the front side) is relatively reduced (refer to FIG. 1). The second state may refer to a state in which the area (or, size) of the display 170 that is exposed on the front side of the electronic device 100 (or, that forms the front side) is relatively expanded (refer to FIG. 2). For example, the first state 101 may refer to a state in which the area of the display 170 exposed on the front side of the electronic device 100 is minimal. The second state 102 may refer to a state in which the area of the display 170 exposed on the front side of the electronic device 100 is maximal.

In various embodiments, the electronic device 100 may include an intermediate state (e.g., a third state) between the first state 101 and the second state 102. In the intermediate state, the area of the display 170 exposed on the front side of the electronic device 100 may be greater than that in the first state 101 and may be smaller than that in the second state 102. For example, the intermediate state may refer to a state before the electronic device 100 is completely changed from the first state 101 to the second state 102 or from the second state 102 to the first state 101. For example, the intermediate state may be understood as comprehensively referring to various states between the first state 101 and the second state 102.

In an embodiment, the first structure 110 and the second structure 160 may be coupled so as to be slidable relative to each other. The second structure 160 may be slidably coupled to one side of the first structure 110. For example, the first structure 110 may be a fixed structure, and the second structure 160 may be a structure movable relative to the first structure 110. The second structure 160 may be coupled to the one side of the first structure 110 so as to be slidable in opposite directions D1 and D2 (e.g., the +X/−X-axis directions) relative to the first structure 110.

According to various embodiments, the first structure 110 may refer to a first housing, a fixed member, a fixed housing, or a fixed case. In various embodiments, the second structure 160 may refer to a second housing, a sliding member (i.e., a slider), a sliding housing, or a sliding case.

In an embodiment, the second structure 160 may slide relative to the first structure 110 to change the electronic device 100 to the first state and the second state. For example, the electronic device 100 may be changed to the second state 102 (e.g., the state of FIG. 2) as the second structure 160 moves in the first direction D1 relative to the first structure 110 in the first state 101 (e.g., the state of FIG. 1). In contrast, the electronic device 100 may be changed to the first state 101 as the second structure 160 moves in the second direction D2 relative to the first structure 110 in the second state 102.

In an embodiment, when the electronic device 100 is in the first state 101, part (e.g., a first peripheral portion 161 and a second peripheral portion 162) of the second structure 160 may be located inward of side covers 133 and 135 of the first structure 110. Accordingly, the second structure 160 may be in a closed state with respect to the first structure 110. When the electronic device 100 is in the second state 102, part of the first peripheral portion 161 and part of the second peripheral portion 162 may move out of the first structure 110 and may be exposed outside the side covers 133 and 135. Accordingly, the second structure 160 may be in an opened state with respect to the first structure 110.

In an embodiment, the size (or area) of a region (e.g., an exposed region) of the display 170 visually exposed on the front side of the electronic device 100 may be changed in response to a sliding motion of the second structure 160. A partial area of the display 170 may be supported by the second structure 160 so as to move together with the second structure 160. For example, the display 170 may be configured to move together with the second structure 160 to expand or reduce the exposed region when the second structure 160 slides relative to the first structure 110.

In an embodiment, the display 170 may include a flexible portion (or, a rollable portion). For example, the display 170 may extend in a bent form such that depending on states (e.g., the first state 101 and the second state 102) of the electronic device 100, part of the display 170 faces a direction toward the front side of the electronic device 100 (e.g., the +Z-axis direction) and another part of the display 170 faces a direction toward a rear side of the electronic device 100 (e.g., the −Z-axis direction).

In an embodiment, the display 170 may include a first area 171 and a second area 173 extending from the first area 171. The first area 171 may form the front side of the electronic device 100. For example, the first area 171 may remain visually exposed on the front side of the electronic device 100 irrespective of states of the electronic device 100. The second area 173 may form the front side of the electronic device 100 in the second state. For example, the second area 173 may be located inside the first structure 110 such that the second area 173 is or is not visually exposed on the front side of the electronic device 100 depending on states of the electronic device 100. The area by which the second area 173 is exposed on the front side of the electronic device 100 may vary depending on a sliding distance of the second structure 160. In various embodiments, the first area 171 may be understood as a default area, a fixed area, or a main area, and the second area 173 may be understood as an expanded area, a variable area, or a sub-area.

In an embodiment, the second area 173 may extend from the first area 171 in one direction. For example, the direction in which the second area 173 extends from the first area 171 may be opposite to the direction in which the second structure 160 moves when the electronic device 100 is expanded. For example, the second area 173 may extend from the first area 171 in the second direction D2. As the second structure 160 slides relative to the first structure 110, the second area 173 may move into the first structure 110 (e.g., slide-in motion), or may move out of the first structure 110 (e.g., slide-out motion).

In an embodiment, the first area 171 and the second area 173 of the display 170 may be distinguished from each other, depending on whether the first area 171 and the second area 173 are exposed on the front side of the electronic device 100 in the first state 101. For example, the first area 171 may refer to a partial area of the display 170 visually exposed on the front side of the electronic device 100 in the first state 101. The second area 173 may refer to a partial area of the display 170 that, in the first state 101, is located inside the first structure 110 so as not to be exposed on the front side of the electronic device 100 and, in the second state 102, is at least partially moved out of the first structure 110 so as to be visually exposed on the front side of the electronic device 100. For example, the second area 173 may be understood as indicating the remaining area other than the first area 171 in the entire area of the display 170. Furthermore, the first area 171 and the second area 173 of the display 170 do not mean that the first area 171 and the second area 173 are physically divided from each other or have different shapes or properties.

In an embodiment, the first state 101 may be a state in which the first area 171 forms the front side of the electronic device 100 and the second area 173 is located inside the first structure 110. The second state 102 may be a state in which part of the second area 173, together with the first area 171, forms the front side of the electronic device 100. For example, the second state may refer to a state in which the area by which the second area 173 is exposed on the front side of the electronic device 100 is maximal.

In various embodiments, the display 170 may form a screen display area that is visually exposed on the front side of the electronic device 100 and on which predetermined visual information (or, a screen) is displayed. For example, in the first state, the screen display area may be formed by the first area 171. In the second state, the screen display area may be formed by part of the second area 173 and the first area 171. In the second state, the electronic device 100 may provide an expanded screen display area, as compared with when the electronic device 100 is in the first state. For example, the screen display area may be substantially the same as the exposed region of the display 170, or may be smaller than the exposed region.

In an embodiment, the electronic device 100 may include a camera decoration member 124 formed on the rear side (e.g., the side facing the −Z-axis direction) of the electronic device 100. For example, one or more rear camera modules (e.g., a plurality of rear cameras 320 of FIGS. 8A and 8B) may be disposed inside the first structure 110, and the plurality of rear cameras 320 may be visually exposed on the rear side of the electronic device 100 through the camera decoration member 124 (e.g., a camera window) (refer to FIG. 8A). In various embodiments, the camera decoration member 124 may be configured to protrude from the rear side of the electronic device 100 by a specified height by the thickness (e.g., the length in the Z-axis direction) of the plurality of rear cameras 320 (e.g., refer to FIGS. 15 to 17).

Figure 3:
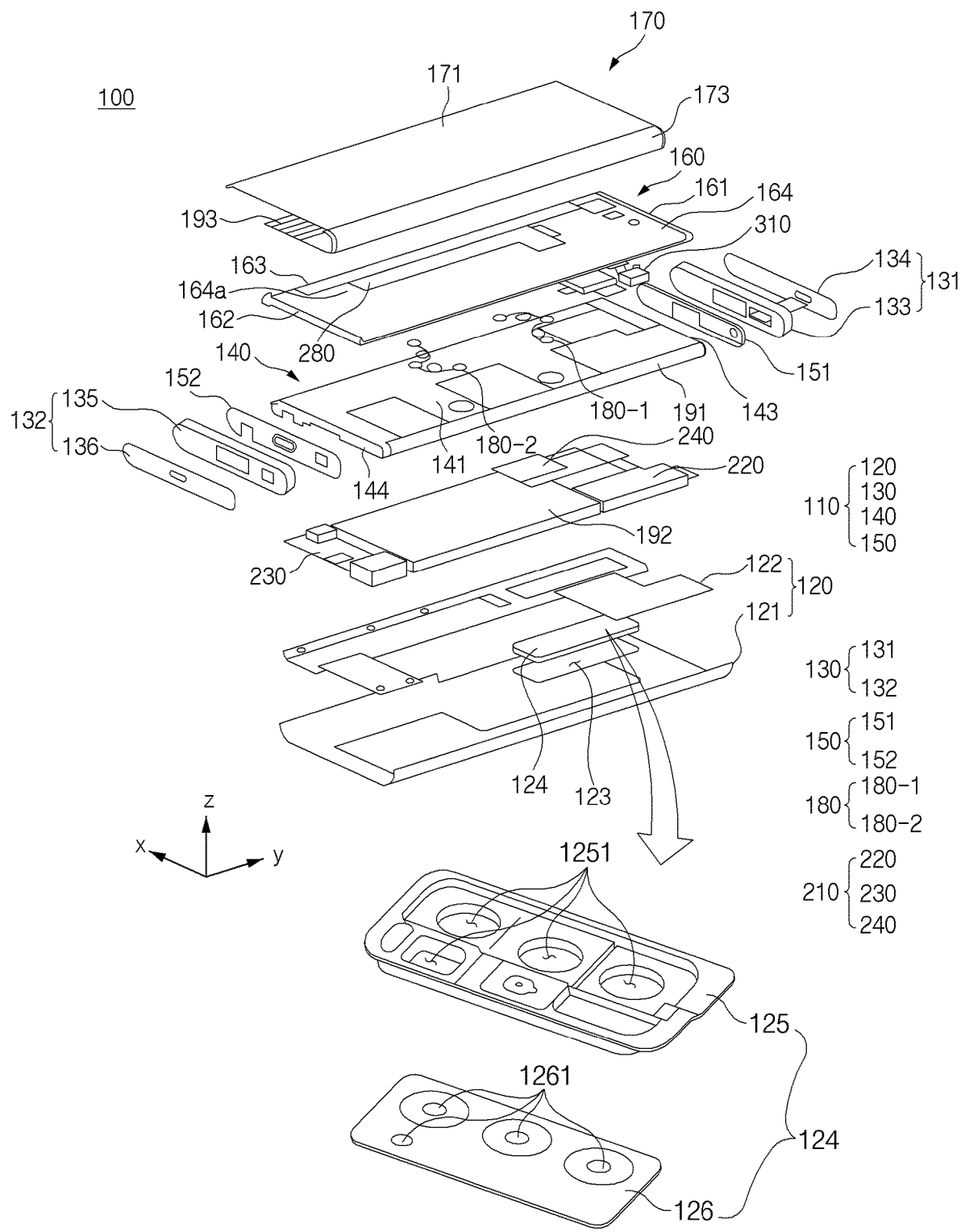
FIG. 3 is an exploded perspective view of an electronic device according to an embodiment of the disclosure.

FIG. 3 is an exploded perspective view of the electronic device according to an embodiment of the disclosure.

Referring to FIG. 3, the electronic device 100 according to an embodiment may include the first structure 110, the second structure 160, the display 170, a driving unit 180, a roller 191, a battery 192, a display support member 193, and a plurality of circuit boards 210.

In an embodiment, the first structure 110 may form at least part of the exterior (or, the outer surface) of the electronic device 100. For example, the first structure 110 may form the rear side and a part of lateral sides of the electronic device 100. In an embodiment, the first structure 110 may provide a space in which other components of the electronic device 100 are supported and/or disposed. For example, the battery 192 or the plurality of circuit boards 210 may be disposed inside the first structure 110. For example, the second structure 160 may be slidably supported on part (e.g., a bracket 140) of the first structure 110.

In an embodiment, the first structure 110 may include a rear member 120, a side member 130, the bracket 140, and a guide member 150. For example, the rear member 120, the side member 130, the bracket 140, and the guide member 150 may be fixed structures that are the basis of a relative movement of the second structure 160. For example, the second structure 160 may slide in the opposite directions relative to the rear member 120, the side member 130, the bracket 140, and the guide member 150.

In an embodiment, the first structure 110 may be formed through a coupling structure of the rear member 120, the side member 130, the bracket 140, and the guide member 150. For example, the rear member 120 and the side member 130 may form the rear side and a part of the lateral sides of the electronic device 100 and may form a predetermined space in which other components of the electronic device 100 are disposed. According to the illustrated embodiment, the first structure 110 may be configured such that the rear member 120, the side member 130, the bracket 140, and the guide member 150 are assembled together. However, according to various embodiments, at least some of the rear member 120, the side member 130, the bracket 140, and the guide member 150 may be integrally formed.

In an embodiment, the rear member 120 may include a back cover 121 forming the rear side of the electronic device 100 and a rear case 122 disposed on one surface of the back cover 121. For example, the rear case 122 may be disposed on an upper surface (e.g., a surface facing the +Z-axis direction) of the back cover 121 to support the plurality of circuit boards 210 and/or the battery 192 disposed inside the first structure 110. For example, the rear case 122 may be located to face the bracket 140 with the plurality of circuit boards 210 and the battery 192 therebetween.

In an embodiment, the camera decoration member 124 may be disposed on the back cover 121. For example, the back cover 121 may have, in a partial area thereof, an opening area 123 into which part of the camera decoration member 124 is inserted. The camera decoration member 124 may be exposed on the rear side of the electronic device 100 through the opening area 123. In various embodiments, the plurality of rear cameras 320 disposed inside the electronic device 100 may be configured to receive light from outside the electronic device 100 through a transparent and/or translucent area of the camera decoration member 124.

In an embodiment, the side member 130 may be located on opposite longitudinal end portions of the rear member 120 to form a part of the lateral sides of the electronic device 100. For example, the side member 130 may form a lateral side facing the Y-axis direction among the lateral sides of the electronic device 100. The side member 130 may include a first side member 131 located on an end portion of the rear member 120 that faces the +Y-axis direction and a second side member 132 located on an end portion of the rear member 120 that faces the −Y-axis direction.

In an embodiment, the side member 130 may be coupled to the bracket 140. For example, the side member 130 may be fixed to the bracket 140 through screw coupling. The first side member 131 may include the first side cover 133 coupled to a first edge portion 143 (e.g., an edge portion facing the +Y-axis direction) of the bracket 140 that is parallel to the sliding directions D1 and D2 and a first decoration member 134 coupled to the first side cover 133 to form an outer surface of the electronic device 100. The second side member 132 may include the second side cover 135 coupled to a second edge portion 144 (e.g., an edge portion facing the −Y-axis direction) that faces away from the first edge portion 143 and a second decoration member 136 coupled to the second side cover 135 to form an outer surface of the electronic device 100. The first decoration member 134 and the second decoration member 136 may improve the completeness and aesthetics of the electronic device 100 in appearance. For example, the side decoration members 134 and 136 may hide screws and coupling holes when the side covers 133 and 135 are screw-coupled to the bracket 140. In various embodiments, the side decoration members 134 and 136 may be integrally formed with the side covers 133 and 135.

In an embodiment, the bracket 140 may support other components included in the electronic device 100. For example, the bracket 40 may be configured to support the display support member 193, the roller 191, the plurality of circuit boards 210, the battery 192, a front camera module 310, and the rear camera modules (not illustrated) (e.g., the plurality of rear cameras 320 of FIGS. 8A and 8B). The bracket 140 may have a substantially plate shape and may be formed of a material having a specified stiffness.

In an embodiment, the bracket 140 may include a first surface 141 (e.g., a surface facing the +Z-axis direction) that faces toward the display support member 193 and a second surface (not illustrated) (e.g., a surface facing the −Z-axis direction) that faces away from the first surface 141. For example, the second surface (e.g., a second surface 142 of FIG. 4) may face toward the battery 192 and the plurality of circuit boards 210.

In an embodiment, the bracket 140 may include the edge portions 143 and 144 to which the guide member 150 and the side member 130 are coupled. The edge portions 143 and 144 may extend parallel to the sliding directions D1 and D2 of the second structure 160. For example, the edge portions 143 and 144 may include the first edge portion 143 to which a first guide member 151 and the first side member 131 are coupled and the second edge portion 144 to which a second guide member 152 and the second side member 132 are coupled. For example, the side member 130 and the guide member 150 may be coupled to the edge portions 143 and 144 and may be fixedly disposed on the bracket 140 accordingly.

In an embodiment, the second structure 160 may be disposed on the first surface 141 of the bracket 140 so as to be movable in the sliding directions D1 and D2. For example, the bracket 140 and the second structure 160 may be connected through the driving unit 180 disposed between the first surface 141 of the bracket 140 and the second structure 160. For example, the second structure 160 may be configured to move in the sliding directions D1 and D2 over the first surface 141 of the bracket 140 by using an elastic force provided by the driving unit 180.

In an embodiment, the bracket 140, together with the rear case 122, may support the plurality of circuit boards 210 and the battery 192. For example, the bracket 140 may be disposed such that the second surface 142 faces the rear case 122 with the plurality of circuit boards 210 and the battery 192 therebetween. For example, the plurality of circuit boards 210 and the battery 192 may be fixedly disposed between the second surface 142 of the bracket 140 and the rear case 122.

In an embodiment, the roller 191 may be rotatably coupled to one side of the bracket 140. For example, the roller 191 may be disposed between the first edge portion 143 and the second edge portion 144 of the bracket 140 and may extend in a direction perpendicular to the sliding directions D1 and D2. In various embodiments, roller coupling portions (not illustrated) to which the roller 191 is rotatably coupled may be formed on end portions of the first edge portion 143 and the second edge portion 144 that face the second direction D2.

In an embodiment, the guide member 150 may guide movements of the display 170 and the display support member 193. The guide member 150 may be coupled to the edge portions 143 and 144 of the bracket 140. For example, the guide member 150 may guide movements of the display 170 and the display support member 193 when the second structure 160 moves in a state of being fixed to the bracket 140.

In an embodiment, the guide member 150 may include guide grooves (not illustrated) (e.g., guide grooves 1521 of FIG. 21) into which opposite end portions of the display support member 193 in the lengthwise direction (e.g., the Y-axis direction) are slidably inserted. The guide member 150 may guide a movement of the display support member 193 along a predetermined path (or, track) corresponding to the guide grooves and may support the display support member 193 such that the display support member 193 remains flat. For example, when the display 170 moves together with the second structure 160, the display support member 193 may move along the guide grooves in the state in which the opposite longitudinal end portions of the display support member 193 are inserted into the guide grooves.

In an embodiment, the guide member 150 may include the first guide member 151 coupled to the first edge portion 143 of the bracket 140 and the second guide member 152 coupled to the second edge portion 144 of the bracket 140. For example, the first guide member 151 may be located between the first edge portion 143 and the first side member 131. The second guide member 152 may be located between the second edge portion 144 and the second side member 132. According to the illustrated embodiment, the side member 130 and the guide member 150 may be assembled as separate components. However, this is illustrative, and according to various embodiments, the guide member 150 may be integrally formed with the side member 130.

In an embodiment, the second structure 160 may be coupled to the first structure 110 so as to be slidable in the opposite directions. For example, the second structure 160 may slide in the opposite directions relative to the rear member 120, the side member 130, the bracket 140, and the guide member 150 that are relatively fixed structures. The second structure 160 may be disposed to face the first surface 141 of the bracket 140. For example, the second structure 160 may be configured to move in the sliding directions D1 and D2 over the first surface 141 of the bracket 140.

In an embodiment, the second structure 160 may support at least a partial area of the display 170. For example, the second structure 160, together with the display 170, may move relative to the first structure 110. The second structure 160 may be formed to be substantially flat to support the display 170. For example, the second structure 160 may be formed in a substantially plate shape.

In an embodiment, the second structure 160 may include a plate portion 164 on which the display 170 is disposed and peripheral portions 161, 162, and 163 surrounding part of the periphery of the plate portion 164. For example, the plate portion 164 may include a third surface 164a facing toward the display 170 and a fourth surface (not illustrated) (e.g., a fourth surface 164b of FIG. 4) that faces away from the third surface 164a.

For example, the peripheral portions 161, 162, and 163 may protrude from the periphery of the third surface 164a of the plate portion 164 toward the display 170. For example, the peripheral portions 161, 162, and 163 may include the first peripheral portion 161 and the second peripheral portion 162 extending parallel to the sliding directions D1 and D2 of the second structure 160, and the third peripheral portion 163 extending perpendicular to the sliding directions D1 and D2 and connecting the first peripheral portion 161 and the second peripheral portion 162. For example, part of the display 170 may be disposed on the third surface 164a of the plate portion 164 such that the periphery is surrounded by the peripheral portions 161, 162, and 163 of the second structure 160.

In an embodiment, the second structure 160 may be connected with the bracket 140 through the driving unit 180. For example, the driving unit 180 may be disposed between the fourth surface 164b of the second structure 160 and the first surface 141 of the bracket 140. Connecting shafts (not illustrated) (e.g., a first connecting shaft 145 and a second connecting shaft 165 of FIGS. 4, 6, and 7) to which the driving unit 180 is connected may be disposed on the fourth surface 164*b* of the second structure 160 and the first surface 141 of the bracket 140.

In an embodiment, a camera hole (not illustrated) that corresponds to the front camera module 310 may be formed in the plate portion 164 of the second structure 160. For example, the front camera module 310 may be disposed inside the electronic device 100. The front camera module 310 may be disposed on the fourth surface 164*b* of the plate portion 164 so as to move together with the second structure 160. The camera hole may penetrate the third surface 164*a* and the fourth surface 164*b* of the plate portion 164 so as to be aligned with the front camera module 310. For example, the front camera module 310 may be configured to receive light from outside the electronic device 100 through the camera hole.

In an embodiment, a display circuit board 280 may be disposed on the plate portion 164 of the second structure 160. For example, the display circuit board 280 may be disposed on a partial area of the third surface 164*a*. The display circuit board 280 may electrically connect the display 170 and the plurality of circuit boards 210. For example, the display circuit board 280 may be electrically connected with the display 170 disposed on the third surface 164*a* of the second structure 160. The display circuit board 280 may be electrically connected with a part of the plurality of circuit boards 210.

In an embodiment, the display 170 may include a flexible portion or a rollable portion to partially form a curved surface in response to sliding of the second structure 160. For example, the display 170 may be formed such that at least a partial area thereof is bent and different areas (e.g., the first area 171 and the second area 173) partially face each other. For example, the display 170 may include a flexible display or a foldable display. In various embodiments, the entire area of the display 170 may be formed of a flexible material. Alternatively, a partial area of the display 170 may be formed of a flexible material, and another partial area of the display 170 may be formed of a non-flexible material that is not bent.

In an embodiment, the display 170 may be configured to move together with the second structure 160 relative to the first structure 110. The display 170 may be supported by the second structure 160 and the display support member 193. For example, a partial area (e.g., part of the first area 171) of the display 170 may be disposed on the second structure 160 and may move together with the second structure 160. Another partial area (e.g., another part of the first area 171 and the second area 173) of the display 170 may be configured to rotate and rectilinearly move in response to a movement of the second structure 160 in a state of being supported by the display support member 193.

In an embodiment, the display 170 may include the first area 171 and the second area 173 extending from the first area 171. Part of the first area 171 may be disposed on the plate portion 164 of the second structure 160. For example, the part of the first area 171 may be attached to the third surface 164*a* of the plate portion 164 and may be fixed to move together with the second structure 160. The display support member 193 may be disposed on a rear surface of the remaining part of the first area 171 and a rear surface of the second area 173.

In an embodiment, the driving unit 180 may provide a driving force to change the electronic device 100 to the first state 101 or the second state 102. For example, the driving unit 180 may be disposed between the second structure 160 and the bracket 140. One end portion of the driving unit 180 may be coupled to the first surface 141 of the bracket 140, and an opposite end portion of the driving unit 180 may be coupled to the fourth surface 164*b* of the second structure 160. Accordingly, the driving unit 180 may connect the bracket 140 and the second structure 160. In various embodiments, the driving unit 180 may be configured to provide a predetermined elastic force in a moving direction of the second structure 160 when the second structure 160 is moved by a specified distance or more in the sliding directions D1 and D2 by an external force of a user.

In an embodiment, the driving unit 180 may include a first driving unit 180-1 and a second driving unit 180-2 spaced apart from each other in the direction perpendicular to the sliding directions D1 and D2. However, the number of driving units 180 is not limited to the illustrated embodiment and may be modified according to various embodiments. A motion in which the second structure 160 is slid relative to the bracket 140 by the elastic force of the driving unit 180 will be described below in more detail with reference to FIGS. 5 to 7.

In an embodiment, the display support member 193 may support at least a partial area of the display 170. The display support member 193 may be attached to a rear surface of the display 170, and at least part of the display support member 193 may be curved (or, bent) in response to sliding of the second structure 160. For example, the display support member 193 may be implemented in a bendable form to partially form a curved surface in response to sliding of the second structure 160.

In an embodiment, the roller 191 may be rotatably coupled to the bracket 140. For example, the roller 191 may extend in the direction perpendicular to the sliding directions D1 and D2 and may rotate about an axis of rotation perpendicular to the sliding directions D1 and D2. The roller 191 may be coupled to one side of the bracket 140 to face the second direction D2. At least part of the roller 191 may be surrounded by the display support member 193. For example, when the second structure 160 moves, the roller 191 may rotate to rotate and rectilinearly move the display 170 and the display support member 193.

In an embodiment, the battery 192 may supply electric power to at least one component of the electronic device 100. The battery 192 may be integrally disposed inside the electronic device 100, or may be disposed so as to be detachable from the electronic device 100. For example, the battery 192 may be disposed in the first structure 110. The battery 192, together with the plurality of circuit boards 210, may be supported by the bracket 140 and/or the rear case 122 and may be fixed to the first structure 110 accordingly. The battery 192 may be in a state of being fixed to the first structure 110, when the second structure 160 slides.

In an embodiment, the plurality of circuit boards 210 may be fixedly disposed in the first structure 110. For example, the plurality of circuit boards 210 may be disposed between the bracket 140 and the rear case 122. The plurality of circuit boards 210 may be supported by the bracket 140 and/or the rear case 122 and may be fixed to the first structure 110 accordingly. The plurality of circuit boards 210 may be in a state of being fixed to the first structure 110, when the second structure 160 slides. For example, the plurality of circuit boards 210 may be fixed to the first structure 110 in a state of being directly and/or indirectly connected to the first structure 110.

In an embodiment, the plurality of circuit boards 210 may include a first circuit board 220 (e.g., a main circuit board), a second circuit board 230 (e.g., a first sub-circuit board), and a third circuit board 240 (e.g., a second sub-circuit board). For example, the first circuit board 220, the second circuit board 230, and the third circuit board 240 may be electrically connected. A connection structure of the plurality of circuit boards 210 will be described below in more detail with reference to FIGS. 9 to 14.

In an embodiment, the plurality of circuit boards 210 may include a printed circuit boards (PCB), a flexible PCB (FPCB), or a rigid-flexible PCB (RFPCB). Various electronic components included in the electronic device 100 may be electrically connected to the plurality of circuit boards 210. For example, a processor (e.g., a processor 520 of FIG. 24), a memory (a memory 530 of FIG. 24), and/or an interface (e.g., an interface 577 of FIG. 24) may be disposed on the plurality of circuit boards 210 (e.g., the first circuit board 220). For example, the processor may include a main processor and/or an auxiliary processor, and the main processor and/or the auxiliary processor may include one or more of a central processing unit, an application processor, a graphic processing device, an image signal processor, a sensor hub processor, or a communication processor. For example, the memory may include a volatile memory or a nonvolatile memory. For example, the interface may include a high definition multimedia interface (HDMI), a universal serial bus (USB) interface, a secure digital (SD) card interface, and/or an audio interface. Furthermore, the interface may electrically or physically connect the electronic device 100 with an external electronic device and may include a USB connector, an SD card/multimedia card (MMC) connector, or an audio connector.

The electronic device 100 according to an embodiment may further include the front camera module 310 exposed on the front side (e.g., the side facing the +Z-axis direction) of the electronic device 100 and the rear camera modules (not illustrated) (e.g., the plurality of rear cameras 320 of FIGS. 8A and 8B) exposed on the rear side (e.g., the side facing the −Z-axis direction) of the electronic device 100.

In an embodiment, the front camera module 310 may be fixedly disposed on the second structure 160 to move together with the second structure 160. In an embodiment, the front camera module 310 (e.g., a punch hole camera) may be exposed on the front side of the electronic device 100 through the camera hole (not illustrated) of the second structure 160 and a partial area of the display 170. In another embodiment, the front camera module (e.g., an under display camera (UDC)) may be disposed under the display 170. At least part of the front camera module 310 according to the other embodiment may be disposed under the display 170, and the front camera module 310 may be configured to take an image of a subject through part of an active area of the display 170. In the other embodiment, the front camera module 310 may not be visually exposed on an area of the display 170.

In an embodiment, the rear camera modules (not illustrated) may be fixedly disposed in the first structure 110. For example, the rear camera modules may be disposed on the bracket 140 and may be in a state of being fixed to the first structure 110, when the second structure 160 moves. The rear camera modules may be visually exposed on the rear side of the electronic device 100 through the camera decoration member 124 disposed on the rear member 120.

In an embodiment, the camera decoration member 124 may include a decorative structure 125 having a plurality of openings 1251 formed therein and a camera window 126 attached to the decorative structure 125. For example, at least some of the rear camera modules may be disposed in the openings 1251 of the decorative structure 125. As many openings 1251 as the rear camera modules may be formed.

The camera window 126 may include a plurality of window areas 1261 corresponding to the openings 1251 of the decorative structure 125 such that the rear camera modules are capable of receiving light. For example, the plurality of window areas 1261 may be disposed to overlap the plurality of openings 1251. The plurality of window areas 1261 may be formed to be transparent or translucent to allow light to transmit. The rear camera modules (e.g., lenses) may be configured to receive light from the outside through the openings 1251 and the window areas 1261.

In various embodiments, the rear camera modules may include a plurality of camera modules (e.g., a dual camera or a triple camera). However, the rear camera modules are not necessarily limited to including the plurality of camera modules and may be implemented with one camera module according to an embodiment.

The electronic device 100 illustrated in FIG. 3 may be an embodiment of a slidable (or, rollerable) electronic device, and structures of electronic devices 100 according to various embodiments of the disclosure are not limited to the illustrated embodiment. For example, electronic devices 100 according to various embodiments of the disclosure may be implemented with various forms of slidable (or, rollable) electronic devices that include a fixed structure and a movable structure movable relative to the fixed structure and in which a display area is expanded or reduced as a flexible display moves together with the movable structure.

Figure 4:
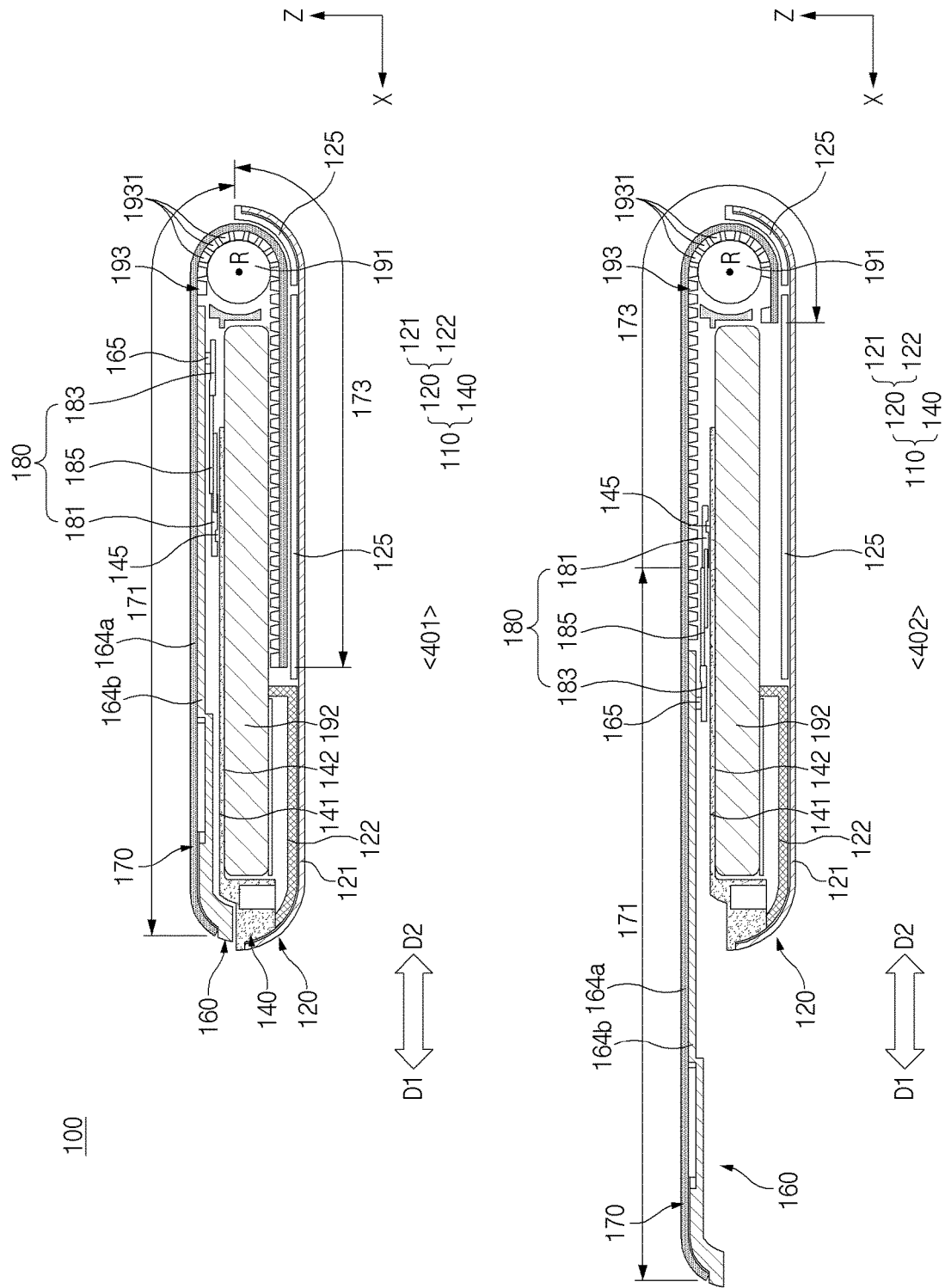
FIG. 4 is a sectional view of an electronic device according to an embodiment of the disclosure.

FIG. 4 is a sectional view of the electronic device according to an embodiment of the disclosure.

<401> of FIG. 4 is a sectional view illustrating the first state of the electronic device 100, and <402> of FIG. 4 is a sectional view illustrating the second state of the electronic device 100.

<401> of FIG. 4 is a sectional view of the electronic device 100 taken along line S1-S1' in FIG. 1. <402> of FIG. 4 is a sectional view of the electronic device 100 taken along line S2-S2' in FIG. 2.

Referring to FIG. 4, the electronic device 100 according to an embodiment may include the first structure 110, the second structure 160, the display 170, the driving unit 180, the display support member 193, the roller 191 and the battery 192.

The components of the electronic device 100 illustrated in FIG. 4 are identical or similar to some of the components of the electronic device 100 illustrated in FIGS. 1 to 3, and repetitive descriptions will be omitted.

In an embodiment, the electronic device 100 may be changed to the first state (e.g., FIG. 1 or <401> of FIG. 4) and the second state (e.g., FIG. 2 or <402> of FIG. 4) by a sliding motion of the second structure 160 relative to the first structure 110. For example, the first structure 110 may be a relatively fixed structure with respect to the sliding of the second structure 160.

In an embodiment, the first structure 110 may include the back cover 121, the rear case 122, and the bracket 140. Although not illustrated in FIG. 4, the first structure 110 may further include a side member (e.g., the side member 130 of FIG. 3) and a guide member (e.g., the guide member 150 of FIG. 3). For example, the second structure 160 may be disposed over the first surface 141 of the bracket 140 and may move in the first direction D1 or the second direction D2 relative to the back cover 121, the rear case 122, and the bracket 140.

In an embodiment, the bracket 140 may be disposed between the second structure 160 and the back cover 121. For example, the bracket 140 may be disposed such that the first surface 141 faces toward the second structure 160 and the second surface 142 faces toward the back cover 121 or the rear case 122. The battery 192 may be disposed on the second surface 142 of the bracket 140. The battery 192 may be supported by the rear case 122 and the bracket 140. In an embodiment, the roller 191 may be coupled to one side of the bracket 140 so as to be rotatable about an axis of rotation R.

In an embodiment, the second structure 160 may be configured to move in the first direction D1 or the second direction D2 relative to the bracket 140. For example, when the first area 171 of the display 170 is viewed from above, the second structure 160 may partially overlap the bracket 140. The size of the area by which the second structure 160 and the bracket 140 overlap each other may be changed in response to sliding of the second structure 160. For example, the area by which the second structure 160 and the bracket 140 overlap each other may be relatively smaller in the second state than in the first state. The fourth surface 164b of the second structure 160 may be exposed outside the electronic device 100 as the electronic device 100 is changed from the first state to the second state. For example, the fourth surface 164b of the second structure 160, together with the back cover 121, may form the rear side of the electronic device 100 in the second state or in the intermediate state between the first state and the second state.

In an embodiment, the display 170 may be disposed on the third surface 164a of the second structure 160. For example, part of the first area 171 of the display 170 may be attached to the third surface 164a of the second structure 160, and thus the display 170 may move together when the second structure 160 moves. As the second structure 160 moves in the second direction D2, the second structure 160 may form substantially the same plane with part of the display support member 193.

In an embodiment, the second structure 160 may be connected with the bracket 140 through the driving unit 180. For example, a second support portion 183 of the driving unit 180 may be coupled to the fourth surface 164b of the second structure 160, and a first support portion 181 of the driving unit 180 may be coupled to the first surface 141 of the bracket 140. In various embodiments, the second structure 160 may be configured to move in the first direction D1 or the second direction D2 relative to the bracket 140 by using an elastic force provided by the driving unit 180.

In an embodiment, the display 170 may include the first area 171 exposed on the front side (e.g., the side facing the +Z-axis direction) of the electronic device 100 in the first state and the second area 173 extending from the first area 171. In the second state, at least part of the second area 173, together with the first area 171, may be exposed on the front side of the electronic device 100. For example, in the first state, the second area 173 may be located inside the first structure 110, and in the second state, at least part of the second area 173 may move out of the first structure 110 and may be exposed on the front side of the electronic device 100.

In an embodiment, the first area 171 and the second area 173 of the display 170 may be distinguished from each other, depending on whether the first area 171 and the second area 173 are exposed on the front side of the electronic device 100 in the first state. The position of a dividing line between the first area 171 and the second area 173 is not limited to the specific position illustrated in FIG. 4. For example, when the back cover 121 surrounding the display 170 is formed in a higher or lower position than that in the illustrated embodiment, the position of the dividing line between the first area 171 and the second area 173 may be changed accordingly.

In an embodiment, the display 170 may be configured such that at least part of the first area 171 is fixed to the second structure 160 and part of the second area 173 moves (or, slides) into or out of the first structure 110 as the second structure 160 moves in the opposite directions relative to the first structure 110. For example, part of the first area 171 may be supported by the third surface 164a of the second structure 160, and the remaining part of the first area 171 may be supported by the display support member 193. The second area 173 may be supported by the display support member 193.

In an embodiment, a portion of the display 170 disposed on the third surface 164a of the second structure 160 may be a portion that remains substantially flat irrespective of sliding of the second structure 160. Furthermore, a portion of the display 170 supported by the display support member 193 may be a portion that deforms to be curved or flat in response to sliding of the second structure 160. For example, the portion of the display 170 supported by the second structure 160 may be a rigid portion, and the portion of the display 170 supported by the display support member 193 may be a flexible portion.

According to the illustrated embodiment, the first area 171 may include the rigid portion and part of the flexible portion, and the second area 173 may include the remaining part of the flexible portion. However, without being limited thereto, according to various embodiments of the disclosure, the entire display 170 may be formed of a flexible material. Furthermore, according to various embodiments, the display 170 may be formed such that rigid portions are located on opposite sides of a flexible portion.

In an embodiment, the driving unit 180 may be disposed between the second structure 160 and the bracket 140. For example, the driving unit 180 may be disposed between the first surface 141 of the bracket 140 and the fourth surface 164b of the second structure 160. The driving unit 180 may be located to face the battery 192 with the bracket 140 therebetween. In an embodiment, the driving unit 180 may generate elastic forces acting in directions parallel to the sliding directions D1 and D2 of the second structure 160.

In an embodiment, the driving unit 180 may include the first support portion 181, the second support portion 183, and an elastic portion 185. For example, the elastic portion 185 may connect the first support portion 181 and the second support portion 183. The elastic portion 185 may be compressed or uncompressed depending on a relative movement of the first support portion 181 and the second support portion 183.

In an embodiment, the first support portion 181 may be coupled to the bracket 140, and the second support portion 183 may be coupled to the second structure 160. Accordingly, the driving unit 180 may connect the second structure 160 and the bracket 140. For example, the first support portion 181 may be rotatably coupled to the first surface 141 of the bracket 140. The second support portion 183 may be rotatably coupled to the fourth surface 164b of the second structure 160. The connecting shafts (e.g., the first connecting shaft 145 and the second connecting shaft 165) to which the first support portion 181 and the second portion 183 are rotatably coupled may be formed on the first surface 141 of the bracket 140 and the fourth surface 164b of the second structure 160.

In an embodiment, the first support portion 181 may be coupled to the first connecting shaft 145 of the bracket 140. The second support portion 183 may be coupled to the second connecting shaft 165 of the second structure 160. For example, the first connecting shaft 145 may protrude from the first surface 141 of the bracket 140 toward the second structure 160. The second connecting shaft 165 may protrude from the fourth surface 164b of the second structure 160 toward the bracket 140. For example, the first support portion 181 may be rotatably coupled to the first connecting shaft 145, and the second support portion 183 may be rotatably coupled to the first connecting shaft 145.

In an embodiment, the driving unit 180 may be configured such that a relative movement between the first support portion 181 and the second support portion 183 is generated as the second support portion 183 moves together with the second structure 160 when the second structure 160 slides relative to the bracket 140. For example, the elastic portion 185 may be configured to be compressed or uncompressed depending on a movement of the second structure 160 relative to the bracket 140 to apply an elastic force to the second structure 160 with respect to the bracket 140. For example, when the second structure 160 moves in the first direction D1 or the second direction D2, the driving unit 180 may provide an elastic force in the opposite direction to the moving direction of the second structure 160 in a predetermined section (e.g., between a first point A1 and a second point A2 in FIG. 7) and may provide an elastic force in the same direction as the moving direction of the second structure 160 after the predetermined section (e.g., between the second point A2 and a third point A3 in FIG. 7). The motion of the driving unit 180 will be described below in more detail with reference to FIGS. 5 to 7.

In an embodiment, the display support member 193 may support part of the first area 171 and the second area 173. For example, the display support member 193 may be attached to portions of the rear surface of the display 170 that correspond to the part of the first area 171 and the second area 173. The display support member 193 may move together with the display 170 when the display 170 moves by a movement of the second structure 160.

In an embodiment, the display support member 193 may include a plurality of bars 1931 (or, protrusions) extending in a direction substantially perpendicular to the sliding directions D1 and D2 of the second structure 160. For example, the display support member 193 may be formed in a form (e.g., a multi joint module or a multi-bar) in which the plurality of bars 1931 extending in a direction substantially parallel to the roller 191 (or, the axis of rotation R) are disposed at predetermined intervals. For example, the display support member 193 may include a flexible track or a hinge rail. The display support member 193 may be bent at portions having a relatively small thickness between the plurality of bars 1931.

In an embodiment, the display support member 193 may surround at least part of the roller 191. For example, the display support member 193 may partially make contact with an outer circumferential surface of the roller 191. The display support member 193 may be formed in a shape at least partially bent while surrounding the roller 191. For example, the display support member 193 may rotate and/or rectilinearly move along the outer circumferential surface of the roller 191 by rotation of the roller 191 when the second structure 160 slides.

In an embodiment, part of the display support member 193 may be disposed between the roller 191 and the back cover 121 and may move along the outer circumferential surface of the roller 191 as the second structure 160 slides. For example, when the second structure 160 moves in the first direction D1 in the first state, the part of the display support member 193 (or, the second area 173) may move out of the space between the back cover 121 and the roller 191 (e.g., slide-out motion) as the roller 191 rotates in a first rotational direction (e.g., the counterclockwise direction). In contrast, when the second structure 160 moves in the second direction D2 in the second state, the part of the display support member 193 (or, the second area 173) may move into the space between the back cover 121 and the roller 191 (e.g., slide-in motion) as the roller 191 rotates in a second rotational direction (e.g., the clockwise direction) opposite to the first rotational direction.

In an embodiment, the roller 191 may be disposed on a side surface of the bracket 140 in the second direction D2 so as to be rotatable. For example, the roller 191 may move the display 170 by rotating about the axis of rotation R substantially perpendicular to the sliding directions D1 and D2 of the second structure 160. The roller 191 may be surrounded by the display support member 193. For example, the display support member 193 may make contact with part of the outer circumferential surface of the roller 191. According to the illustrated embodiment, the roller 191 may be configured to rotate about the axis of rotation R, but is not necessarily limited thereto. In various embodiments, the roller 191 may be fixed without rotating relative to the bracket 140, and the display support member 193 may be configured to move along the outer circumferential surface of the roller 191 that is formed to be a curved surface.

Figure 5:
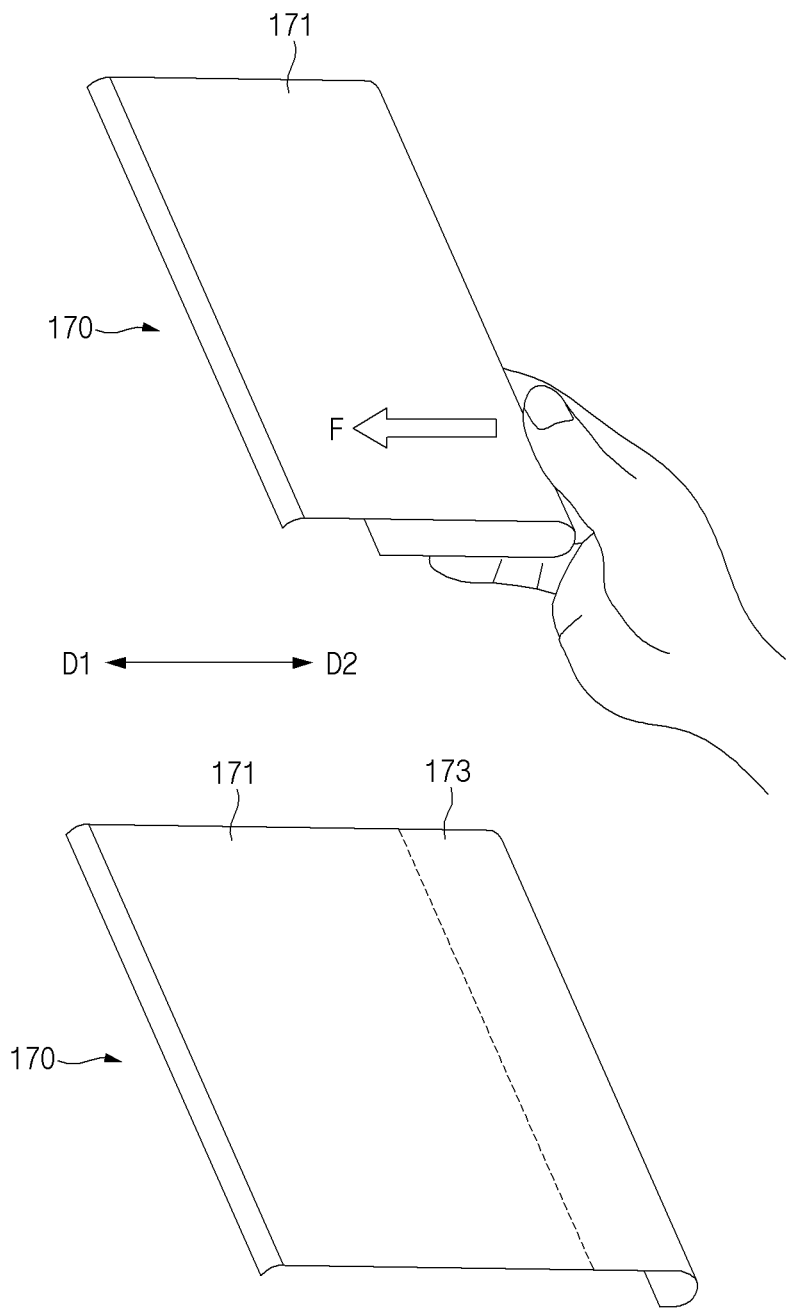
FIG. 5 illustrates deformation of an electronic device according to an embodiment of the disclosure.

FIG. 5 illustrates deformation of the electronic device according to an embodiment of the disclosure.

Figure 6:
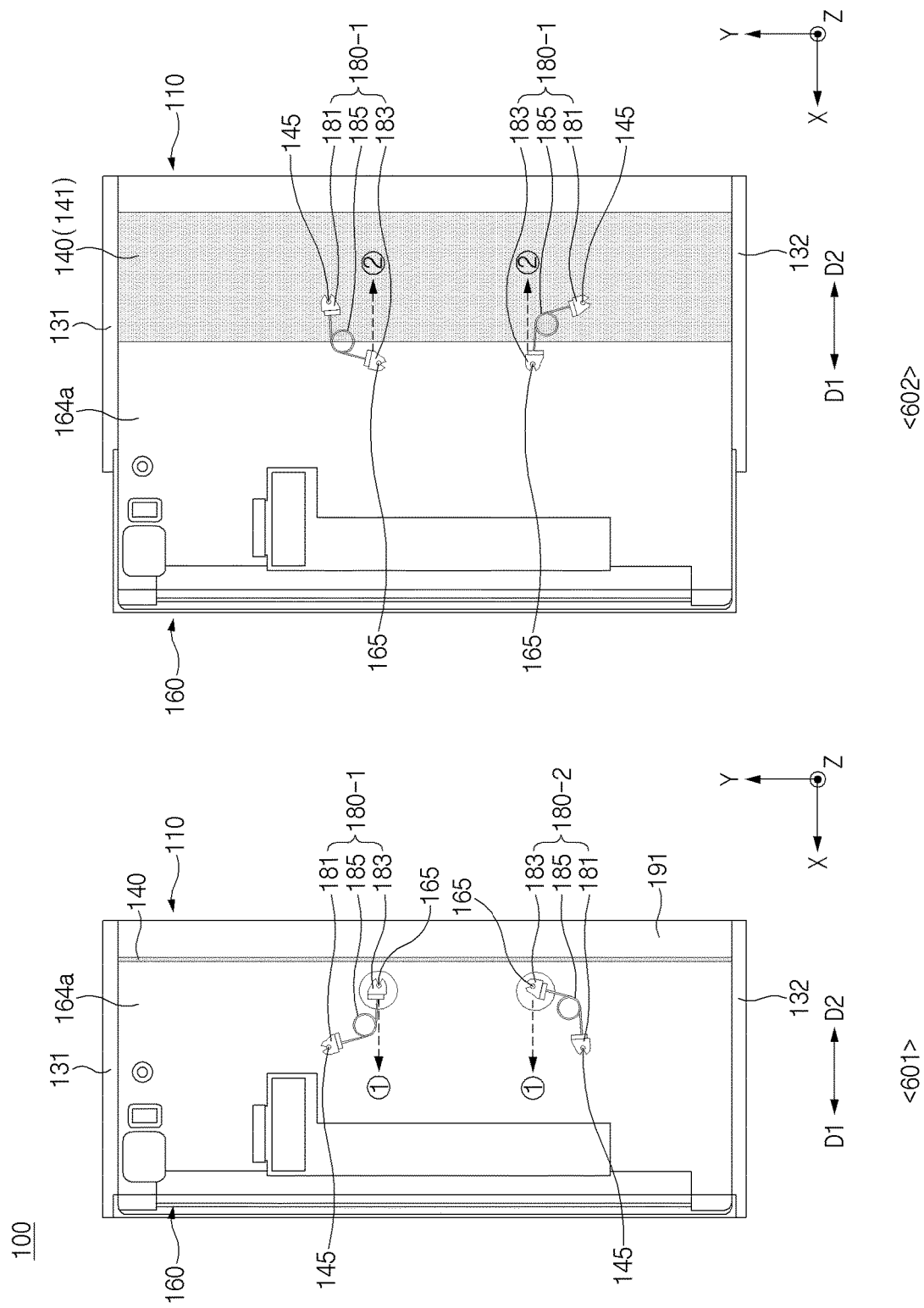
FIG. 6 illustrates a motion of a driving unit of an electronic device according to an embodiment of the disclosure.

FIG. 6 illustrates a motion of the driving unit of the electronic device according to an embodiment of the disclosure.

Figure 7:
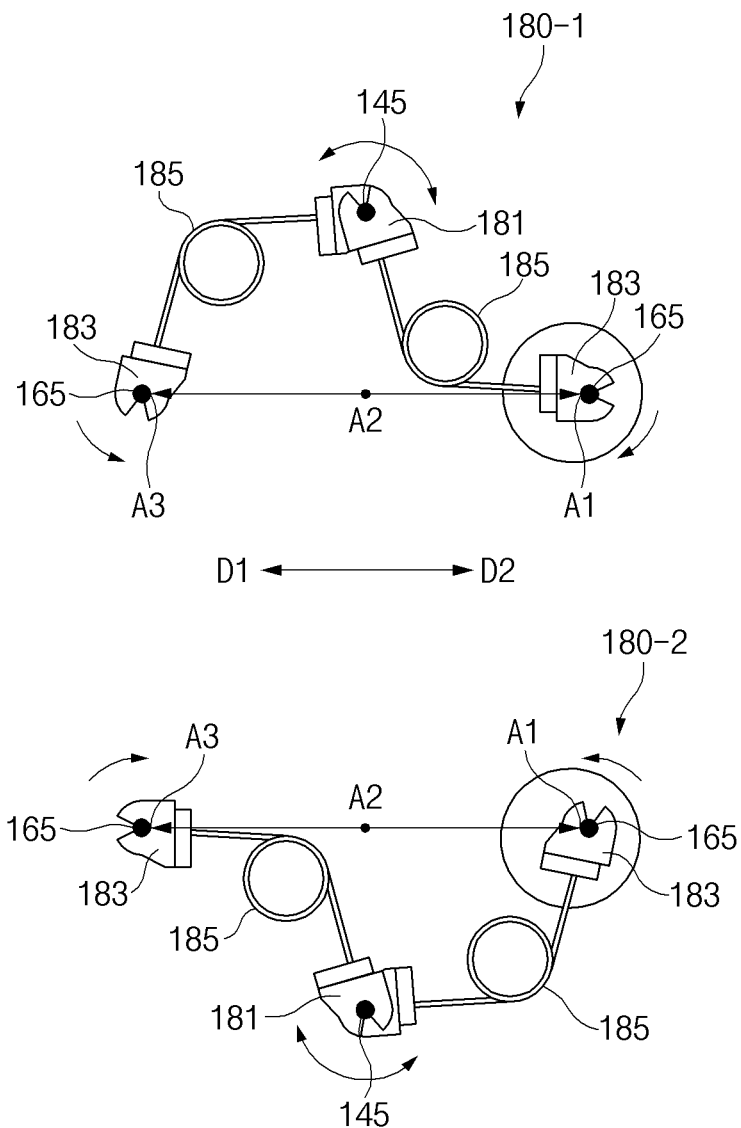
FIG. 7 illustrates a motion of a driving unit of an electronic device according to an embodiment of the disclosure.

FIG. 7 illustrates a motion of a driving unit of the electronic device according to an embodiment of the disclosure.

Referring to FIG. 5, the state of the electronic device 100 according to an embodiment may be changed as an external force is applied to the display 170.

FIG. 5 may be a schematic view for explaining a motion in which a user slides the display 170 to change the state of the electronic device 100 and may be a view in which other components of the electronic device 100 are omitted.

In an embodiment, when the electronic device 100 is in the first state (e.g., refer to <401> of FIG. 4), the display 170 may be disposed such that the first area 171 faces toward the front side of the electronic device 100. The user may slide the display 170 in the first direction D1 by applying an external force F to the first area 171 of the display 170 in the first direction D1 in a state of gripping the electronic device 100. For example, the user may move the second area 173 toward the front side by sliding F the first area 171 of the display 170 in the first direction D1. Accordingly, the electronic device 100 may be changed to the second state (e.g., refer to <402> of FIG. 4) in which part of the second area 173 is exposed on the front side.

In an embodiment, when the electronic device 100 is in the second state, the user may change the electronic device 100 to the first state by sliding the display 170 in the second direction D2.

Although not illustrated in FIG. 5, when the user slides the display 170 in the first direction D1 or the second direction D2, an external force may be transmitted to the second structure 160 on which the first area 171 of the display 170 is disposed, and thus the second structure 160 may move together with the display 170. For example, the second structure 160 may be moved in the first direction D1 or the second direction D2 relative to the first structure 110 by the external force applied by the user.

The electronic device 100 according to an embodiment may be configured (e.g., a semi-automatic open structure) such that when the electronic device 100 is changed to the first state or the second state, the second structure 160 is moved by an elastic force generated by the driving unit 180 even though the external force of the user is removed after the second structure 160 is moved by the external force F of the user by a specified distance or more.

Referring to FIGS. 6 and 7, the electronic device 100 according to an embodiment may include the first structure 110, the second structure 160, and the driving unit 180. In an embodiment, the first structure 110 may include the first side member 131, the second side member 132, and the bracket 140.

Referring to FIG. 6, it may be a plan view of the electronic device 100 when the third surface 164a of the second structure 160 is viewed from above and may be a view in which the display 170 is omitted. FIG. 6 illustrates a motion of the driving unit 180, which is disposed between the second structure 160 (e.g., the fourth surface 164b of the second structure 160 of FIG. 4) and the bracket 140 (e.g., the first surface 141 of the bracket 140 of FIG. 4), when the second structure 160 moves relative to the bracket 140. For example, when the third surface 164a of the second structure 160 is viewed from above, the driving unit 180 may be hidden by the second structure 160 and may not be visually exposed, but may be understood as being illustrated by a solid line in FIG. 6 for explanation of the motion of the driving unit 180.

<601> of FIG. 6 illustrates the first state (e.g., the first state 101 of FIG. 1 and state <401> of FIG. 4) of the electronic device 100, and <602> of FIG. 6 illustrates the second state (e.g., the second state 102 of FIG. 2 and state <402> of FIG. 4) of the electronic device 100.

In an embodiment, the bracket 140 and the second structure 160 may include the connecting shafts 145 and 165, respectively, to which the driving unit 180 is rotatably coupled. For example, the bracket 140 may include the first connecting shaft 145 to which the first support portion 181 of the driving unit 180 is coupled. The second structure 160 may include the second connecting shaft 165 to which the second support portion 183 of the driving unit 180 is coupled. The first support portion 181 may be rotatably coupled to the first connecting shaft 145. The second support portion 183 may be rotatably connected to the second connecting shaft 165.

In an embodiment, the first connecting shaft 145 may be fixed to the bracket 140, and the second connecting shaft 165 may be fixed to the second structure 160. For example, when the second structure 160 slides relative to the bracket 140, the second connecting shaft 165 may linearly move in the sliding directions D1 and D2 with respect to the relatively fixed first connecting shaft 145.

In an embodiment, the driving unit 180 may include the first support portion 181 coupled to the bracket 140, the second support portion 183 coupled to the second structure 160, and the elastic portion 185 connecting the first support portion 181 and the second support portion 183.

In an embodiment, the first support portion 181 may be rotatably coupled to the first connecting shaft 145 of the bracket 140. The second support portion 183 may be rotatably coupled to the second connecting shaft 165 of the second structure 160. The first support portion 181 coupled to the first connecting shaft 145 may move together with the first connecting shaft 145, and the second support portion 183 coupled to the second connecting shaft 165 may move together with the second connecting shaft 165.

In an embodiment, the driving unit 180 may be configured such that, when the second structure 160 slides relative to the bracket 140, the first support portion 181 rotates about the first connecting shaft 145 and the second support portion 183 linearly moves together with the second connecting shaft 165 in directions parallel to the sliding directions D1 and D2 while rotating about the second connecting shaft 165.

In an embodiment, the second support portion 183 may linearly move together with the second connecting shaft 165 in the sliding directions D1 and D2 when the second structure 160 moves relative to the bracket 140. The first support portion 181 may rotate about the first connecting shaft 145 when the second support portion 183 moves. For example, when the second structure 160 moves, the first support portion 181 may rotate about the first connecting shaft 145 in a predetermined range in a state in which a movement in the sliding directions D1 and D2 is limited.

In an embodiment, in the first state, the second support portion 183 may be located in the second direction D2 with respect to the first support portion 181. In the second state, the second support portion 183 may be located in the first direction D1 with respect to the first support portion 181. For example, the shape of the driving unit 180 illustrated in <601> of FIG. 6 may be referred to as the shape of the driving unit 180 illustrated in <401> of FIG. 4, and the shape of the driving unit 180 illustrated in <602> of FIG. 6 may be referred to as the shape of the driving unit 180 illustrated in <402> of FIG. 4. For example, when the electronic device 100 is changed to the first state or the second state, the second support portion 183 may linearly move in the first direction D1 or the second direction D2 with respect to the first support portion 181, and the elastic portion 185 may be compressed or uncompressed accordingly.

For example, when the electronic device 100 is changed from the first state 101 to the second state 102, the second connecting shaft 165 and the second support portion 183 may move in the first direction D1 as the second structure 160 moves in the first direction D1 (e.g., movement ① of <601>). When the second connecting shaft 165 moves in the first direction D1, the first support portion 181 may rotate about the first connecting shaft 145, and the second support portion 183 may move together with the second connecting shaft 165 in the first direction D1 while rotating about the second connecting shaft 165.

For example, when the electronic device 100 is changed from the second state 102 to the first state 101, the second connecting shaft 165 and the second support portion 183 may move in the second direction D2 as the second structure 160 moves in the second direction D2 (e.g., movement ② of <602>). When the second connecting shaft 165 moves in the second direction D2, the first support portion 181 may rotate about the first connecting shaft 145, and the second support portion 183 may move together with the second connecting shaft 165 in the second direction D2 while rotating about the second connecting shaft 165.

In an embodiment, as the second support portion 183 moves, the elastic portion 185 may be compressed or uncompressed to generate an elastic force. For example, the elastic portion 185 may be compressed or uncompressed as the second support portion 183 linearly moves in the sliding directions D1 and D2 relative to the first support portion 181 in the state in which the position of the first support portion 181 in the sliding directions D1 and D2 (e.g., the position in the X-axis direction) is fixed. For example, the elastic portion 185 may be compressed with a decrease in the distance between the first support portion 181 and the second support portion 183 and may be uncompressed with an increase in the distance between the first support portion 181 and the second support portion 183.

In an embodiment, the elastic portion 185 may be configured to be sequentially compressed and uncompressed when the state of the electronic device 100 is changed. For example, when the state of the electronic device 100 is changed, the elastic portion 185 may be compressed while the second structure 160 (or, the second support portion 183) moves in the sliding directions D1 and D2 by a specified distance and may be uncompressed while the second structure 160 (or, the second support portion 183) moves more than the specified distance. For example, the elastic portion 185 may provide an elastic force in the opposite direction to the moving direction of the second structure 160 while being compressed and may provide an elastic force in the same direction as the moving direction of the second structure 160 while being uncompressed.

In an embodiment, the elastic portion 185 may include various types of springs. According to the illustrated embodiment, the elastic portion 185 may be implemented with a torsion spring. However, without being limited to the illustrated embodiment, the elastic portion 185 may be implemented with a coil spring in various embodiments.

In an embodiment, the driving unit 180 may include a plurality of driving units. For example, the driving unit 180 may include the first driving unit 180-1 and the second driving unit 180-2 spaced apart from each other in the direction (e.g., the Y-axis direction) perpendicular to the sliding directions D1 and D2. The first driving unit 180-1 and the second driving unit 180-2 may be provided in substantially the same shape and/or structure. However, the number of driving units 180 is not limited to the illustrated embodiment. In various embodiments, the driving unit 180 may include one driving unit, or may include three or more driving units. In various embodiments, the direction in which the first driving unit 180-1 and the second driving unit 180-2 are arranged may be changed.

Hereinafter, a motion of the driving unit 180 when the state of the electronic device 100 is changed will be described with reference to FIG. 7.

Referring to FIG. 7, the position of the second support portion 183 or the second connecting shaft 165 in the first state (<601> of FIG. 6) may be defined as the first point A1. The position of the second support portion 183 or the second connecting shaft 165 in the second state (<602> of FIG. 6) may be defined as the third point A3. The position of the second support portion 183 or the second connecting shaft 165 when the elastic portion is compressed to the maximum between the first state and the second state (or, when the distance between the second support portion 183 and the first support portion 181 is minimal) may be defined as the second point A2.

According to an embodiment, with the electronic device 100 in the first state, the second support portion 183 may move in the first direction D1 when the user slides the second structure 160 in the first direction D1. The elastic portion 185 may generate an elastic force in the first direction D1 when the second support portion 183 moves in the first direction D1 by a specified distance or more. Even though the user's external force is removed, the second structure 160 may be moved in the first direction D1 by the elastic force, and the electronic device 100 may be changed to the second state.

For example, when the electronic device 100 is in the first state, the second support portion 183 and the second connecting shaft 165 may be located at the first point A1. When the second structure 160 and the second connecting shaft 165 move in the first direction D1 in the first state, the first support portion 181 may rotate about the first connecting shaft 145 in the first rotational direction, and the second support portion 183 may move in the first direction D1 while rotating about the second connecting shaft 165 in the first rotational direction. Referring to FIG. 7, the first rotational direction in a motion of the first driving unit 180-1 may be the clockwise direction, and the first rotational direction in a motion of the second driving unit 180-2 may be the counterclockwise direction.

For example, the elastic portion 185 may be compressed while the second support portion 183 moves from the first point A1 to the second point A2 and may be compressed to the maximum at the second point A2. The elastic portion 185 may be uncompressed as the second support portion 183 passes through the second point A2. For example, while the second support portion 183 moves from the first point A1 to the second point A2, the elastic portion 185 may be compressed to generate an elastic force in the second direction D2. While the second support portion 183 moves from the second point A2 to the third point A3, the elastic portion 185 may be uncompressed to generate an elastic force in the first direction D1.

For example, in a motion in which the electronic device 100 is changed to the second state, the elastic force of the elastic portion 185 may act as a resistive force against sliding of the second structure 160 in the first direction D1 by the user until the second support portion 183 is located at the second point A2. The second support portion 183 may be moved to the third point A3 by the elastic force after passing through the second point A2, and thus the second structure 160 may automatically move in the first direction D1 even though the user no longer slides the second structure 160.

According to an embodiment, when the user moves the second structure 160 in the second direction D2 by a specified distance or more, with the electronic device 100 in the second state, the second structure 160 may be moved in the second direction D2 by the elastic force of the elastic portion 185 even though the user's external force is removed, and the electronic device 100 may be changed to the first state. For example, when the electronic device 100 is changed from the second state to the first state, the driving unit 180 may conversely operate, as compared with when the electronic device 100 is changed from the first state to the second state.

Figure 8A:
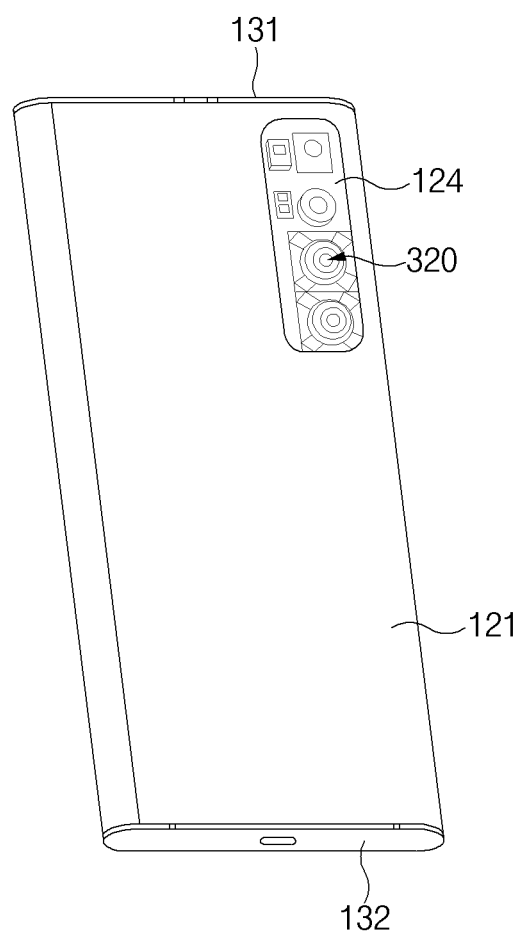
FIG. 8A is a rear perspective view of an electronic device according to an embodiment of the disclosure.

FIG. 8A is a rear perspective view of the electronic device according to an embodiment of the disclosure.

Figure 8B:
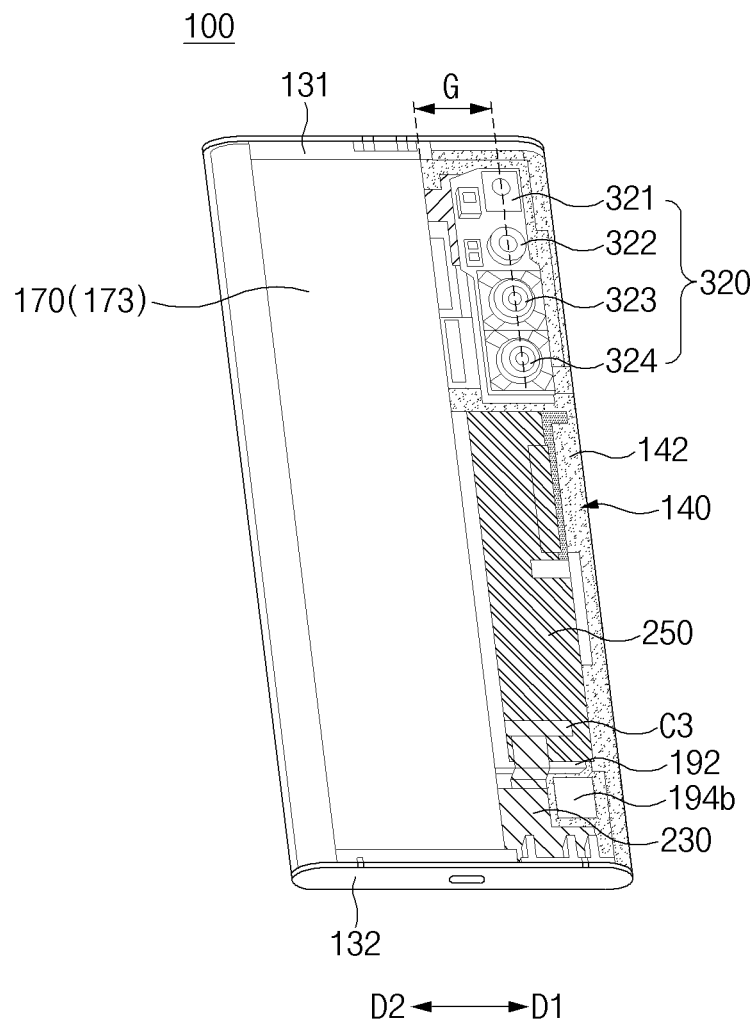
FIG. 8B is a rear perspective view of an electronic device according to an embodiment of the disclosure.

FIG. 8B is a rear perspective view of the electronic device according to an embodiment of the disclosure.

Figure 9:
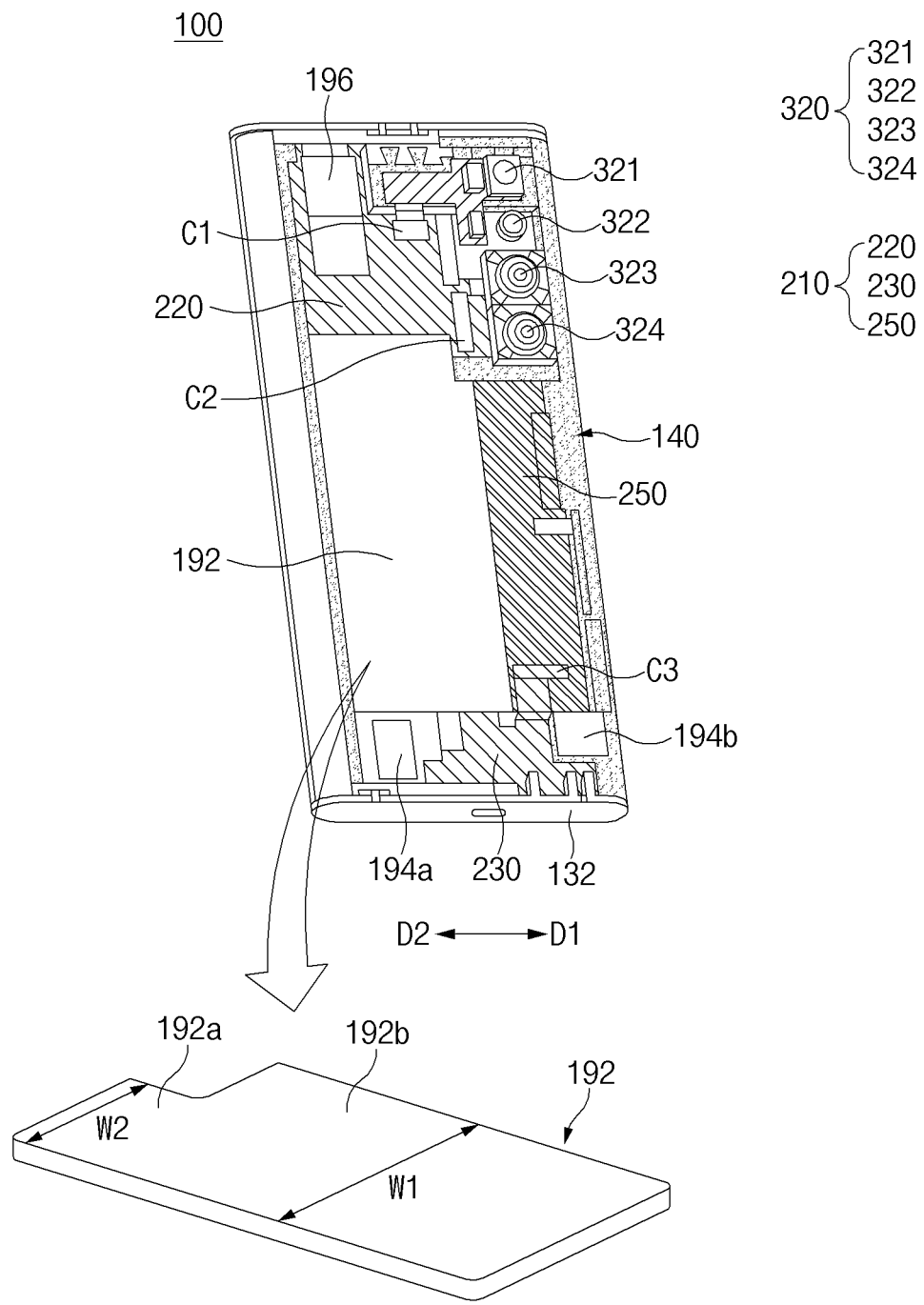
FIG. 9 illustrates a battery, a plurality of rear cameras, and a plurality of circuit boards of an electronic device according to an embodiment of the disclosure.

FIG. 9 illustrates the battery, the plurality of rear cameras, and the plurality of circuit boards of the electronic device according to an embodiment of the disclosure.

FIGS. 8A, 8B, and 9 may be views illustrating the first state (e.g., the first state 101 of FIG. 1 or the state illustrated in <401> of FIG. 4) of the electronic device 100.

FIG. 8B may be a view in which the back cover 121 is omitted from the electronic device 100 illustrated in FIG. 8A. FIG. 9 may be a view in which the display 170 is omitted from the electronic device 100 illustrated in FIG. 8B.

Referring to FIGS. 8A, 8B, and 9, the electronic device 100 according to an embodiment may include the back cover 121, the side members (e.g., the first side member 131 and the second side member 132), the bracket 140, the display 170, the battery 192, the plurality of circuit boards 210, and the plurality of rear cameras 320.

The components of the electronic device 100 illustrated in FIGS. 8A, 8B, and 9 are identical or similar to some of the components of the electronic device 100 illustrated in FIGS. 1 to 4, and repetitive descriptions will be omitted.

In an embodiment, the plurality of rear cameras 320 may be visually exposed on at least a partial area of the back cover 121. For example, the camera decoration member 124 may be disposed on the back cover 121, and the plurality of rear cameras 320 may be configured to be visually exposed on the rear side of the electronic device 100 through the camera decoration member 124.

In an embodiment, the bracket 140 may be configured such that the side members 131 and 132 are coupled to opposite longitudinal end portions of the bracket 140. The bracket 140 may include the second surface 142 (e.g., the second surface 142 of the bracket 140 of FIG. 4) that faces toward the rear side of the electronic device 100 (e.g., the −Z-axis direction). The battery 192, the plurality of rear cameras 320, and/or the plurality of circuit boards 210 may be disposed on the second surface 142 of the bracket 140. For example, the battery 192, the plurality of rear cameras 320, and the plurality of circuit boards 210 may be fixedly disposed on the second surface 142 of the bracket 140.

In an embodiment, the display 170 may be configured such that at least a partial area (e.g., the second area 173) faces toward the rear side of the electronic device 100 in the first state. For example, part of the display 170 illustrated in FIG. 8B may be part of the second area 173 (e.g., the second area 173 of FIG. 4) of the display 170 (e.g., refer to <401> of FIG. 4). For example, when the electronic device 100 illustrated in FIG. 8B is changed to the second state, part of the second area 173 facing toward the rear side of the electronic device 100 may be moved in the second direction D2 and may be exposed on the front side of the electronic device 100 (e.g., refer to <402> of FIG. 4).

In an embodiment, the display 170 may be configured so as not to overlap the plurality of rear cameras 320 in the first state. As illustrated in FIG. 8B, when the rear side (e.g., the side facing the −Z-axis direction) of the electronic device 100 is viewed, the second area 173 of the display 170 and the plurality of rear cameras 320 may be spaced apart from each other by a specified gap G in the sliding directions D1 and D2 so as not to overlap each other. For example, the size of the area of the display 170 that faces toward the rear side of the electronic device 100 may be maximal in the first state. When the display 170 overlaps the plurality of rear cameras 320 in the first state, the plurality of rear cameras 320 may be hidden by the display 170 and may fail to receive external light. The electronic device 100 according to an embodiment may be configured such that the second area 173 of the display 170 does not hide the plurality of rear cameras 320 in the first state. Accordingly, the plurality of rear cameras 320 may be configured to receive external light through the back cover 121 (e.g., the camera decoration member 124) in the first state.

In an embodiment, the battery 192 may be disposed on the second surface 142 of the bracket 140. For example, the battery 192 may be located between the first circuit board 220 and the second circuit board 230 among the plurality of circuit boards 210 when the rear side of the electronic device 100 is viewed. In an embodiment, at least part of the battery 192 may overlap a connecting circuit board 250 connecting the first circuit board 220 and the second circuit board 230.

In an embodiment, the battery 192 may be formed in a shape in which the width of one portion differs from the width of another portion. For example, the battery 192 may include a first portion 192*a* having a first width W1 and a second portion 192*b* having a second width W2 smaller than the first width W1. The second portion 192*b* may extend from part of the first portion 192*a* in the direction (e.g., the +Y-axis direction) perpendicular to the sliding directions D1 and D2. For example, the battery 192 may be formed in a substantially L-shape.

In an embodiment, a step portion (not illustrated) may be formed on the periphery of the battery 192 by the first portion 192*a* and the second portion 192*b*. For example, the step portion of the battery 192 may provide a space in which at least a part of the plurality of rear cameras 320 is disposed. For example, the second portion 192*b* of the battery 192 may extend toward the first circuit board 220 so as not to interfere with the plurality of rear cameras 320.

In an embodiment, as the second portion 192*b* extends with the second width W2 from the first portion 192*a*, the battery 192 may have different heights along the sliding directions D1 and D2. The thickness of the battery 192 may be substantially uniform. For example, the width of the battery 192 may be the length in the X-axis direction (or, the sliding directions D1 and D2), the heights may be the lengths in the Y-axis direction, and the thickness may be the length in the Z-axis direction. In an embodiment, the battery 192 may be formed such that the height of one part is greater than the height of another portion due to the second portion 192*b*, and thus the volume or capacity of the battery 192 may be increased.

In an embodiment, the plurality of circuit boards 210 may be structures for electrical connections between various electronic components included in the electronic device 100. For example, the plurality of circuit boards 210 may include a plurality of circuit boards (e.g., the first circuit board 220, the second circuit board 230, the third circuit board 240, and the connecting circuit board 250) to which the various electronic components are electrically connected. In an embodiment, the plurality of circuit boards 210 may be supported by the bracket 140. For example, some of the plurality of circuit boards 210 may be fixedly disposed on the second surface 142 of the bracket 140.

In an embodiment, the plurality of circuit boards 210 may include the first circuit board 220, the second circuit board 230, and the connecting circuit board 250 connecting the first circuit board 220 and the second circuit board 230. For example, the first circuit board 220, the second circuit board 230, and the connecting circuit board 250 may include a printed circuit board (PCB), a flexible PCB (FPCB), or a rigid-flexible PCB (RFPCB). In various embodiments, the first circuit board 220 and the second circuit board 230 may be PCBs, and the connecting circuit board 250 may be an FPCB.

In an embodiment, the first circuit board 220 and the second circuit board 230 may be aligned in the direction perpendicular to the sliding directions D1 and D2 with the battery 192 therebetween. For example, the first circuit board 220 may be disposed on the second surface 142 of the bracket 140 so as to be located adjacent to the first side member 131 (e.g., an upper end of the electronic device 100). For example, the second circuit board 230 may be disposed on the second surface 142 of the bracket 140 so as to be located adjacent to the second side member 132 (e.g., a lower end of the electronic device 100). In various embodiments, the first circuit board 220 may be understood as the main circuit board located in the upper end of the electronic device 100 (e.g., the +Y-axis direction). In various embodiments, the second circuit board 230 may be understood as a sub-circuit board located in the lower end of the electronic device 100 (e.g., the −Y-axis direction).

In an embodiment, the plurality of rear cameras 320 may be electrically connected to the first circuit board 220. For example, a first camera structure (e.g., a first camera structure 328 of FIG. 10) having a first camera module 321 included therein may be electrically connected to the first circuit board 220. The first camera structure 328 may be connected to the first circuit board 220 through a first connector C1. A third camera module 323 and a fourth camera module 324 may be electrically connected to the first circuit board 220. For example, the third camera module 323 and the fourth camera module 324 may be connected to the first circuit board 220 through a second connector C2. Although not illustrated in FIG. 9, in various embodiments, a second camera module 322 may be electrically connected with the first circuit board 220 through another circuit board (e.g., the third circuit board 240 of FIG. 10). For example, the second camera module 322 may be connected to the third circuit board 240 located under the third camera module 323 and the fourth camera module 324, and the third circuit board 240 may be connected to the first circuit board 220. In FIG. 9, the third circuit board 240 may be disposed under the third camera module 323 and the fourth camera module 324 to overlap the third camera module 323 and the fourth camera module 324. In FIG. 9, the third circuit board 240 may be understood as being hidden by the third camera module 323 and the fourth camera module 324.

In an embodiment, the first circuit board 220 and the first camera module 321 may transmit/receive electrical signals related to the first camera module 321 through the first connector C1. The first circuit board 220 and the third camera module 323 or the first circuit board 220 and the fourth camera module 324 may transmit/receive electrical signals related to the third camera module 323 or the fourth camera module 324 through the second connector C2.

In an embodiment, a SIM socket 196 may be disposed on a partial area of the first circuit board 220. For example, the SIM socket 196 may be electrically connected to the first circuit board 220. The SIM socket 196 disposed on the first circuit board 220 may be fixed to the bracket 140.

In an embodiment, a second speaker module 194a (e.g., a lower speaker) and a vibration module 194b (e.g., a haptic module 579 of FIG. 24) may be electrically connected to the second circuit board 230. For example, the second speaker module 194a and the vibration module 194b may be surface mounted on a partial area of the second circuit board 230. Although not illustrated, contact members (e.g., contact members 197 of FIGS. 20 and 21) making electrical contact with at least part of the second side member 132 may be disposed on the second circuit board 230 to use the second side member 132 as an antenna radiator. For example, the contact members may be mounted to be electrically connected to the second circuit board 230, and the second side member 132 may be electrically connected with the second circuit board 230 through the contact members.

In an embodiment, the first circuit board 220 and the second circuit board 230 may be electrically connected through the connecting circuit board 250. For example, the second circuit board 230 may include a third connector C3 connected to the connecting circuit board 250.

In an embodiment, the connecting circuit board 250 may electrically connect the first circuit board 220 and the second circuit board 230. For example, the connecting circuit board 250 may extend across part of the battery 192 in the direction perpendicular to the sliding directions D1 and D2. For example, one end portion (e.g., an end portion facing the −Y-axis direction) of the connecting circuit board 250 may be connected with the third connector C3 of the second circuit board 230. An opposite end portion (e.g., an end portion facing the +Y-axis direction) of the connecting circuit board 250 may be electrically connected with the first circuit board 220. In various embodiments, the connecting circuit board 250 may be integrally formed with the first circuit board 220 or the second circuit board 230.

Figure 10:
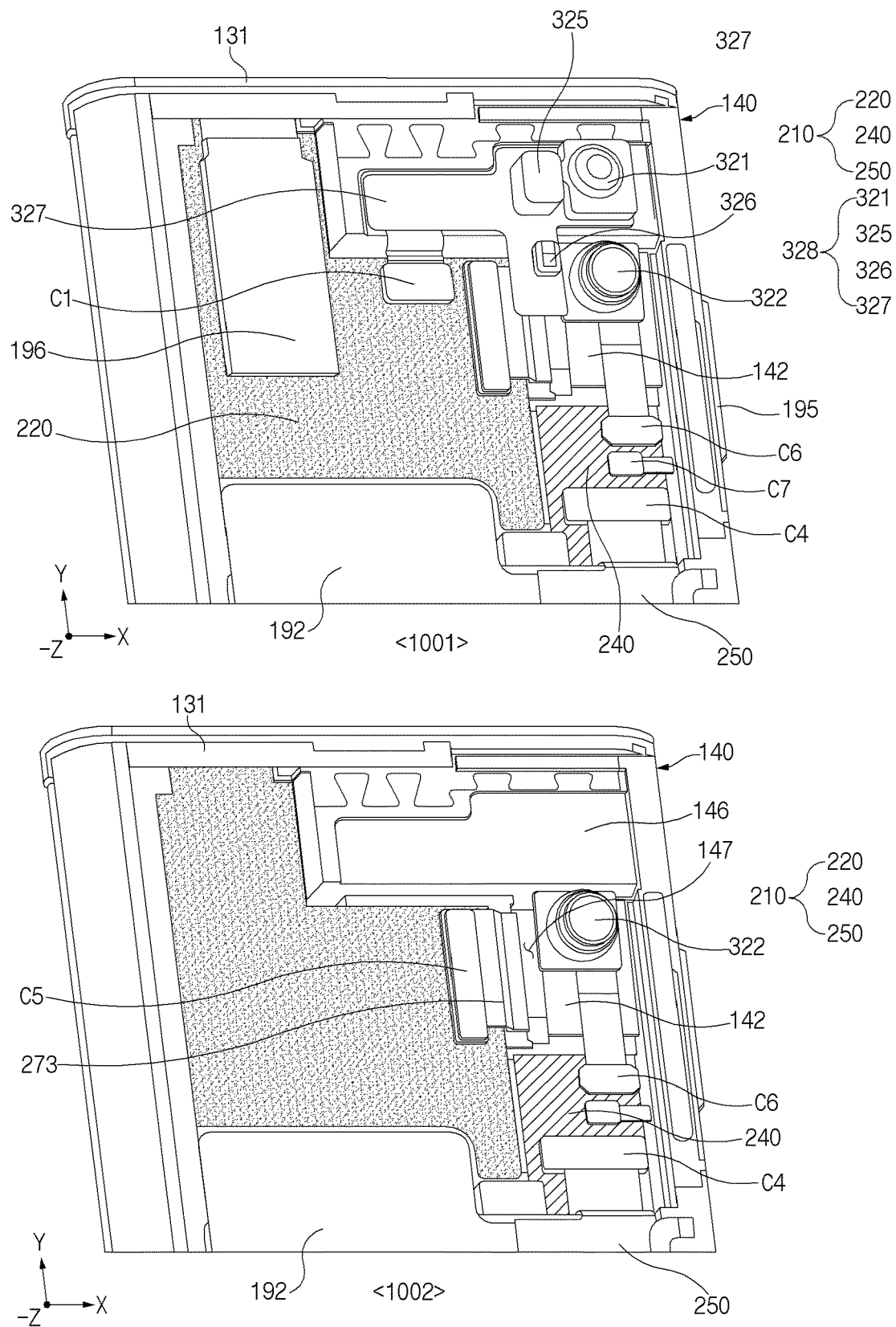
FIG. 10 illustrates an electrical connection structure of a plurality of circuit boards according to an embodiment of the disclosure.

Although not illustrated in FIG. 9, the connecting circuit board 250 may be indirectly connected with the first circuit board 220 through another circuit board (e.g., the third circuit board 240 of FIG. 10). An electrical connection structure of the connecting circuit board 250 and the first circuit board 220 will be described below in more detail with reference to FIGS. 10 to 12.

In an embodiment, the plurality of rear cameras 320 may be disposed on the bracket 140 such that lenses (not illustrated) face toward the rear side of the electronic device 100. For example, the plurality of rear cameras 320 may be disposed on a partial area of the second surface 142 of the bracket 140. The plurality of rear cameras 320 may be disposed in positions not overlapping the second area 173 of the display 170 in the first state. For example, the plurality of rear cameras 320 may be disposed adjacent to the edge of the bracket 140 that faces the first direction D1 (e.g., the edge facing the +X-axis direction).

In an embodiment, the plurality of rear cameras 320 may include one or more camera modules. For example, the plurality of rear cameras 320 may include the first camera module 321, the second camera module 322, the third camera module 323, and the fourth camera module 324. However, the number of rear cameras 320 is not limited to the illustrated embodiment. According to various embodiments, the plurality of rear cameras 320 may not include some of the first camera module 321 to the fourth camera module 324, or may additionally include another camera module (not illustrated).

In an embodiment, the plurality of rear cameras 320 may be electrically connected with at least some of the plurality of circuit boards 210. For example, the first camera module 321 may be connected to the first circuit board 220 through the first connector C1. The second camera module 322 may be connected to the first circuit board 220 by using another circuit board (e.g., the third circuit board 240 of FIG. 10) as an intermediate connecting circuit board. In an embodiment, the third camera module 323 and the fourth camera module 324 may be implemented as an integrated module and may be connected with the first circuit board 220 using the same connecting member. For example, the third camera module 323 and the fourth camera module 324 may be connected to the first circuit board 220 through the second connector C2. An electrical connection structure of the first camera module 321 and the second camera module 322 will be described below in more detail with reference to FIGS. 10 to 12.

In an embodiment, the first camera module 321 to the fourth camera module 324 may be arranged in the direction perpendicular to the sliding directions D1 and D2 of the second structure 160. For example, the first camera module 321, the second camera module 322, the third camera module 323, and the fourth camera module 324 may be disposed in a row along the direction (e.g., the Y-axis direction) perpendicular to the sliding directions D1 and D2. The first camera module 321 to the fourth camera module 324 may be spaced apart from the second area 173 of the display 170 in a direction parallel to the sliding directions D1 and D2. For example, in the first state, the plurality of rear cameras 320 may be spaced, by the specified gap G in the first direction D1, apart from an end portion of the second area 173 of the display 170 that faces the first direction D1. As the electronic device 100 is changed from the first state to the second state, the gap G between the second area 173 and the plurality of rear cameras 320 may increase.

FIG. 10 illustrates an electrical connection structure of the plurality of circuit boards according to an embodiment of the disclosure.

Figure 11:
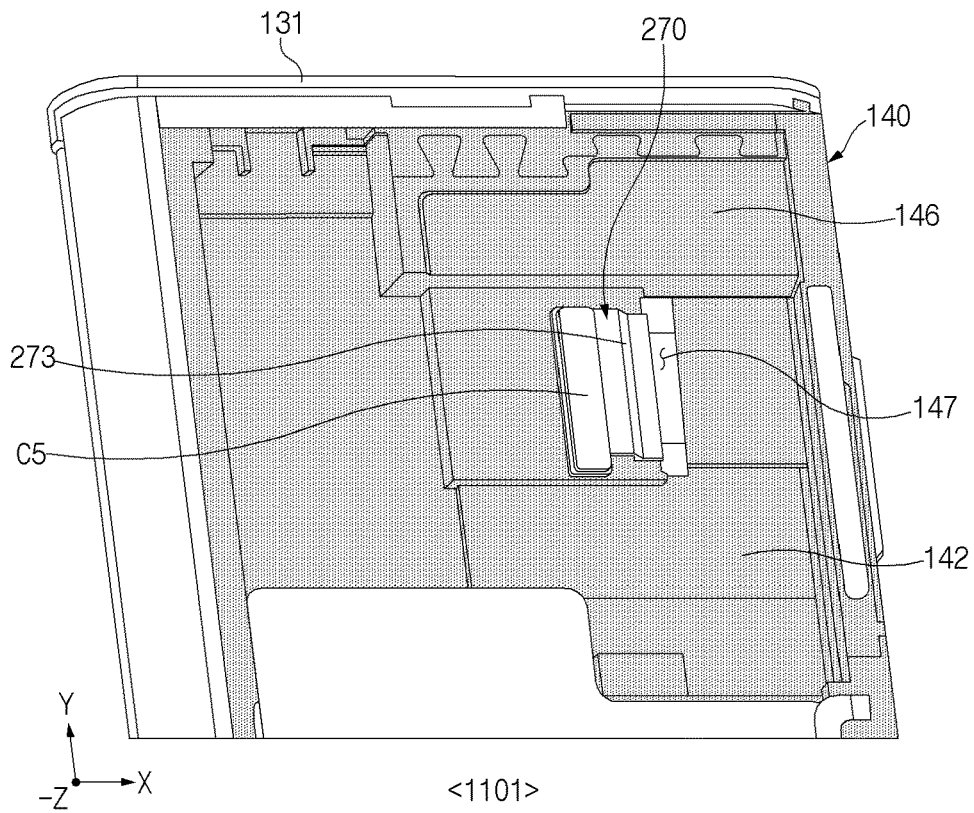
FIG. 11 illustrates an electrical connection structure of a plurality of circuit boards according to an embodiment of the disclosure.
Figure 11:
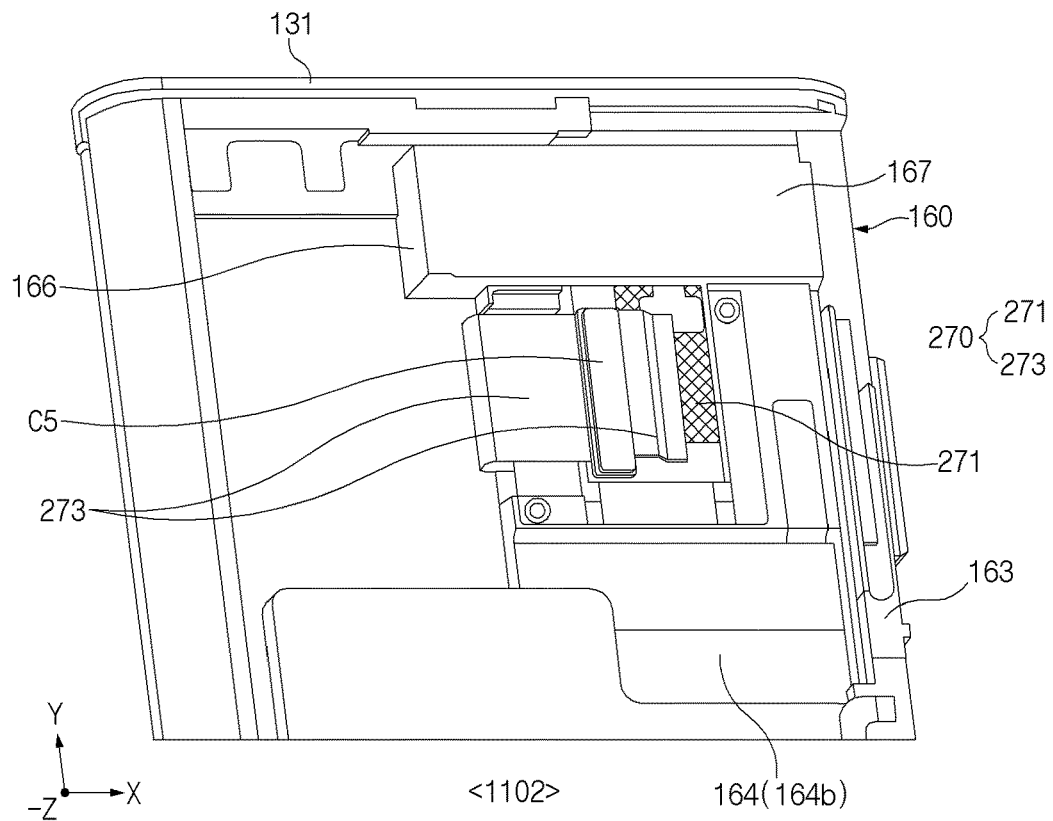

FIG. 11 illustrates the electrical connection structure of the plurality of circuit boards according to an embodiment of the disclosure.

Figure 12:
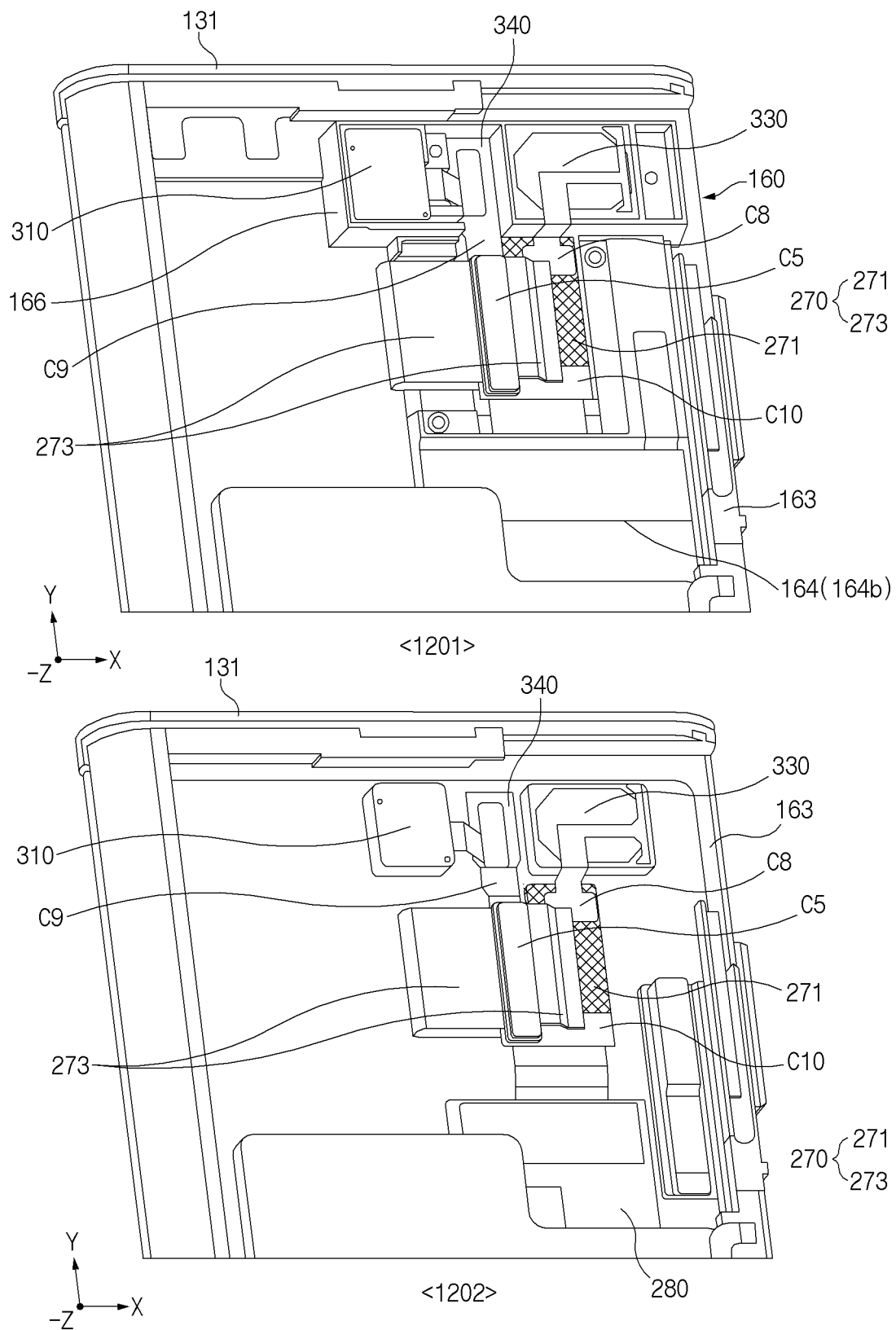
FIG. 12 illustrates an electrical connection structure of a plurality of circuit boards according to an embodiment of the disclosure.

FIG. 12 illustrates the electrical connection structure of the plurality of circuit boards according to an embodiment of the disclosure.

FIGS. 10 to 12 may be views when the electronic device 100 is viewed from the rear. For example, FIGS. 10 to 12 may be understood as views in which the back cover 121 or the display 170 is omitted from FIGS. 8A and 8B, which are views when the electronic device 100 is viewed in the direction toward the back cover 121, such that the plurality of circuit boards 210 and the plurality of rear cameras 320 are visible.

Referring to FIG. 10, the electronic device 100 according to an embodiment may include the bracket 140, the plurality of circuit boards 210, and the plurality of rear cameras 320. For example, the electronic device 100 may be configured such that the plurality of rear cameras 320 are electrically connected to the plurality of circuit boards 210.

<1001> of FIG. 10 may be a view in which the third camera module (e.g., the third camera module 323 of FIG. 9) and the fourth camera module (e.g., the fourth camera module 231 of FIG. 9) are omitted from the electronic device 100 of FIG. 9. <1002> of FIG. 10 may be a view in which the first camera structure 328 is omitted from the electronic device 100 in <1001> of FIG. 10.

In an embodiment, the plurality of circuit boards 210 may include the first circuit board 220, the connecting circuit board 250, and the third circuit board 240. For example, the first circuit board 220 may be understood as the main circuit board, and the third circuit board 240 may be understood as a sub-circuit board. In various embodiments, a processor (e.g., the processor 520 of FIG. 24) may be disposed on the first circuit board 220.

In an embodiment, the first circuit board 220 and the third circuit board 240 may be disposed on different areas of the second surface 142 of the bracket 140. The first circuit board 220 and the third circuit board 240 may be electrically connected with each other. For example, the third circuit board 240 may include a connector (not illustrated) (e.g., an eleventh connector C11 of FIG. 4) that is connected to the first circuit board 220. In FIG. 10, the connector of the third circuit board 240 may be connected to a rear surface (e.g., a surface facing the +Z-axis direction) of the first circuit board 220. In various embodiments, the first circuit board 220 and the third circuit board 240 may be integrally formed with each other.

In an embodiment, the first circuit board 220 may be connected with the first camera structure 328. For example, the first connector C1 of the first camera structure 328 may be connected to the first circuit board 220.

In an embodiment, the first circuit board 220 may be connected with a flexible circuit board portion 273 of a slide circuit board (e.g., a slide circuit board 270 of FIG. 11). For example, a fifth connector C5 of the flexible circuit board portion 273 may be connected to the first circuit board 220.

Although not illustrated in FIG. 10, the first circuit board 220 may be connected with the third camera module (e.g., the third camera module 323 of FIG. 9) and the fourth camera module (e.g., the fourth camera module 324 of FIG. 9). For example, the second connector (e.g., the second connector C2 of FIG. 9) of the third camera module 323 and the fourth camera module 324 may be connected to the first circuit board 220.

In an embodiment, the connecting circuit board 250 may be electrically connected with the third circuit board 240. For example, the connecting circuit board 250 may be connected to the third circuit board 240 through a fourth connector C4. Although not illustrated in FIG. 10, the plurality of circuit boards 210 may further include the second circuit board (e.g., the second circuit board 230 of FIG. 9) that is located in the lower end of the electronic device 100, and the connecting circuit board 250 may electrically connect the second circuit board 230 and the third circuit board 240. For example, one end portion (e.g., an end portion facing the −Y-axis direction in FIG. 9) of the connecting circuit board 250 may be connected with the second circuit board 230 through the third connector C3, and an opposite end portion (e.g., an end portion facing the +Y-axis direction in FIG. 9) of the connecting circuit board 250 may be connected with the third circuit board 240 through the fourth connector C4. Accordingly, the connecting circuit board 250 may electrically connect the second circuit board 230 and the third circuit board 240. According to an embodiment, the connecting circuit board 250 may be electrically connected with the first circuit board 220 through the third circuit board 240. However, a structure for electrically connecting the first circuit board 220, the second circuit board 230, the third circuit board 240, and the connecting circuit board 250 is not limited to the illustrated embodiment, and various methods may be applied.

In an embodiment, the third circuit board 240 may be electrically connected with the second camera module 322. For example, a sixth connector C6 of the second camera module 322 may be connected to the third circuit board 240. The third circuit board 240 may be electrically connected with the second camera module 322 through the sixth connector C6.

In an embodiment, the third circuit board 240 may be electrically connected with a side key module 195. For example, a seventh connector C7 of the side key module 195 may be connected to the third circuit board 240. The third circuit board 240 may be electrically connected with the side key module 195 through the seventh connector C7. For example, at least part of the side key module 195 may be disposed on a side surface (e.g., a side surface facing the +X-axis direction) of the bracket 140. The bracket 140 may have, in the side surface thereof, a key hole (not illustrated) in which at least part of the side key module 195 is accommodated. For example, the key hole may penetrate at least part of the side surface of the bracket 140. According to an embodiment, the side key module 195 may be electrically connected with the first circuit board 220 through the third circuit board 240.

In an embodiment, the third circuit board 240 may electrically connect the connecting circuit board 250, the second camera module 322, and the side key module 195 with the first circuit board 220. For example, the connecting circuit board 250 and the second camera module 322 may be connected to the third circuit board 240 and may be electrically connected with the first circuit board 220 through the third circuit board 240. In consideration of the arrangement of the flexible circuit board portion 273 of the slide circuit board 270, the electronic device 100 according to an embodiment may be configured such that the second camera module 322, the side key module 195, and the connecting circuit board 250 are electrically connected with the first circuit board 220 through the third circuit board 240.

In an embodiment, the third circuit board 240 may overlap the third camera module 323 and the fourth camera module 324. FIG. 10 is a view in which the third camera module 323 and the fourth camera module 324 are omitted. However, when the third camera module 323 and the fourth camera module 324 are disposed on the bracket 140 as illustrated in FIG. 9, the third circuit board 240 may overlap the third camera module 323 and the fourth camera module 324 and may be hidden by the third camera module 323 and the fourth camera module 324. For example, the third circuit board 240 may be disposed under the third camera module 323 and the fourth camera module 324 (e.g., the +Z-axis direction).

In an embodiment, the plurality of rear cameras 320 may include the first camera module 321 and the second camera module 322. Although not illustrated in FIG. 10, the plurality of rear cameras 320 may further include the third camera module (e.g., the third camera module 323 of FIG. 9) and the fourth camera module (e.g., the fourth camera module 324 of FIG. 9).

In an embodiment, the first camera module 321 may form the first camera structure 328 together with a first sensor module 325, a flash module 326 (e.g., a flash 620 of FIG. 25), and a circuit board member 327. The first camera structure 328 may include the first camera module 321, the first sensor module 325, the flash module 326, and the circuit board member 327. For example, the first camera structure 328 may refer to a structure configured in a form in which the first camera module 321, the first sensor module 325, the flash module 326, and the circuit board member 327 are coupled and/or assembled.

In an embodiment, the first camera structure 328 may be disposed on a partial area of the second surface 142 of the bracket 140. For example, the bracket 140 may have, on the second surface 142 thereof, a seating area on which the first camera structure 328 is disposed. The seating area 146 may be formed in a position adjacent to the first side member 131. The seating area 146 may be formed in a shape corresponding to the circuit board member 327 of the first camera structure 328. For example, the first camera structure 328 may be fixed to the bracket 140 by attaching the circuit board member 327 to the seating area 146.

In an embodiment, the first camera structure 328 may be provided in a form in which the first camera module 321, the first sensor module 325, and the flash module 326 are disposed on the circuit board member 327. For example, the first camera module 321, the first sensor module 325, and the flash module 326 may be electrically connected to the circuit board member 327. In various embodiments, the first camera module 321, the first sensor module 325, and the flash module 326 may be surface mounted on the circuit board member 327.

In an embodiment, the first camera structure 328 may be electrically connected with the first circuit board 220 through the first connector C1 of the circuit board member 327. For example, the first connector C1 of the circuit board member 327 may be connected to the first circuit board 220, and the first camera module 321, the first sensor module 325, and the flash module 326 may be electrically connected with the first circuit board 220 accordingly. For example, the first circuit board 220 and the first camera structure 328 may transmit/receive electrical signals related to components (e.g., the first camera module 321, the first sensor module 325, and the flash module 326) of the first camera structure 328 through the first connector C1.

In consideration of the arrangement of the flexible circuit board portion 273, the electronic device 100 according to an embodiment may be configured such that the first camera module 321, the first sensor module 325, and the flash module 326 are formed to be an integrated module and are electrically connected with the first circuit board 220.

In an embodiment, the second camera module 322 may be connected to the third circuit board 240. For example, the second camera module 322 may include the sixth connector C6 connected to the third circuit board 240. The second camera module 322 may be electrically connected with the third circuit board 240 through the sixth connector C6. For example, the sixth connector C6 may extend from the second camera module 322 toward the third circuit board 240. According to an embodiment, the second camera module 322 may be electrically connected with the first circuit board 220 through the third circuit board 240. For example, the first circuit board 220 and the second camera module 322 may transmit/receive electrical signals related to the second camera module 322 through the sixth connector C6 and the third circuit board 240.

Referring to FIGS. 11 and 12, the electronic device 100 according to an embodiment may include the bracket 140, the second structure 160, the front camera module 310, a second sensor module 340, a first speaker module 330, and the slide circuit board 270.

<1101> of FIG. 11 may be a view in which the first circuit board 220, the third circuit board 240, the connecting circuit board 250, the third camera module 323, and the SIM socket 196 are omitted from the electronic device 100 in <1002> of FIG. 10. <1102> of FIG. 11 may be a view in which the bracket 140 is omitted from the electronic device 100 in <1101> of FIG. 11. For example, <1101> of FIG. 11 illustrates the second surface 142 (e.g., the second surface 142 of FIG. 4) of the bracket 140, and <1102> of FIG. 11 illustrates the fourth surface 164b (e.g., the fourth surface 164b of FIG. 4) of the second structure 160.

<1201> of FIG. 12 may be a view in which a cover 167 of the second structure 160 is omitted from the electronic device 100 in <1102> of FIG. 11. <1202> of FIG. 12 may be a view in which the plate portion 164 of the second structure 160 is omitted from the electronic device 100 in <1201> of FIG. 12.

In an embodiment, the slide circuit board 270 may be at least partially disposed on the second structure 160 to move together with the second structure 160.

In an embodiment, the slide circuit board 270 may include a fixed circuit board portion 271 fixedly disposed on the plate portion 164 of the second structure 160 and the flexible circuit board portion 273 extending from the fixed circuit board portion 271. For example, the fixed circuit board portion 271 of the slide circuit board 270 may be fixedly disposed on the fourth surface 164b of the plate portion 164. The fixed circuit board portion 271 may move together with the second structure 160 when the second structure 160 moves relative to the bracket 140. The flexible circuit board portion 273 may flexibly extend from the fixed circuit board portion 271.

In an embodiment, the slide circuit board 270 may be configured such that the fixed circuit board portion 271 and the flexible circuit board portion 273 are integrally formed with each other. For example, the slide circuit board 270 may be a rigid-flexible printed circuit board (RFPCB) including a rigid circuit board (e.g., the fixed circuit board portion 271) and a flexible circuit board (e.g., the flexible circuit board portion 273). However, the shape of the slide circuit board 270 is not limited to the above-described embodiment. According to various embodiments, the slide circuit board 270 may be configured such that the flexible circuit board portion 273 formed of an FPCB and the fixed circuit board portion 271 formed of a PCB are manufactured as separate components and connected with each other.

In an embodiment, the slide circuit board 270 may be electrically connected with the first circuit board 220. Although the first circuit board 220 is not illustrated in FIG. 11, the slide circuit board 270 may be configured such that the flexible circuit board portion 273 is connected with the first circuit board 220 as illustrated in FIG. 10. For example, the slide circuit board 270 may be formed in a form in which the flexible circuit board portion 273 extends from the fixed circuit board portion 271 toward the first circuit board 220. The flexible circuit board portion 273 may include the fifth connector C5 connected to the first circuit board 220. The fifth connector C5 of the flexible circuit board portion 273 may be connected to the first circuit board 220, and accordingly the slide circuit board 270 may be electrically connected with the first circuit board 220 (refer to FIG. 10).

In an embodiment, the flexible circuit board portion 273 may pass through part of the bracket 140 in an up/down direction (e.g., the Z-axis direction) and may connect the fixed circuit board portion 271 and the first circuit board 220 facing each other with the bracket 140 therebetween. For example, the first circuit board 220 may be located on the second surface 142 of the bracket 140, and the fixed circuit board portion 271 may be located between the fourth surface 164*b* of the second structure 160 and the first surface (e.g., the surface facing the +Z-axis direction) of the bracket 140. In an embodiment, the bracket 140 may have an opening 147 formed through the bracket 140 in the up/down direction. The flexible circuit board portion 273 of the slide circuit board 270 may extend from the fixed circuit board portion 271 toward the second surface 142 of the bracket 140 through the opening 147. The flexible circuit board portion 273 may be configured such that at least part thereof penetrates the bracket 140 in the up/down direction through the opening 147 and opposite end portions are connected to the first circuit board 220 and the fixed circuit board portion 271.

In an embodiment, as the fixed circuit board portion 271 is fixed to the second structure 160 and the first circuit board 220 is fixed to the bracket 140, at least part of the flexible circuit board portion 273 may move in the direction parallel to the sliding directions D1 and D2 when the second structure 160 slides relative to the bracket 140. In an embodiment, the flexible circuit board portion 273 may include one or more bending portion 273*b* and 273*d* such that at least part of the flexible circuit board portion 273 moves in the direction parallel to the sliding directions D1 and D2. The shape and motion of the flexible circuit board portion 273 will be described below in more detail with reference to FIG. 15.

In an embodiment, the front camera module 310, the second sensor module 340, the first speaker module 330, and the display circuit board 280 may be electrically connected to the slide circuit board 270. The front camera module 310, the second sensor module 340, the first speaker module 330, and the display circuit board 280 may be connected to the fixed circuit board portion 271 of the slide circuit board 270. According to an embodiment, the slide circuit board 270 may electrically connect the front camera module 310, the second sensor module 340, the first speaker module 330, and the display circuit board 280 to the first circuit board 220.

In an embodiment, the first speaker module 330 may be connected to the fixed circuit board portion 271 of the slide circuit board 270. For example, the first speaker module 330 may include an eighth connector C8 connected to the fixed circuit board portion 271. The first speaker module 330 may be electrically connected with the slide circuit board 270 through the eighth connector C8.

In an embodiment, a ninth connector C9 to which the second sensor module 340 and the front camera module 310 are connected may be connected to the fixed circuit board portion 271 of the slide circuit board 270. The second sensor module 340 and the front camera module 310 may be electrically connected with the slide circuit board 270 through the ninth connector C9.

In an embodiment, a tenth connector C10 connected with the display circuit board 280 may be connected to the fixed circuit board portion 271 of the slide circuit board 270. For example, opposite end portions of the tenth connector C10 may be connected to the display circuit board 280 and the fixed circuit board portion 271, and accordingly the tenth connector C10 may electrically connect the display circuit board 280 and the fixed circuit board portion 271. For example, the display circuit board 280 may be electrically connected with a display (e.g., the display 170 of FIG. 3), and the display 170 may be electrically connected with the first circuit board 220 through the display circuit board 280 and the slide circuit board 270.

In an embodiment, the second structure 160 may include a module accommodation part 166 in which the front camera module 310, the second sensor module 340, and the first speaker module 330 are accommodated. For example, the front camera module 310, the second sensor module 340, and the first speaker module 330 may be disposed inside the module accommodation part 166 of the second structure 160 and may move relative to the bracket 140 in the sliding directions D1 and D2 together with the second structure 160. The module accommodation part 166 may be formed on the plate portion 164 of the second structure 160. For example, the module accommodation part 166 may be formed on the fourth surface 164*b* of the plate portion 164.

In an embodiment, the module accommodation part 166 may protrude to a predetermined height from the fourth surface 164*b* to surround the front camera module 310, the second sensor module 340, and the first speaker module 330.

In an embodiment, the cover 167 may be coupled to the module accommodation part 166 to cover the front camera module 310, the second sensor module 340, and the first speaker module 330. For example, the cover 167 may be coupled to the top of the module accommodation part 166 (e.g., −Z-axis direction) and may overlap the front camera module 310, the second sensor module 340, and the first speaker module 330. In various embodiments, when the second structure 160 moves in the first direction D1 from the bracket 140, the cover 167 may hide the front camera module 310, the second sensor module 340, and the first speaker module 330 such that the front camera module 310, the second sensor module 340, and the first speaker module 330 are not exposed on the fourth surface 164*b* of the second structure 160. For example, the module accommodation part 166 and the cover 167 may be formed of a shielding member (e.g., a shield can) to shield electromagnetic waves.

Referring to FIGS. 10 to 12, the electronic device 100 according to the embodiment of the disclosure may be implemented such that electronic components included in the electronic device 100 are directly and/or indirectly electrically connected with the first circuit board 220 (e.g., the main circuit board).

For example, the first camera module 321, the first sensor module 325, and the flash module 326 may be implemented as an integrated module (e.g., the first camera structure 328) and may be connected to the first circuit board 220.

For example, the third camera module 323 and the fourth camera module 324 may be connected to the first circuit board 220 through substantially the same connector (e.g., the second connector C2 of FIG. 9).

For example, the second camera module 322, the connecting circuit board 250, and the side key module 195 may be connected to the third circuit board 240, and the third circuit board 240 may be electrically connected with the first circuit board 220. Accordingly, the second camera module 322, the connecting circuit board 250, and the side key module 195 may be electrically connected with the first circuit board 220 through the third circuit board 240. For example, the second circuit board 230 may be electrically connected with the first circuit board 220 through the connecting circuit board 250 and the third circuit board 240.

For example, the display 170 (or, the display circuit board 280), the front camera module 310, the first speaker module 330, and the second sensor module 340 may be connected to the slide circuit board 270, and the slide circuit board 270 may be electrically connected with the first circuit board 220. Accordingly, the display circuit board 280, the front camera module 310, the first speaker module 330, and the second sensor module 340 may be electrically connected with the first circuit board 220 through the slide circuit board 270.

Figure 13:
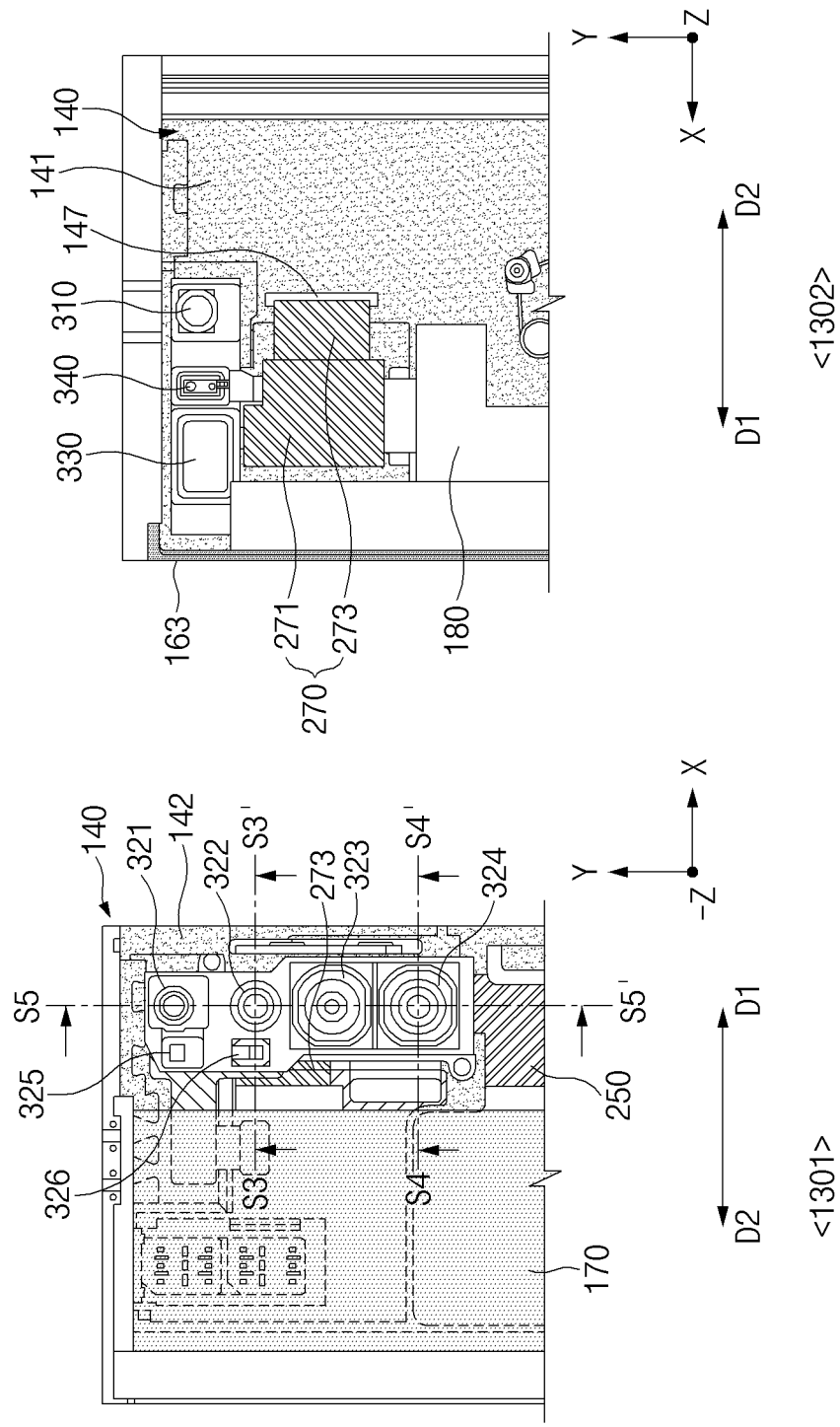
FIG. 13 illustrates a first state of an electronic device according to an embodiment of the disclosure.

FIG. 13 illustrates the first state of the electronic device according to an embodiment of the disclosure.

Figure 14:
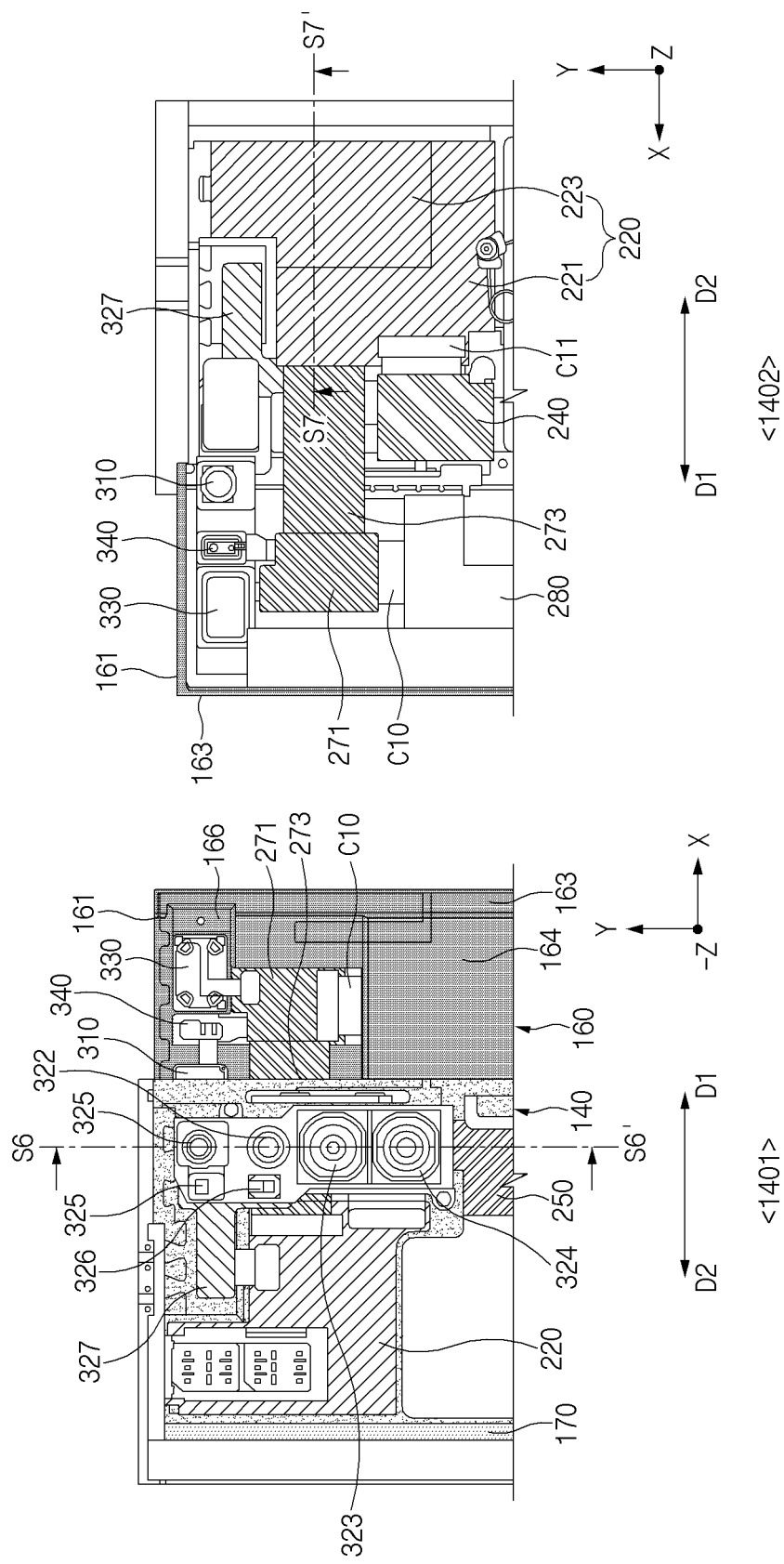
FIG. 14 illustrates a second state of an electronic device according to an embodiment of the disclosure.

FIG. 14 illustrates the second state of the electronic device according to an embodiment of the disclosure.

<1301> of FIG. 13 is a plan view illustrating the rear side of the electronic device 100 when the electronic device 100 is in the first state (e.g., the first state 101 of FIG. 1 or the state illustrated in <401> of FIG. 4). <1302> of FIG. 13 is a plan view illustrating the front side of the electronic device 100 when the electronic device 100 is in the first state 101.

<1401> of FIG. 14 is a plan view illustrating the rear side of the electronic device 100 when the electronic device 100 is in the second state (e.g., the second state 102 of FIG. 2 or the state illustrated in <402> of FIG. 4). <1402> of FIG. 14 is a plan view illustrating the front side of the electronic device 100 when the electronic device 100 is in the second state 102.

<1301> of FIG. 13 and <1401> of FIG. 14 may be views when the electronic device 100 is viewed in the direction toward the back cover 121 (e.g., the −Z-axis direction), and <1302> of FIG. 13 and <1402> of FIG. 14 may be views when the electronic device 100 is viewed in the direction toward the display 170 (e.g., the +Z-axis direction).

<1301> of FIG. 13 and <1401> of FIG. 14 may be views in which the back cover 121 is omitted. <1302> of FIG. 13 may be a view in which the plate portion 164 of the second structure 160 and the display 170 are omitted. <1402> of FIG. 14 may be a view in which the plate portion 164 of the second structure 160, the display 170, and the bracket 140 are omitted.

Referring to FIGS. 13 and 14, the electronic device 100 according to an embodiment may be changed to the first state or the second state as the second structure 160 moves in the first direction D1 or the second direction D2 relative to the bracket 140. For example, when the electronic device 100 is in the first state, the electronic device 100 may be changed to the second state as the second structure 160 moves in the first direction D1 relative to the bracket 140. When the electronic device 100 is in the second state, the electronic device 100 may be changed to the first state as the second structure 160 moves in the second direction D2 relative to the bracket 140.

When the second structure 160 slides relative to the bracket 140, some components (e.g., the front camera module 310, the first speaker module 330, the second sensor module 340, the slide circuit board 270, the display 170, or the display circuit board 280) among the components of the electronic device 100 may move together with the second structure 160, and other components (e.g., the plurality of circuit boards 210 and the plurality of rear cameras 320) may be fixed to the bracket 140. According to an embodiment, the electronic device 100 may be implemented such that when the second structure 160 slides, the components moving together with the second structure 160 remain electrically connected with the plurality of circuit boards 210.

In an embodiment, the plurality of rear cameras 320, the first circuit board 220, the connecting circuit board 250, and the third circuit board 240 may be fixedly disposed on the bracket 140. For example, when the second structure 160 moves relative to the bracket 140, the plurality of rear cameras 320, the first circuit board 220, the connecting circuit board 250, and the third circuit board 240 may remain fixed to the bracket 140 without moving together with the bracket 140. Although not illustrated in FIGS. 13 and 14, the second circuit board 230 electrically connected with the third circuit board 240 by the connecting circuit board 250 may be fixedly disposed on the bracket 140.

In an embodiment, the front camera module 310, the second sensor module 340, the first speaker module 330, the slide circuit board 270, and the display circuit board 280 may be fixedly disposed on the second structure 160. For example, the front camera module 310, the second sensor module 340, the first speaker module 330, the slide circuit board 270, and the display circuit board 280 may move together with the second structure 160 relative to the bracket 140.

In an embodiment, the second structure 160 may include the plate portion 164 and the peripheral portions 161 and 163 (e.g., the first peripheral portion 161, the second peripheral portion 162, and the third peripheral portion 163 of FIG. 3) that surround the plate portion 164. The front camera module 310, the second sensor module 340, the first speaker module 330, the slide circuit board 270, and the display circuit board 280 may be disposed on the plate portion 164 (e.g., the fourth surface 164b) of the second structure 160. For example, the front camera module 310, the second sensor module 340, and the first speaker module 330 may be disposed in the module accommodation part 166 formed on the plate portion 164. In various embodiments, the front camera module 310, the second sensor module 340, or the first speaker module 330 may be configured such that at least part thereof is visually exposed through an opening area (not illustrated) formed in the plate portion 164 when the third surface 164a of the plate portion 164 is viewed.

In an embodiment, the slide circuit board 270 may include the fixed circuit board portion 271 fixedly disposed on the plate portion 164 of the second structure 160 and the flexible circuit board portion 273 that extends from the fixed circuit board portion 271 and that is electrically connected with the first circuit board 220. For example, the fifth connector C5 of the flexible circuit board portion 273 may be connected to the first circuit board 220.

In an embodiment, the area of the flexible circuit board portion 273 connected to the fixed circuit board portion 271 may move in the sliding directions D1 and D2 of the second structure 160 as the second structure 160 moves. For example, referring to <1302> of FIG. 13 and <1402> of FIG. 14, when the second structure 160 moves in the first direction D1, at least part of the flexible circuit board portion 273 may be deformed while moving out of the opening 147 of the bracket 140 as the flexible circuit board portion 273 moves together with the fixed circuit board portion 271 in the first direction D1. For example, as the flexible circuit board portion 273 is deformed in response to the sliding motion of the second structure 160, the slide circuit board 270 and the first circuit board 220 may remain electrically connected with each other in the first state and the second state.

In an embodiment, the plurality of circuit boards 210 may include the first circuit board 220, the connecting circuit board 250, and the third circuit board 240. The first circuit board 220, the connecting circuit board 250, and the third circuit board 240 may be electrically connected. For example, the connecting circuit board 250 may be connected to the third circuit board 240, and the third circuit board 240 may be connected to the first circuit board 220. For example, the third circuit board 240 may be connected with the first circuit board 220 through the eleventh connector C11.

In an embodiment, the first circuit board 220 may be formed in a structure in which two circuit boards are stacked. For example, the first circuit board 220 may include a first circuit board layer 221 and a second circuit board layer 223 disposed on the first circuit board layer 221. For example, the first circuit board layer 221 and the second circuit board layer 223 may include a PCB. The second circuit board layer 223 may be disposed on one surface (e.g., a surface facing the +Z-axis direction) of the first circuit board layer 221 and may be electrically connected with the first circuit board layer 221 through an interposer. In various embodiments, the first circuit board layer 221 may be understood as a master PCB, and the second circuit board layer 223 may be understood as a slave PCB. The stack structure of the first circuit board 220 will be described below in more detail with reference to FIG. 18.

In an embodiment, the front camera module 310, the second sensor module 340, and the first speaker module 330 may be disposed in the module accommodation part 166 of the second structure 160. The module accommodation part 166 may overlap some of the plurality of rear cameras 320 in the first state and the second state. When the electronic device 100 is changed to the first state or the second state, the module accommodation part 166 may move in the first direction D1 or the second direction D2 in the state in which at least part of the module accommodation part 166 overlaps the first camera module 321 in the Z-axis direction. For example, a state in which some of the front camera module 310, the second sensor module 340, and the first speaker module 330 overlap the first camera module 321 may be formed as the second structure 160 moves.

In various embodiments, the second sensor module 340 may include a proximity sensor or an illuminance sensor. However, without being limited to the aforementioned examples, the second sensor module 340 may include at least one of an HRM sensor, a fingerprint sensor, a time of flight (TOF) sensor, an ultrasonic sensor, a gesture sensor, a gyro sensor, an atmospheric pressure sensor, a magnetic sensor, an acceleration sensor, a grip sensor, a color sensor, an infrared (IR) sensor, a biosensor, a temperature sensor, or a humidity sensor.

According to the illustrated embodiment, the front camera module 310, the second sensor module 340, and the first speaker module 330 may be sequentially arranged in the first direction D1. However, the positions and/or the arrangement sequence of the front camera module 310, the second sensor module 340, and the first speaker module 330 may be variously modified without being limited to the illustrated embodiment. In another embodiment, at least one of the front camera module 310, the second sensor module 340, or the first speaker module 330 may be omitted.

In an embodiment, in the first state, the first speaker module 330 may overlap the first camera module 321 among the plurality of rear cameras 320 in the Z-axis direction. For example, the first camera module 321 may be located under the first speaker module 330 (e.g., the −Z-axis direction). In an embodiment, in a state between the first state and the second state, the front camera module 310 may overlap the first camera module 321 in the Z-axis direction. For example, the first camera module 321 may be located under the front camera module 310 (e.g., the −Z-axis direction). According to the embodiment illustrated in FIG. 14, in the second state, the front camera module 310 and the first camera module 321 may not overlap each other in the Z-axis direction. However, the illustrated embodiment is illustrative, and in the second state, the front camera module 310 may be located under the first camera module 321 (e.g., the +Z-axis direction).

In an embodiment, the plurality of rear cameras 320 may include the first camera structure 328, the second camera module 322, the third camera module 323, and the fourth camera module 324. In an embodiment, the first camera structure 328 may include the first camera module 321, the first sensor module 325, and the flash module 326.

In an embodiment, the plurality of rear cameras 320 may be arranged in the direction perpendicular to the sliding directions D1 and D2 so as not to overlap the display 170 in the first state. For example, the first camera module 321, the second camera module 322, the third camera module 323, and the fourth camera module 324 may be disposed in a row in the direction (e.g., the −Y-axis direction) from the upper end to the lower end of the electronic device 100.

In various embodiments, the first camera module 321 may have a smaller thickness than the second camera module 322, the third camera module 323, and the fourth camera module 324. For example, the first camera module 321 may have a smaller length in the Z-axis direction than the remaining rear camera modules, and as the first camera module 321 is disposed in a position overlapping the module accommodation part 166 of the second structure 160, the degree to which the plurality of rear cameras 320 protrude from the rear side of the electronic device 100 may be reduced. The arrangement structure of the plurality of rear cameras 320 will be described below in more detail with reference to FIG. 17.

In an embodiment, the plurality of rear cameras 320 may be implemented with different types of camera modules. For example, the first camera module 321 may be a time-of-flight (TOF) camera module. The first sensor module 325 disposed adjacent to the first camera module 321 may be a TOF transmitter TX for driving the TOF camera module. For example, the second camera module 322 may be an ultra wide camera module. For example, the third camera module 323 may be a wide camera module. For example, the fourth camera module 324 may be a tele camera module. However, the types of the plurality of rear cameras 320 are not limited to the above-described examples, and various types of camera modules may be applied.

Figure 15:
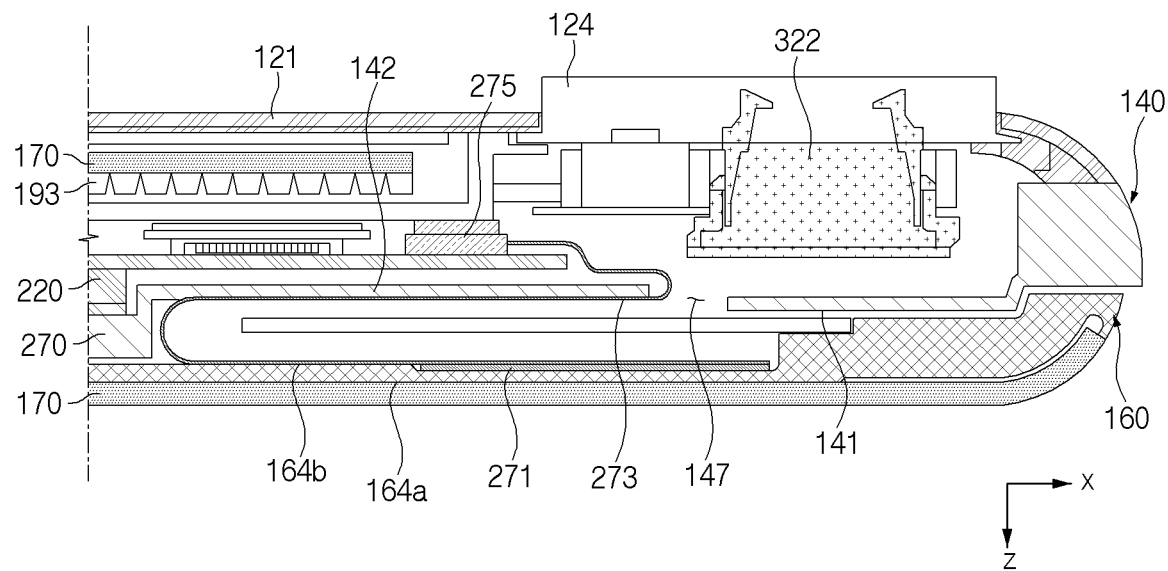
FIG. 15 is a sectional view of part of an electronic device according to an embodiment of the disclosure.
Figure 15:
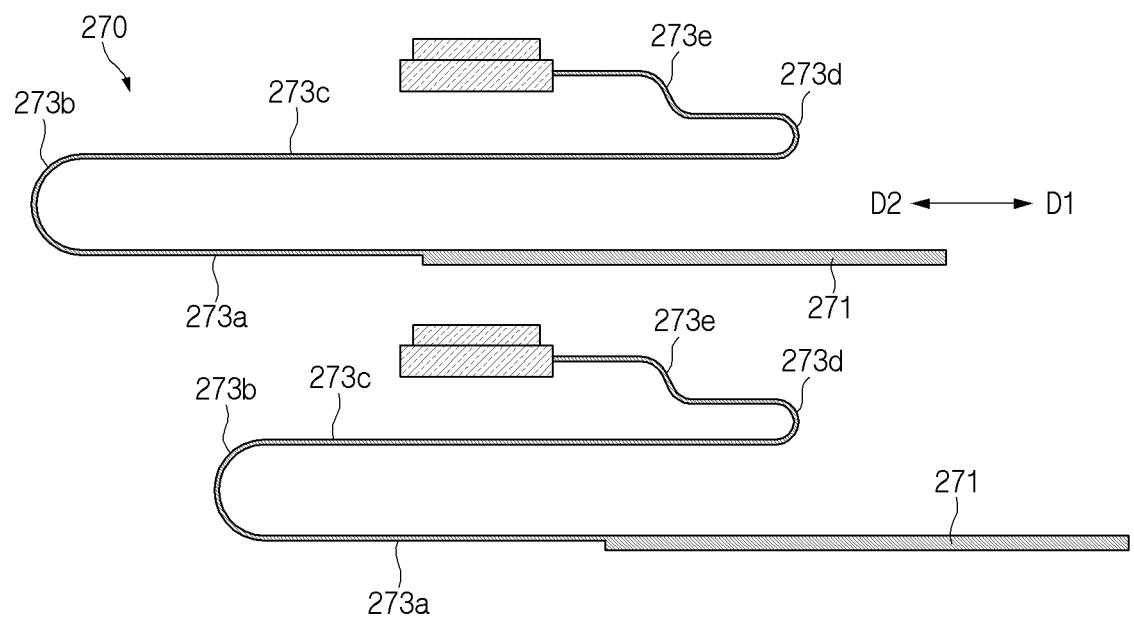

FIG. 15 is a sectional view of part of the electronic device according to an embodiment of the disclosure.

Figure 16:
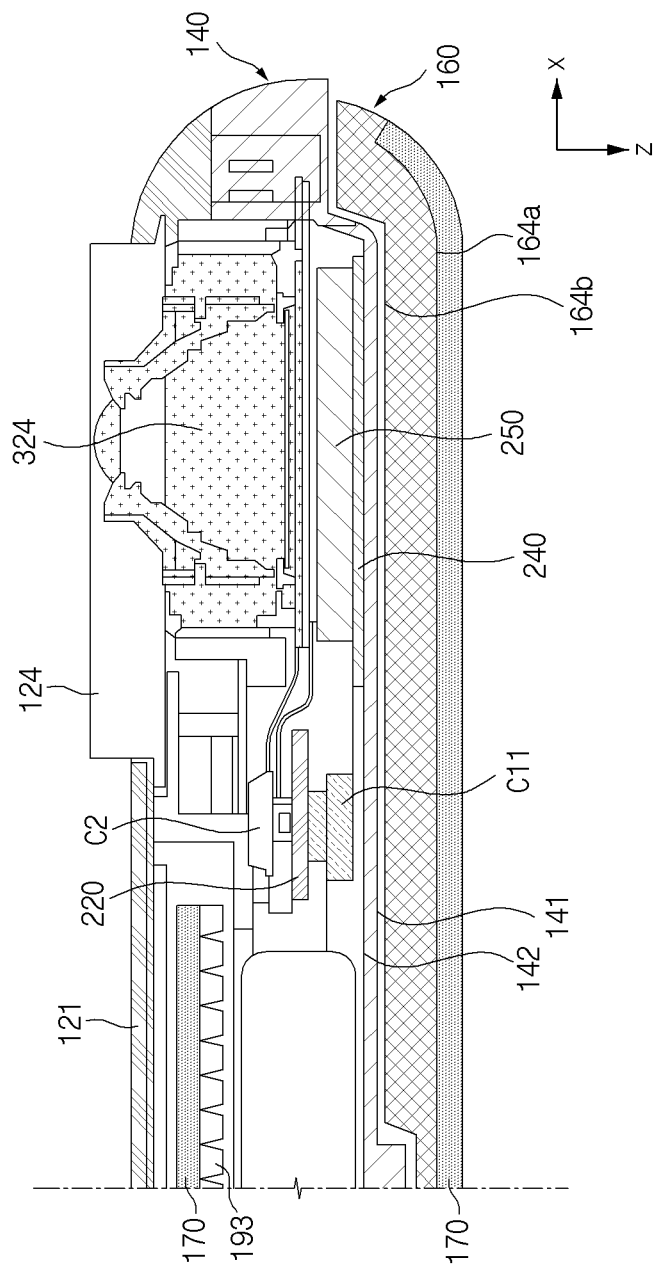
FIG. 16 is a sectional view of part of an electronic device according to an embodiment of the disclosure.

FIG. 16 is a sectional view of part of the electronic device according to an embodiment of the disclosure.

FIG. 15 is a sectional view of the electronic device taken along line S3-S3' in FIG. 13. FIG. 16 is a sectional view of the electronic device taken along line S4-S4' in FIG. 13.

Referring to FIGS. 15 and 16, the electronic device 100 according to an embodiment may include the first structure 110 (e.g., the back cover 121 and the bracket 140), the second structure 160, the display 170, the display support member 193, the battery 192, the camera decoration member 124, the slide circuit board 270, the plurality of circuit boards 210, and the plurality of rear cameras (e.g., the second camera module 322 and the fourth camera module 324).

The components of the electronic device 100 illustrated in FIGS. 15 and 16 are identical or similar to some of the components of the electronic device 100 illustrated in FIGS. 1 to 14, and repetitive descriptions will be omitted.

In an embodiment, the back cover 121 may include a through-hole (not illustrated) into which the camera decoration member 124 is inserted. For example, the camera decoration member 124 may be inserted into the through-hole of the back cover 121, and at least part of the camera decoration member 124 may be exposed on the rear side of the electronic device 100. The camera decoration member 124 may partially overlap the second camera module 322 and the fourth camera module 324. Although only the second camera module 322 and the fourth camera module 324 among the plurality of rear cameras 320 are illustrated in FIGS. 15 and 16, the camera decoration member 124 may overlap the first camera module (e.g., the first camera module 321 of FIGS. 13 and 14) and the third camera module (e.g., the third camera module 323 of FIGS. 13 and 14). The camera decoration member 124 may protrude from the back cover 121 by a specified length. In various embodiments, the length by which the camera decoration member 124 protrudes from the back cover 121 may be determined by the thicknesses (e.g., the lengths in the Z-axis direction) of the plurality of rear cameras 320 and components disposed under the plurality of rear cameras 320.

In an embodiment, the bracket 140 may be disposed between the back cover 121 and the second structure 160. The bracket 140 may include the first surface 141 facing toward the second structure 160 and the second surface 142 facing toward the back cover 121. The opening 147 vertically penetrating the first surface 141 and the second surface 142 may be formed in a partial area of the bracket 140. At least part of the slide circuit board 270 (e.g., part of the flexible circuit board portion 273) may be disposed in the opening 147.

In an embodiment, the second structure 160 may be disposed over the first surface 141 of the bracket 140 (e.g., the +Z-axis direction). The second structure 160 may include the third surface 164*a* on which the display 170 is disposed and the fourth surface 164*b* facing the first surface 141 of the bracket 140. The fixed circuit board portion 271 of the slide circuit board 270 may be fixedly disposed on the fourth surface 164*b* of the second structure 160.

In an embodiment, the plurality of circuit boards 210 may include the first circuit board 220 and the third circuit board 240. The first circuit board 220 and the third circuit board 240 may be electrically connected with each other.

In an embodiment, the first circuit board 220 may be located between the bracket 140 and the back cover 121. For example, the first circuit board 220 may be disposed on the second surface 142 of the bracket 140. The slide circuit board 270 and the third camera module 323 may be connected to the first circuit board 220. For example, a connecting portion 275 (e.g., the fifth connector C5 of FIGS. 10 to 12) of the slide circuit board 270 and the second connector C2 of the third camera module 323 may be connected to the first circuit board 220 (e.g., refer to FIGS. 9 and 13).

In an embodiment, the third circuit board 240 may be located between the bracket 140 and the fourth camera module 324. For example, the third circuit board 240 may be disposed on the second surface 142 of the bracket 140 and may be located under the fourth camera module 324 (e.g., the +Z-axis direction) (e.g., refer to FIGS. 9 and 10). In an embodiment, the connecting circuit board 250 may be connected to the third circuit board 240. At least part of the connecting circuit board 250 may be located in the space between the third circuit board 240 and the fourth camera module 324. For example, a predetermined space in which the third circuit board 240 and the connecting circuit board 250 are disposed may be provided between the fourth camera module 324 and the bracket 140.

In an embodiment, the third circuit board 240 may be electrically connected with the first circuit board 220 through the eleventh connector C11. For example, the eleventh connector C11 may extend from the third circuit board 240 and may be connected, between the first circuit board 220 and the bracket 140, to the first circuit board 220 (refer to <1402> of FIG. 14). In an embodiment, the third circuit board 240 may be closer to the second surface 142 of the bracket 140 than the first circuit board 220. For example, the first circuit board 220 may be located in a higher position with respect to the bracket 140 than the third circuit board 240.

In an embodiment, the slide circuit board 270 may include the fixed circuit board portion 271, the flexible circuit board portion 273, and the connecting portion 275 (e.g., the fifth connector C5). The connecting portion 275 may make contact with the first circuit board 220, and accordingly the slide circuit board 270 may be electrically connected with the first circuit board 220. In various embodiments, the slide circuit board 270 may be configured such that at least some of the fixed circuit board portion 271, the flexible circuit board portion 273, and the connecting portion 275 are integrally formed.

The structure of the slide circuit board 270 illustrated in FIG. 15 is illustrative, and the slide circuit board 270 is not limited thereto. In various embodiments, the slide circuit board 270 may not include the connecting portion 275. For example, the slide circuit board 270 may be configured such that the flexible circuit board portion 273 directly extends from, or is directly connected with, the first circuit board 220. According to various embodiments, the slide circuit board 270 may be integrally formed with part of the first circuit board 220.

In an embodiment, the fixed circuit board portion 271 may be disposed on the fourth surface 164*b* of the second structure 160. For example, the fixed circuit board portion 271 may be attached to a partial area of the fourth surface 164*b* and thus may be fixed to the second structure 160 to move together with the second structure 160.

In an embodiment, the flexible circuit board portion 273 may extend from the fixed circuit board portion 271 toward the first circuit board 220. For example, the flexible circuit board portion 273 may flexibly extend from the fixed circuit board portion 271. The flexible circuit board portion 273 may pass through part of the bracket 140 in the up/down direction or the thickness direction (e.g., the Z-axis direction) and may connect the fixed circuit board portion 271 and the first circuit board 220 facing each other with the bracket 140 therebetween. For example, the flexible circuit board portion 273 may extend from the fixed circuit board portion 271 through the opening 147 of the bracket 140 to the connecting portion 275 connected to the first circuit board 220 (e.g., refer to FIG. 11).

In an embodiment, the connecting portion 275 may include a connector (e.g., the fifth connector C5). However, the structure of the connecting portion 275 is not limited to the illustrated embodiment. In various embodiments, the connecting portion 275 may be formed on a partial area of the flexible circuit board portion 273, or may be provided in the form of a conductive pad (or, a conductive area) extending from the flexible circuit board portion 273.

In an embodiment, the connecting portion 275 may be fixed to the first circuit board 220, and the fixed circuit board portion 271 may be fixed to the second structure 160. For example, the slide circuit board 270 may be configured such that the fixed circuit board portion 271 moves in the sliding directions D1 and D2 with respect to the relatively fixed connecting portion 275 when the second structure 160 moves in the sliding directions D1 and D2 relative to the bracket 140. The flexible circuit board portion 273 may be deformed in response to a movement of the fixed circuit board portion 271 in the state in which opposite end portions of the flexible circuit board portion 273 are connected to the fixed circuit board portion 271 and the connecting portion 275.

In an embodiment, at least part of the flexible circuit board portion 273 may move together with the fixed circuit board portion 271 in the direction parallel to the sliding directions D1 and D2. For example, the flexible circuit board portion 273 may be formed in a bent shape in which one partial area and another partial area face each other in the direction perpendicular to the sliding directions D1 and D2. For example, at least part of the flexible circuit board portion 273 may be bent one or more times in the sliding directions D1 and D2.

In an embodiment, the flexible circuit board portion 273 may include one or more bending portions 273b and 273d. For example, the flexible circuit board portion 273 may include a first extending portion 273a extending from the fixed circuit board portion 271 in the second direction D2, the first bending portion 273b bent from the first extending portion 273a in the first direction D1, a second extending portion 273c extending from the first bending portion 273b in the first direction D1, the second bending portion 273d bent from the second extending portion 273c in the second direction D2, and a third extending portion 273e extending from the second bending portion 273d in the second direction. In various embodiments, the flexible circuit board portion 273 may be bent to have a substantially S-shape. In various embodiments, the bending portions 273b and 273d may be formed in a substantially U-shape.

In an embodiment, the flexible circuit board portion 273 may be configured to be deformed as the fixed circuit board portion 271 moves. As illustrated in FIG. 15, the lengths of the first extending portion 273a and the second extending portion 273c that extend from opposite end portions of the first bending portion 273b may be increased or decreased as the fixed circuit board portion 271 moves in the first direction D1 or the second direction D2.

For example, when the fixed circuit board portion 271 moves in the first direction D1, the slide circuit board 270 may be deformed in a form in which the length of the first extending portion 273a is increased and the length of the second extending portion 273c is decreased. In contrast, when the fixed circuit board portion 271 moves in the second direction D2, the slide circuit board 270 may be deformed in a form in which the length of the first extending portion 273a is decreased and the length of the second extending portion 273c is increased. However, the shape and motion of the flexible circuit board portion 273 are not limited to the above-described example. According to various embodiments, the flexible circuit board portion 273 may be implemented in various shapes and/or structures capable of connecting the fixed circuit board portion 271 and the first circuit board 220 such that the fixed circuit board portion 271 and the first circuit board 220 are movable relative to each other.

Figure 17:
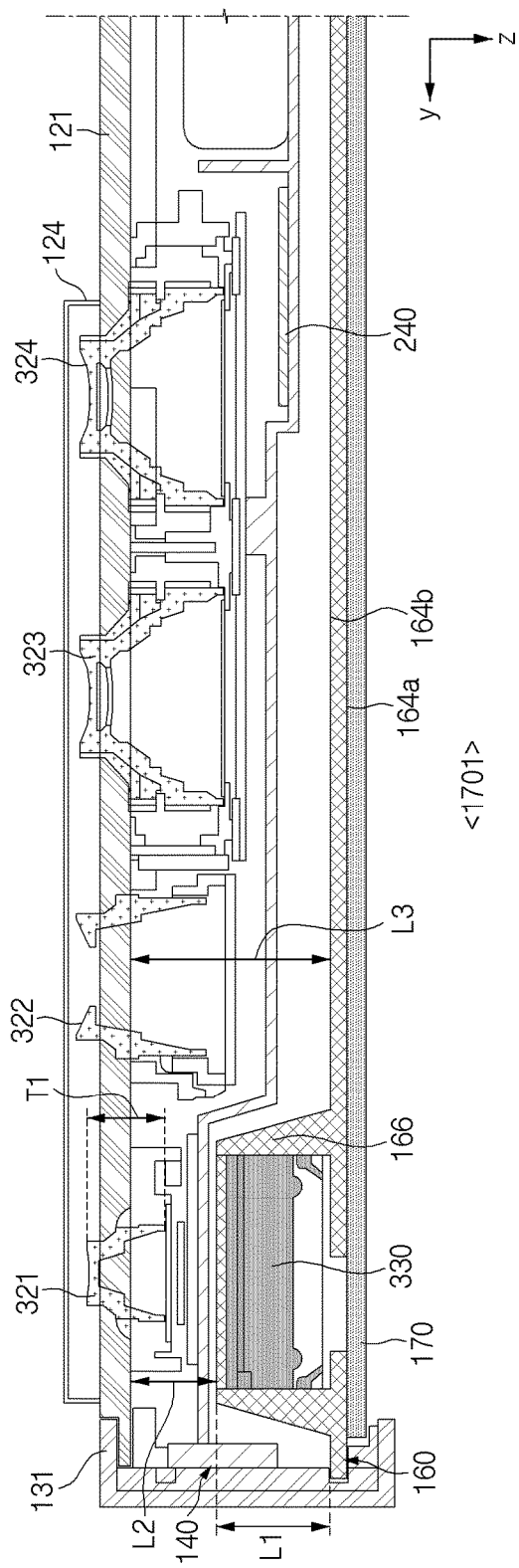
FIG. 17 is a sectional view of part of an electronic device according to an embodiment of the disclosure.
Figure 17:
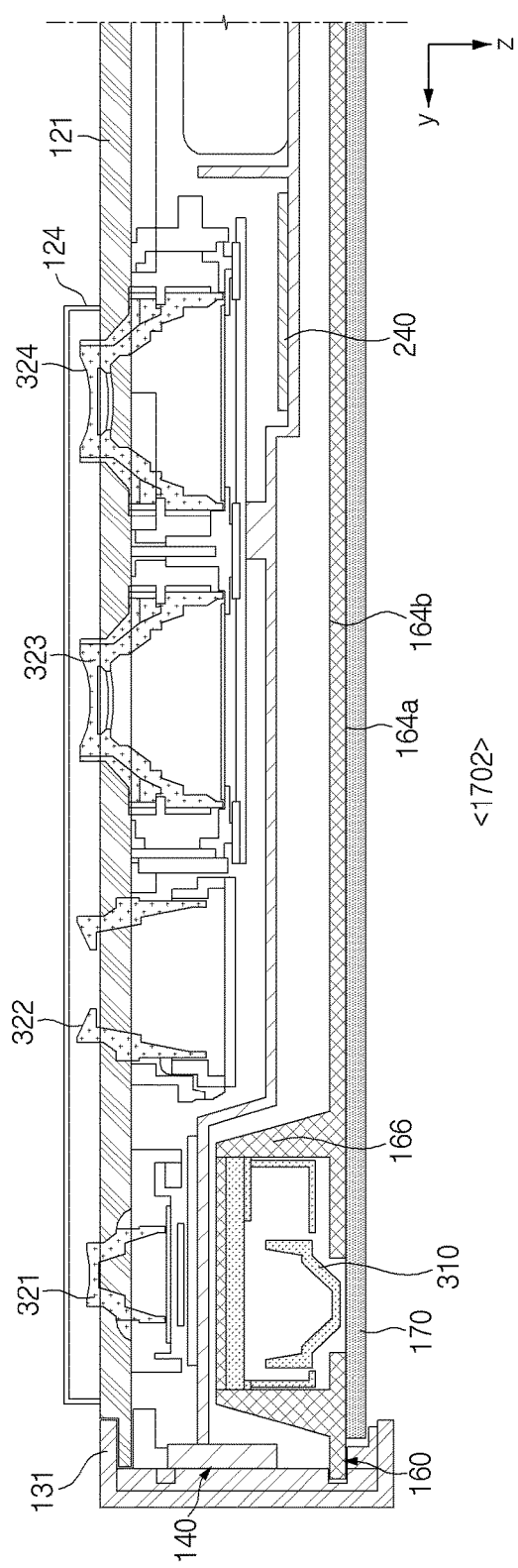

FIG. 17 is a sectional view of part of the electronic device according to an embodiment of the disclosure.

<1701> of FIG. 17 is a sectional view of the electronic device taken along line S5-S5' in FIG. 13. <1702> of FIG. 17 is a sectional view of the electronic device taken along line S6-S6' in FIG. 14.

Referring to FIG. 17, the electronic device 100 according to an embodiment may be configured such that a camera module (e.g., the first camera module 321) having a relatively small thickness among the plurality of rear cameras 320 is disposed in a position overlapping the module accommodation part 166 of the second structure 160.

In an embodiment, the plurality of rear cameras 320 may include the first camera module 321, the second camera module 322, the third camera module 323, and the fourth camera module 324. The first camera module 321, the second camera module 322, the third camera module 323, and the fourth camera module 324 may be disposed in a row along the direction perpendicular to the sliding directions D1 and D2.

In an embodiment, the plurality of rear cameras 320 may be configured such that the first camera module 321 has a smaller thickness than the second camera module 322, the third camera module 323, and the fourth camera module 324. For example, the first camera module 321 may have a first thickness T1, and the second camera module 322 to the fourth camera module 324 may have a thickness greater than the first thickness T1.

In an embodiment, the first camera module 321 may be located adjacent to the upper end (e.g., the first side member 131) of the electronic device 100 and may overlap the module accommodation part 166, which is formed on the second structure 160, in the thickness direction (e.g., the Z-axis direction). For example, as illustrated in FIG. 17, the first camera module 321 may be located over the module accommodation part 166 (e.g., the −Z-axis direction) when the section of the electronic device 100 is viewed.

In an embodiment, the first camera module 321 may be located to overlap the front camera module 310 or the first speaker module 330, which is disposed in the module accommodation part 166, to correspond to a state of the electronic device 100. For example, the first camera module 321 may overlap the first speaker module 330 in the first state (e.g., the state of FIG. 13) in which the second structure 160 slides inward with respect to the bracket 140 (or, the first structure 110). The first camera module 321 may overlap the front camera module 310 in the second state (e.g., the state of FIG. 14) in which the second structure 160 slides outward with respect to the bracket 140.

In an embodiment, the second structure 160 may include the third surface 164a on which the display 170 is disposed and the fourth surface 164b facing away from the third surface 164a. The module accommodation part 166, in which the front camera module 310 and the first speaker module 330 are accommodated, may be formed on the fourth surface 164b of the second structure 160. For example, the module accommodation part 166 may have an empty space formed therein in which the front camera module 310 and the first speaker module 330 are accommodated. Although not illustrated in FIG. 17, the second sensor module (e.g., the second sensor module 340 of FIGS. 13 and 14) may be accommodated together in the module accommodation part 166.

In an embodiment, the module accommodation part 166 may protrude or extend from the fourth surface 164b of the second structure 160 toward the bracket 140 by a specified length L1. For example, the protruding length L1 of the module accommodation part 166 may be determined in consideration of the thickness of the front camera module 310 and the thickness of the first speaker module 330. As the module accommodation part 166 protrudes toward the bracket 140, the separation distance L2 between the module accommodation part 166 and the back cover 121 may be smaller than the separation distance L3 between the fourth surface 164b of the second structure 160 and the back cover 121.

In an embodiment, the module accommodation part 166 may extend along the sliding directions D1 and D2 of the second structure 160 (e.g., refer to the module accommodation part 166 of FIG. 14). For example, the module accommodation part 166 may be formed to overlap the first camera module 321 when the electronic device 100 is in the first state, the second state, or a state between the first state and the second state.

In an embodiment, when the second structure 160 slides, the module accommodation part 166 may move while maintaining a state of overlapping the first camera module 321. As illustrated in <1701> of FIG. 17, when the electronic device 100 is in the first state, the first camera module 321 may overlap the first speaker module 330, which is accommodated in the module accommodation part 166, in the Z-axis direction. As illustrated in <1702> of FIG. 17, when the electronic device 100 is in the second state, the first camera module 321 may overlap the front camera module 310, which is accommodated in the module accommodation part 166, in the Z-axis direction.

In an embodiment, the degree to which the camera decoration member 124 protrudes from the back cover 121 may be determined by the protruding length L1 of the module accommodation part 166 and the thickness T1 of the plurality of rear cameras 320. For example, the degree to which the camera decoration member 124 protrudes from the back cover 121 may be increased as the thickness of the plurality of rear cameras 320 overlapping the module accommodation part 166 is increased.

Considering that the separation distance L2 between the module accommodation part 166 and the back cover 121 is smaller than the separation distance L3 between the second surface 142 of the second structure 160 and the back cover 121, the electronic device 100 according to an embodiment may be configured such that the first camera module 321 is disposed in a position overlapping the module accommodation part 166. For example, the degree to which the plurality of rear cameras 320 (or, the camera decoration member 124) protrude from the rear side of the electronic device 100 may be reduced by locating the first camera module 321, which has a relatively small thickness among the plurality of rear cameras 320, over the module accommodation part 166 (e.g., the −Z-axis direction).

As the first camera module 321 and the module accommodation part 166 overlap each other, a predetermined space may be formed between the remaining rear cameras 320 and the fourth surface 164b of the second structure 160 in the electronic device 100 according to an embodiment. For example, the thickness of the second camera module 322 to the fourth camera module 324 may be smaller than the sum of the first thickness T1 of the first camera module 321 and the protruding length L1 of the module accommodation part 166, and an empty space may be formed under the second camera module 322 to the fourth camera module 324. In various embodiments, as the empty space is formed, the third circuit board 240 may be disposed under the fourth camera module 324 (e.g., refer to FIG. 16).

Figure 18:
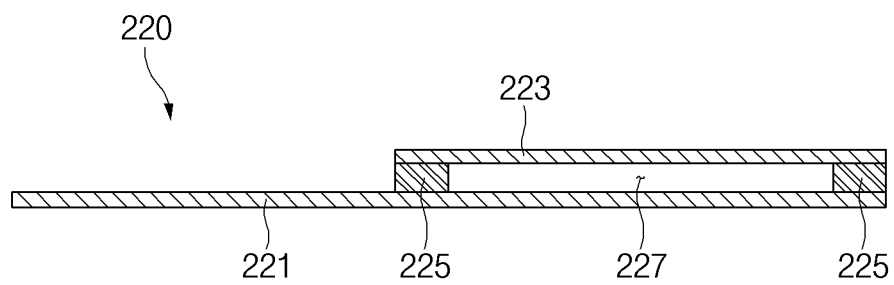
FIG. 18 is a sectional view of a first circuit board of an electronic device according to an embodiment of the disclosure.

FIG. 18 is a sectional view of the first circuit board of the electronic device according to an embodiment of the disclosure.

FIG. 18 is a sectional view of the first circuit board taken along line S7-S7' in FIG. 14.

Referring to FIG. 18, the first circuit board 220 of the electronic device 100 according to an embodiment may be formed in a stacked circuit board structure.

In an embodiment, the first circuit board 220 may include the first circuit board layer 221, the second circuit board layer 223, and a connecting portion 225 (e.g., an interposer) disposed between the first circuit board layer 221 and the second circuit board layer 223. In various embodiments, the connecting portion 225 may be implemented with a ring member having a polygonal shape.

In an embodiment, the first circuit board layer 221 and the second circuit board layer 223 may be formed of a printed circuit board (PCB). Each of the first circuit board layer 221 and the second circuit board 230 may include at least one of one or more electric elements, wiring electrically connected with the electric elements, a ground, or a conductive pattern.

In an embodiment, the first circuit board layer 221 and the second circuit board layer 223 may have different sizes and/or shapes. As illustrated in FIG. 18, the first circuit board layer 221 may be formed to be larger than the second circuit board layer 223. However, the sizes or shapes of the first circuit board layer 221 and the second circuit board layer 223 are not limited to the illustrated embodiment, and the first circuit board layer 221 and the second circuit board layer 223 may be formed in various sizes or shapes.

In an embodiment, the connecting portion 225 may connect the first circuit board layer 221 and the second circuit board layer 223. The connecting portion 225 may be disposed between the first circuit board layer 221 and the second circuit board layer 223 such that a shielded space 227 is formed between the first circuit board layer 221 and the second circuit board layer 223. In various embodiments, various electric elements and/or electronic components may be disposed in the shielded space 227. According to an embodiment, a mounting rate of the first circuit board 220 may be improved as some electric elements or electronic components are disposed in the shielded space 227.

In various embodiments, the connecting portion 225 may include a plurality of vias (not illustrated) that electrically connect a conductive area of the first circuit board layer 221 and a conductive area of the second circuit board layer 223. For example, the plurality of vias (not illustrated) may pass through partial areas of the connecting portion 225 in a direction perpendicular to the circuit board layers 221 and 223.

Figure 19:
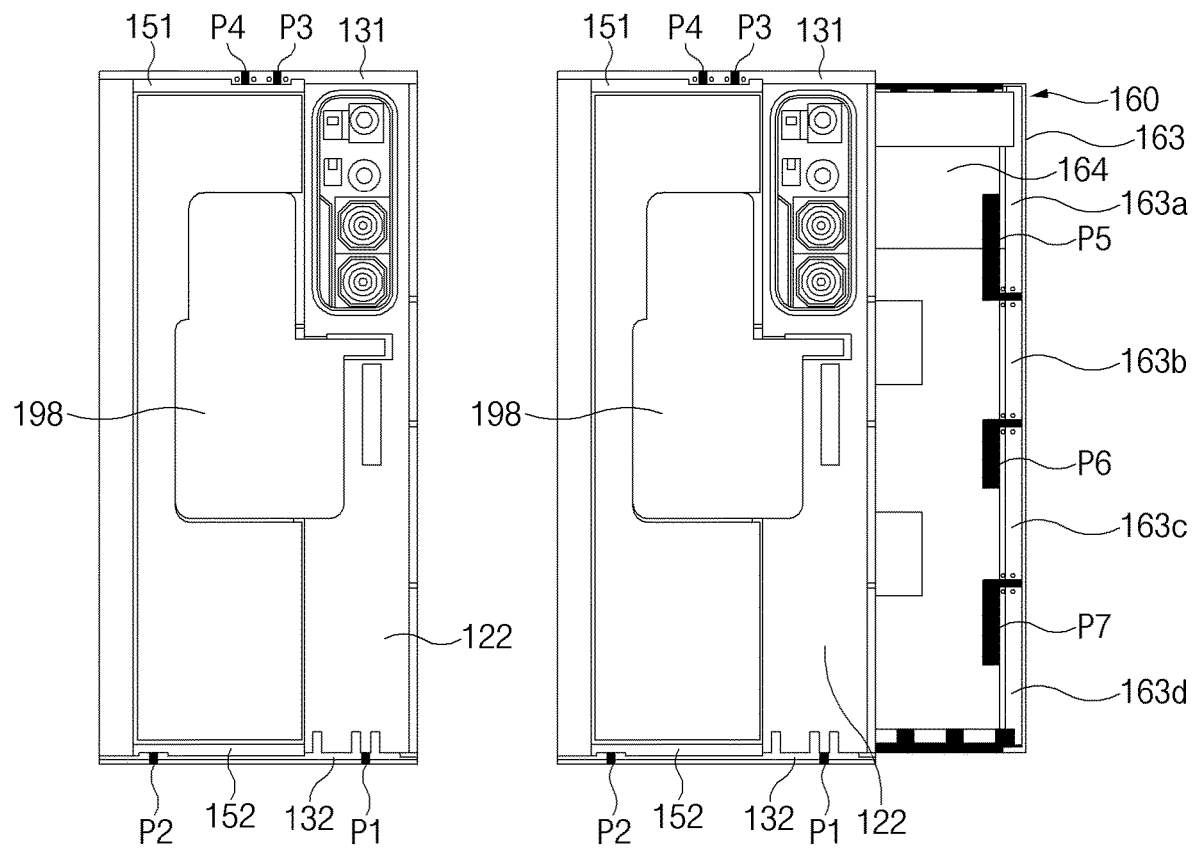
FIG. 19 illustrates a first state and a second state of an electronic device according to an embodiment of the disclosure.

FIG. 19 illustrates the first state and the second state of the electronic device according to an embodiment of the disclosure.

FIG. 19 is a plan view illustrating the rear side of the electronic device 100 when the electronic device 100 is in the first state and the second state. FIG. 19 may be a view in which the back cover 121 is omitted.

Referring to FIG. 19, the electronic device 100 according to an embodiment may include the rear case (e.g., the rear case 122 of FIG. 3), the side members 131 and 132, the guide members 152, and an antenna module 198.

In an embodiment, the antenna module 198 may be disposed to face the back cover 121. For example, in the drawing, the back cover 121 may be disposed over the antenna module 198. In various embodiments, the antenna module 198 may be configured to function as a rear antenna of the electronic device 100. For example, at least part of the antenna module 198 may be surrounded by the rear case 122. Although not illustrated in FIG. 19, the antenna module 198 may be disposed between the back cover 121 and the battery (e.g., the battery 192 of FIG. 3) (e.g., refer to FIG. 3).

In an embodiment, the antenna module 198 may include a near field communication (NFC) antenna, a wireless power consortium (WPC) antenna, a magnetic secure transmission (MST) antenna, and/or an ultra wide band (UWB) antenna. For example, the antenna module 198 may perform short-range communication with an external device, or may wirelessly transmit and receive electric power required for charging.

In the electronic device 100 according to an embodiment, an antenna structure may be formed by part of the second structure 160, a part of the side members 131 and 132, or a combination thereof.

In an embodiment, at least part of the second structure 160 may be configured to function as a side (e.g., an X-axis direction side) antenna of the electronic device 100.

In an embodiment, at least part of the second structure 160 may include a conductive portion. For example, the second structure 160 may include the plate portion 164 and the peripheral portion 163 (e.g., the third peripheral portion 163), and the plate portion 164 and at least part of the peripheral portion 163 (e.g., the third peripheral portion 163) may be formed of a material (e.g., metal) having conductivity.

In an embodiment, the peripheral portion 163 of the second structure 160 may include a first conductive portion 163a, a second conductive portion 163b, a third conductive portion 163c, and a fourth conductive portion 163d. The conductive portions 163a, 163b, 163c, and 163d may be formed of metal. At least a part of the conductive portions 163a, 163b, 163c, and 163d may operate as an antenna radiator. For example, the conductive portions 163a, 163b, 163c, and 163d may be electrically connected with wireless communication circuitry (e.g., a wireless communication module 592 of FIG. 24) disposed on a plurality of circuit boards (e.g., the plurality of circuit boards 210 of FIG. 3) of the electronic device 100 and may receive electric power from the wireless communication circuitry. Accordingly, the conductive portions 163a, 163b, 163c, and 163d may operate as an antenna radiator for transmitting and receiving wireless signals in a specified band.

In an embodiment, the second structure 160 may include a plurality of cut-off portions P5, P6, and P7 partially insulating the conductive portions 163a, 163b, 163c, and 163d. The conductive portions may be physically and/or electrically separated by the plurality of cut-off portions P5, P6, and P7. For example, the conductive portions 163a, 163b, 163c, and 163d may be spaced apart from each other at specified intervals, and the plurality of cut-off portions P5, P6, and P7 may be formed by filling the spaces between the conductive portions 163a, 163b, 163c, and 163d with a non-conductive material or locating a conductive member having a specified permittivity between the conductive portions 163a, 163b, 163c, and 163d.

In an embodiment, the plurality of cut-off portions P5, P6, and P7 may include the fifth cut-off portion P5 disposed between the first conductive portion 163a and the second conductive portion 163b, the sixth cut-off portion P6 disposed between the second conductive portion 163b and the third conductive portion 163c, and the seventh cut-off portion P7 disposed between the third conductive portion 163c and the fourth conductive portion 163d. The conductive portions 163a, 163b, 163c, and 163d separated by the cut-off portions P5, P6, and P7 may be used to transmit and receive signals in target frequency bands. For example, at least a part of the first conductive portion 163a to the fourth conductive portion 163d may be electrically connected with a wireless communication module to form an antenna structure. For example, at least a part of the first conductive portion 163a to the fourth conductive portion 163d may be used as an antenna radiator or an antenna ground. In various embodiments, the positions of the cut-off portions P5, P6, and P7 may be changed to correspond to the target frequency bands.

In an embodiment, at least a part of the side members 131 and 132 may be configured to function as a side (e.g., a Y-axis direction side) antenna of the electronic device 100.

In an embodiment, the side members 131 and 132 may include the first side member 131 and the second side member 132, and at least parts of the first side member 131 and the second side member 132 may include conductive portions. For example, the conductive portions of the first side member 131 and the second side member 132 may be formed of a metallic material.

In an embodiment, a method of using the side members 131 and 132 as antenna radiators may be substantially the same as the method of using the second structure 160 as an antenna radiator as described above. For example, the conductive portions of the side members 131 and 132 may be electrically connected with wireless communication circuitry (e.g., the wireless communication module 592 of FIG. 24) of the electronic device 100 and may receive electric power from the wireless communication circuitry. Accordingly, the conductive portions of the side members 131 and 132 may operate as antenna radiators for transmitting and receiving wireless signals in specified bands.

In an embodiment, the first side member 131 and the second side member 132 may include cut-off portions P1, P2, P3, and P4 insulating the conductive portions. For example, the second side member 132 may include the first cut-off portion P1 and the second cut-off portion P2. The second side member 132 may be configured such that some of the conductive portions separated by the first cut-off portion P1 and the second cut-off portion P2 operate as an antenna radiator or an antenna ground. For example, the first side member 131 may include the third cut-off portion P3 and the fourth cut-off portion P4. The first side member 131 may be configured such that some of the conductive portions separated by the third cut-off portion P3 and the fourth cut-off portion P4 operate as an antenna radiator or an antenna ground.

In an embodiment, the side members 131 and 132 may be disposed to face at least parts of the guide members 151 and 152. Although not illustrated, the side members 131 and 132 may be coupled to edge portions (e.g., the edge portions 143 and 144 of FIG. 3) of the bracket 140 with the guide members 151 and 152 therebetween. The side members 131 and 132 may include connecting structures for electrical connections with the plurality of circuit boards 210 without interference by the guide members 151 and 152. The electrical connection structures of the side members 131 and 132 and the plurality of circuit boards 210 will be described below in more detail with reference to FIGS. 20 to 23.

Figure 20:
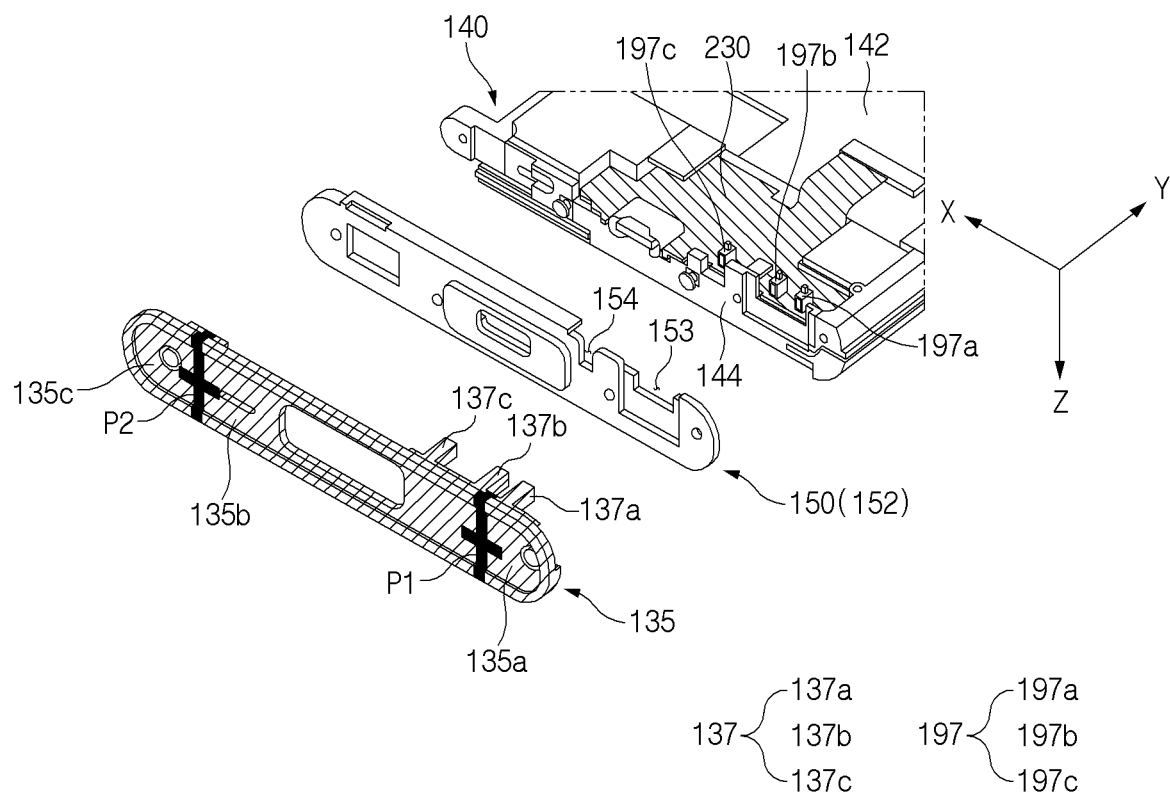
FIG. 20 illustrates an electrical connection structure of a second side member and a plurality of circuit boards of an electronic device according to an embodiment of the disclosure.

FIG. 20 illustrates an electrical connection structure of the second side member and the plurality of circuit boards of the electronic device according to an embodiment of the disclosure.

Figure 21:
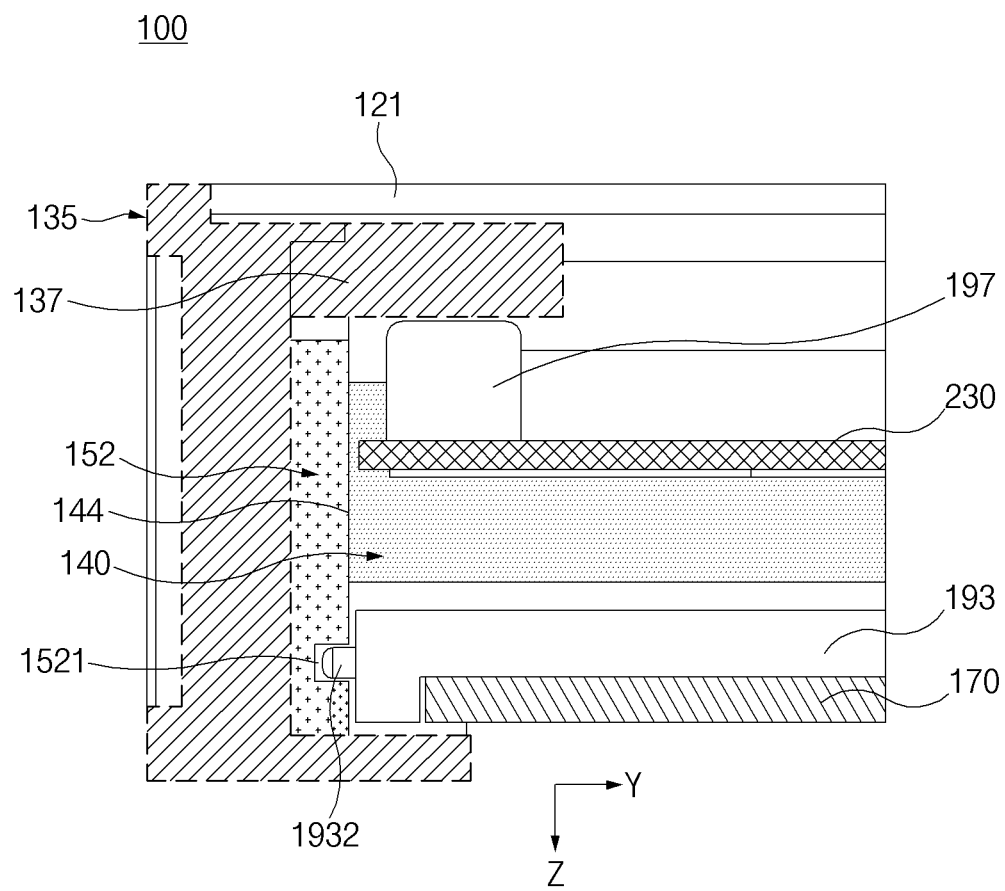
FIG. 21 illustrates an electrical connection structure of a second side member and a plurality of circuit boards of an electronic device according to an embodiment of the disclosure.

FIG. 21 illustrates the electrical connection structure of the second side member and the plurality of circuit boards of the electronic device according to an embodiment of the disclosure.

FIGS. 20 and 21 may be views in which the second decoration member (e.g., the second decoration member 136 of FIG. 3) of the second side member (e.g., the second side member 132 of FIG. 3) is omitted.

Referring to FIGS. 20 and 21, the electronic device 100 according to an embodiment may include a connecting structure by which the second side cover 135 is electrically connected with a part (e.g., the second circuit board 230) of the plurality of circuit boards (e.g., the plurality of circuit boards 210 of FIG. 3).

In an embodiment, the electronic device 100 may include the bracket 140, the second side cover 135, the second guide member 152, and the second circuit board 230.

In an embodiment, the second circuit board 230 of the plurality of circuit boards 210 may be disposed on the bracket 140. For example, the second circuit board 230 may be disposed on a partial area of the second surface 142 of the bracket 140. The second circuit board 230 may be disposed adjacent to the second edge portion 144 (e.g., the second edge portion 144 of FIG. 3) of the bracket 140 so as to be located in the lower end of the electronic device 100 (e.g., the −Y-axis direction).

In an embodiment, the bracket 140 may be coupled with the second guide member 152 and the second side cover 135. For example, the second guide member 152 and the second side cover 135 may be coupled to the second edge portion 144 of the bracket 140. In various embodiments, the bracket 140 may be coupled with the second guide member 152 and the second side cover 135 through screw coupling, and a coupling hole (not illustrated) for the screw coupling may be formed in the second edge portion 144 of the bracket 140. However, a coupling method is not limited to the above-described example.

In an embodiment, the second side cover 135 and the second guide member 152 may be fixedly coupled to the bracket 140. For example, the second side cover 135 may be disposed to face the second edge portion 144 with the second guide member 152 therebetween.

According to an embodiment, the second side cover 135 may be configured such that at least part of the second side cover 135 passes through the second guide member 152 and makes electrical contact with the second circuit board 230.

In an embodiment, the second side cover 135 may include conductive portions 135a, 135b, and 135c in at least a portion thereof. For example, the second side cover 135 may include the first conductive portion 135a, the second conductive portion 135b, and the third conductive portion 135c. The conductive portions 135a, 135b, and 135c may be formed of metal. The second side cover 135 may be configured such that at least a part of the conductive portions 135a, 135b, and 135c operates as an antenna radiator. In various embodiments, a part of the first conductive portion 135a, the second conductive portion 135b, and the third conductive portion 135c may operate as an antenna radiator that receives electric power from wireless communication circuitry (e.g., the wireless communication module 592 of FIG. 24) and transmits and receives wireless signals in a specified band.

In an embodiment, the second side cover 135 may include the cut-off portions P1 and P2 insulating the conductive portions 135a, 135b, and 135c. For example, the cut-off portions P1 and P2 may include the first cut-off portion P1 insulating the first conductive portion 135a and the second conductive portion 135b and the second cut-off portion P2 insulating the second conductive portion 135b and the third conductive portion 135c.

In an embodiment, the second side cover 135 may include protruding portions 137 extending from partial areas of the second side cover 135 toward the second guide member 152 or the bracket 140. For example, the protruding portions 137 may extend toward the second edge portion 144 of the bracket 140 to pass through partial areas of the second guide member 152. The protruding portions 137 may make electrical connection or contact with the second circuit board 230 such that a part of the conductive portions 135a, 135b, and 135c of the second side cover 135 operates as an antenna radiator. For example, the protruding portions 137 may extend from at least a part of the conductive portions 135a, 135b, and 135c to have conductivity.

In an embodiment, the protruding portions 137 may include a first protruding portion 137a extending from the first conductive portion 135a, and a second protruding portion 137b and a third protruding portion 137c that extend from the second conductive portion 135b. For example, the first protruding portion 137a may extend from one surface (e.g., a surface facing the +Y-axis direction) of the first conductive portion 135a toward the second edge portion 144 of the bracket 140. For example, the second protruding portion 137b and the third protruding portion 137c may extend from one surface (e.g., a surface facing the +Y-axis direction) of the second conductive portion 135b toward the second edge portion 144 of the bracket 140. The second protruding portion 137b and the third protruding portion 137c may be spaced apart from each other at a predetermined interval.

In an embodiment, the second guide member 152 may include recesses 153 and 154 in which at least parts of the protruding portions 137 are disposed such that the protruding portions 137 make contact with the second circuit board 230. For example, the recesses 153 and 154 may include the first recess 153 corresponding to the first protruding portion 137a and the second protruding portion 137b and the second recess 154 corresponding to the third protruding portion 137c. The first recess 153 may be aligned with the first protruding portion 137a and the second protruding portion 137b in the Y-axis direction. The second recess 154 may be aligned with the third protruding portion 137c in the Y-axis direction.

In an embodiment, the second guide member 152 may guide sliding of the display 170 or the display support member 193, and the guide groove 1521 may be formed in the second guide member 152. For example, the guide groove 1521 may be formed in one surface (e.g., a surface facing the Y-axis direction) of the second guide member 152 that faces the second edge portion 144 of the bracket 140. At least part of the display support member 193 may be inserted into the guide groove 1521. For example, a guide protrusion 1932 inserted into the guide groove 1521 may be formed on an end portion of the display support member 193. The display support member 193 may be configured to move along the track of the guide groove 1521 in the state in which the guide protrusion 1932 is inserted into the guide groove 1521.

According to an embodiment, as the second guide member 152 includes the recesses 153 and 154, the conductive portions 135*a*, 135*b*, and 135*c* of the second side cover 135 may be stably electrically connected with the second circuit board 230 without interference.

In an embodiment, the contact members 197 with which the protruding portions 137 make connection or contact may be disposed on the second circuit board 230. For example, the contact members 197 may include a first contact member 197*a* to which the first protruding portion 137*a* is connected, a second contact member 197*b* to which the second protruding portion 137*b* is connected, and a third contact member 197*c* to which the third protruding portion 137*c* is connected. In various embodiments, the contact members 197 may include a C-clip and/or a pogo pin. The contact members 197 may be surface mounted on one area of the second circuit board 230.

In an embodiment, the protruding portions 137 may be electrically connected with the second circuit board 230 by making contact with the contact members 197.

For example, the first protruding portion 137*a* may pass through the first recess 153 and may make contact with the first contact member 197*a*. The first conductive portion 135*a* may be electrically connected with the second circuit board 230 by the contact of the first protruding portion 137*a* and the first contact member 197*a*.

For example, the second protruding portion 137*b* may pass through the first recess 153 and may make contact with the second contact member 197*b*. The third protruding portion 137*c* may pass through the second recess 154 and may make contact with the third contact member 197*c*. The second conductive portion 135*b* may be electrically connected with the second circuit board 230 by the contact of the second protruding portion 137*b* and the second contact member 197*b* and/or the contact of the third protruding portion 137*c* and the third contact member 197*c*.

Figure 22:
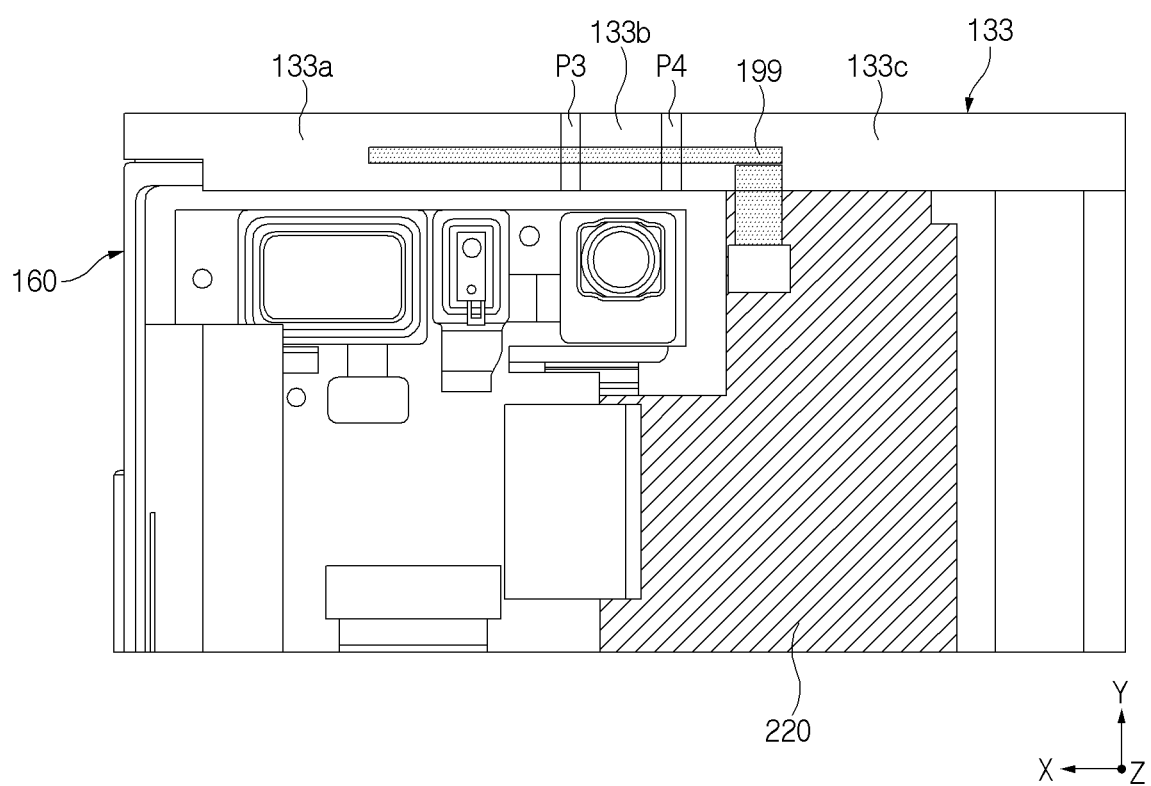
FIG. 22 illustrates an electrical connection structure of a first side member and a plurality of circuit boards of an electronic device according to an embodiment of the disclosure.

FIG. 22 illustrates an electrical connection structure of the first side member and the plurality of circuit boards of the electronic device according to an embodiment of the disclosure.

Figure 23:
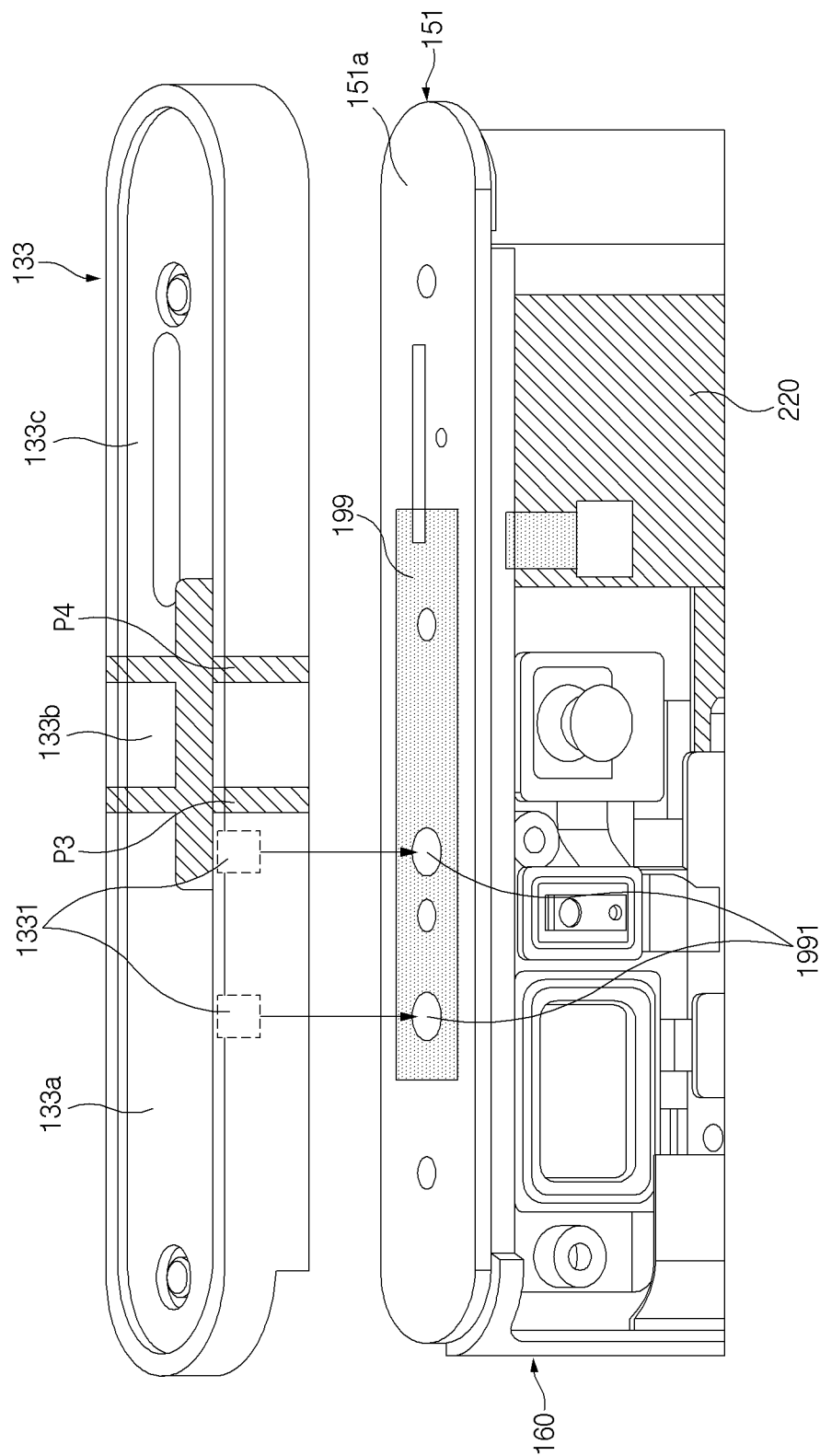
FIG. 23 illustrates an electrical connection structure of a first side member and a plurality of circuit boards of an electronic device according to an embodiment of the disclosure.

FIG. 23 illustrates the electrical connection structure of the first side member and the plurality of circuit boards of the electronic device according to an embodiment of the disclosure.

FIGS. 22 and 23 may be views in which the first decoration member (e.g., the first decoration member 134 of FIG. 3) of the first side member (e.g., the first side member 131 of FIG. 3) is omitted.

Referring to FIGS. 22 and 23, the electronic device 100 according to an embodiment may include a connecting structure by which the first side cover 133 is electrically connected with a part (e.g., the first circuit board 220) of the plurality of circuit boards (e.g., the plurality of circuit boards 210 of FIG. 3).

In an embodiment, the electronic device 100 may include the second structure 160, the first side cover 133, the first guide member 151, and the first circuit board 220.

In an embodiment, the first side cover 133 and the first guide member 151 may be fixedly coupled to the bracket (e.g., the bracket 140 of FIG. 3). Although the bracket 140 is not illustrated in FIGS. 22 and 23, the first side cover 133 and the first guide member 151 may be coupled to the first edge portion (e.g., the first edge portion 143 of FIG. 3) of the bracket (e.g., the bracket 140 of FIG. 3) (e.g., refer to FIG. 10). For example, the second side cover 135 may be disposed to face the second edge portion 144 with the second guide member 152 therebetween. The first circuit board 220 may be disposed on the second surface 142 of the bracket 140.

According to an embodiment, the first side cover 133 may be configured to be electrically connected with the first circuit board 220 through a connecting member 199 disposed between the first side cover 133 and the first guide member 151.

In an embodiment, the first side cover 133 may include conductive portions 133*a*, 133*b*, and 133*c* in at least a portion thereof. For example, the first side cover 133 may include the fourth conductive portion 133*a*, the fifth conductive portion 133*b*, and the sixth conductive portion 133*c*. The conductive portions 133*a*, 133*b*, and 133*c* may be formed of metal. The first side cover 133 may be configured such that at least a part of the conductive portions 133*a*, 133*b*, and 133*c* operates as an antenna radiator. In various embodiments, a part of the fourth conductive portion 133*a*, the fifth conductive portion 133*b*, and the sixth conductive portion 133*c* may operate as an antenna radiator that receives electric power from wireless communication circuitry (e.g., the wireless communication module 592 of FIG. 24) and transmits and receives wireless signals in a specified band.

In an embodiment, the first side cover 133 may include the cut-off portions P3 and P4 insulating the conductive portions 133*a*, 133*b*, and 133*c*. For example, the cut-off portions P3 and P4 may include the third cut-off portion P3 insulating the fourth conductive portion 133*a* and the fifth conductive portion 133*b* and the fourth cut-off portion P4 insulating the fifth conductive portion 133*b* and the sixth conductive portion 133*c*.

In an embodiment, the second side cover 135 may include a first contact area 1331 making contact with at least part of the connecting member 199. For example, the first contact area 1331 may be formed on at least a partial area of the conductive portions 133*a*, 133*b*, and 133*c*. The first contact area 1331 may be formed on an inner surface (e.g., a surface facing the −Y-axis direction) of the first side cover 133 so as to face the first guide member 151. The first contact area 1331 may make contact with part (e.g., a second contact area 1991) of the connecting member 199. For example, the conductive portions 133*a*, 133*b*, and 133*c* may be electrically connected with the connecting member 199 as the first contact area 1331 makes contact with the part of the connecting member 199. According to the illustrated embodiment, the first contact area 1331 may be formed on the fourth conductive portion 133*a*, but is not necessarily limited thereto.

In an embodiment, the connecting member 199 may extend from one surface of the first guide member 151 toward the first circuit board 220. For example, the connecting member 199 may be disposed on an upper surface 151*a* of the first guide member 151 and may extend toward the first circuit board 220 through the first guide member 151. For example, the first guide member 151 may have an opening (not illustrated) into which at least part of the connecting member 199 is inserted. The opening may penetrate at least part of the first guide member 151 in a direction (e.g., the Y-axis direction) perpendicular to the upper surface 151*a*. One portion of the connecting member 199 may be disposed between the first side cover 133 and the first guide member 151, and another portion of the connecting member 199 may pass through the first guide member 151 and may be connected with the first circuit board 220.

In an embodiment, the connecting member 199 may include the second contact area 1991 making contact with the first contact area 1331 of the first side cover 133. For example, the second contact area 1991 and the first contact area 1331 may be arranged to face each other. According to an embodiment, the connecting member 199 may electrically connect the first side cover 133 and the first circuit board 220. In various embodiments, the connecting member 199 may include an FPCB and an FRC.

Figure 24:
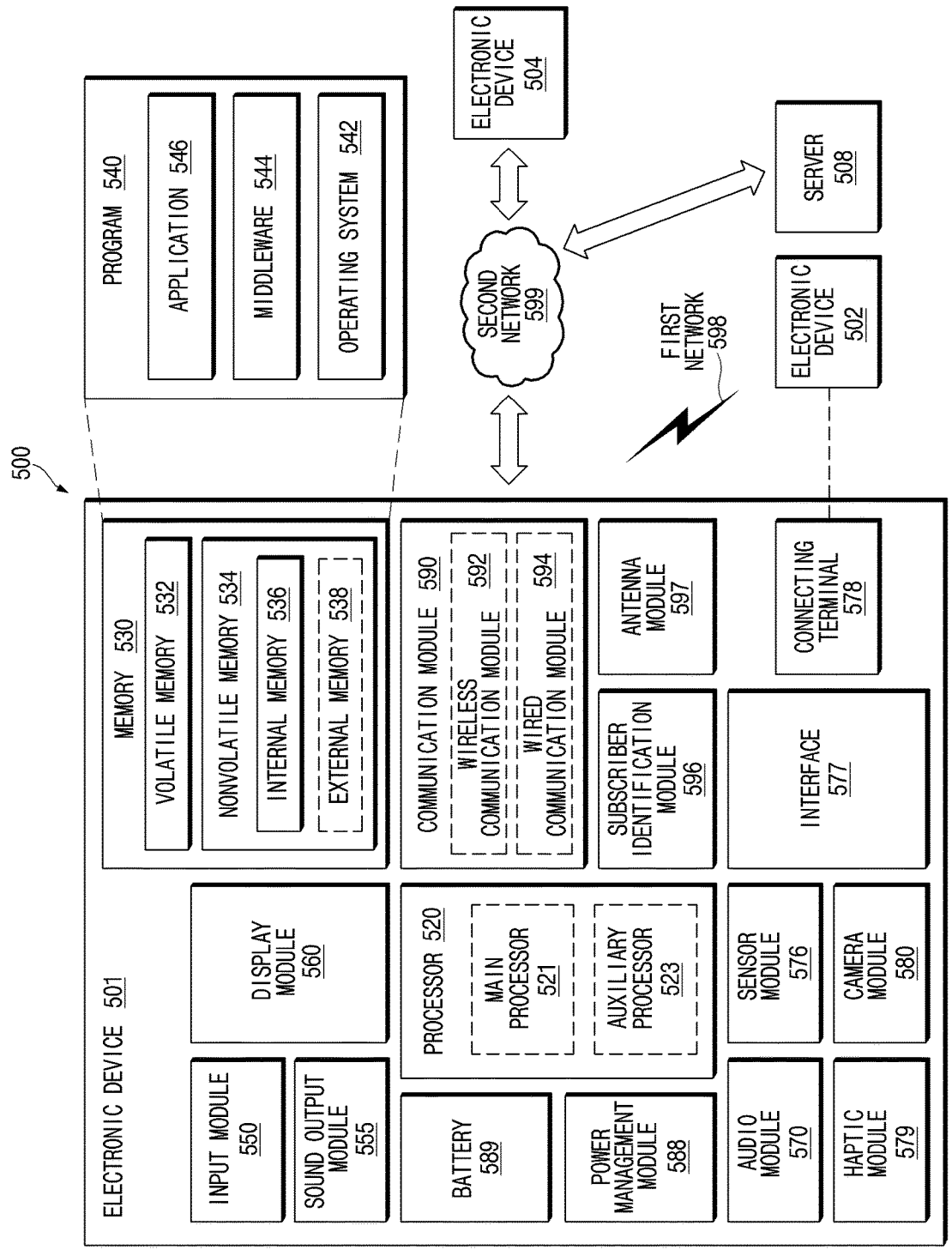
FIG. 24 is a block diagram of an electronic device in a network environment according to an embodiment of the disclosure.

FIG. 24 is a block diagram of an electronic device in a network environment according to an embodiment of the disclosure.

Referring to FIG. 24, the electronic device 501 in the network environment 500 may communicate with an electronic device 502 via a first network 598 (e.g., a short-range wireless communication network), or at least one of an electronic device 504 or a server 508 via a second network 599 (e.g., a long-range wireless communication network). According to an embodiment, the electronic device 501 may communicate with the electronic device 504 via the server 508. According to an embodiment, the electronic device 501 may include a processor 520, memory 530, an input module 550, a sound output module 555, a display module 560, an audio module 570, a sensor module 576, an interface 577, a connecting terminal 578, a haptic module 579, a camera module 580, a power management module 588, a battery 589, a communication module 590, a subscriber identification module (SIM) 596, or an antenna module 597. In some embodiments, at least one of the components (e.g., the connecting terminal 578) may be omitted from the electronic device 501, or one or more other components may be added in the electronic device 501. In some embodiments, some of the components (e.g., the sensor module 576, the camera module 580, or the antenna module 597) may be implemented as a single component (e.g., the display module 560).

The processor 520 may execute, for example, software (e.g., a program 540) to control at least one other component (e.g., a hardware or software component) of the electronic device 501 coupled with the processor 520, and may perform various data processing or computation. According to one embodiment, as at least part of the data processing or computation, the processor 520 may store a command or data received from another component (e.g., the sensor module 576 or the communication module 590) in volatile memory 532, process the command or the data stored in the volatile memory 532, and store resulting data in non-volatile memory 534. According to an embodiment, the processor 520 may include a main processor 521 (e.g., a central processing unit (CPU) or an application processor (AP)), or an auxiliary processor 523 (e.g., a graphics processing unit (GPU), a neural processing unit (NPU), an image signal processor (ISP), a sensor hub processor, or a communication processor (CP)) that is operable independently from, or in conjunction with, the main processor 521. For example, when the electronic device 501 includes the main processor 521 and the auxiliary processor 523, the auxiliary processor 523 may be adapted to consume less power than the main processor 521, or to be specific to a specified function. The auxiliary processor 523 may be implemented as separate from, or as part of the main processor 521.

The auxiliary processor 523 may control at least some of functions or states related to at least one component (e.g., the display module 560, the sensor module 576, or the communication module 590) among the components of the electronic device 501, instead of the main processor 521 while the main processor 521 is in an inactive (e.g., sleep) state, or together with the main processor 521 while the main processor 521 is in an active state (e.g., executing an application). According to an embodiment, the auxiliary processor 523 (e.g., an image signal processor or a communication processor) may be implemented as part of another component (e.g., the camera module 580 or the communication module 590) functionally related to the auxiliary processor 523. According to an embodiment, the auxiliary processor 523 (e.g., the neural processing unit) may include a hardware structure specified for artificial intelligence model processing. An artificial intelligence model may be generated by machine learning. Such learning may be performed, e.g., by the electronic device 501 where the artificial intelligence is performed or via a separate server (e.g., the server 508). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 530 may store various data used by at least one component (e.g., the processor 520 or the sensor module 576) of the electronic device 501. The various data may include, for example, software (e.g., the program 540) and input data or output data for a command related thereto. The memory 530 may include the volatile memory 532 or the non-volatile memory 534.

The program 540 may be stored in the memory 530 as software, and may include, for example, an operating system (OS) 542, middleware 544, or an application 546.

The input module 550 may receive a command or data to be used by another component (e.g., the processor 520) of the electronic device 501, from the outside (e.g., a user) of the electronic device 501. The input module 550 may include, for example, a microphone, a mouse, a keyboard, a key (e.g., a button), or a digital pen (e.g., a stylus pen).

The sound output module 555 may output sound signals to the outside of the electronic device 501. The sound output module 555 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 560 may visually provide information to the outside (e.g., a user) of the electronic device 501. The display module 560 may include, for example, a display, a hologram device, or a projector and control circuitry to control a corresponding one of the display, hologram device, and projector. According to an embodiment, the display module 560 may include a touch sensor adapted to detect a touch, or a pressure sensor adapted to measure the intensity of force incurred by the touch.

The audio module 570 may convert a sound into an electrical signal and vice versa. According to an embodiment, the audio module 570 may obtain the sound via the input module 550, or output the sound via the sound output module 555 or a headphone of an external electronic device (e.g., an electronic device 502) directly (e.g., wiredly) or wirelessly coupled with the electronic device 501.

The sensor module 576 may detect an operational state (e.g., power or temperature) of the electronic device 501 or an environmental state (e.g., a state of a user) external to the electronic device 501, and then generate an electrical signal or data value corresponding to the detected state. According to an embodiment, the sensor module 576 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 577 may support one or more specified protocols to be used for the electronic device 501 to be coupled with the external electronic device (e.g., the electronic device 502) directly (e.g., wiredly) or wirelessly. According to an embodiment, the interface 577 may include, for example, a high definition multimedia interface (HDMI), a universal serial bus (USB) interface, an SD card interface, or an audio interface.

A connecting terminal 578 may include a connector via which the electronic device 501 may be physically connected with the external electronic device (e.g., the electronic device 502). According to an embodiment, the connecting terminal 578 may include, for example, a HDMI connector, a USB connector, a SD card connector, or an audio connector (e.g., a headphone connector).

The haptic module 579 may convert an electrical signal into a mechanical stimulus (e.g., a vibration or a movement) or electrical stimulus which may be recognized by a user via his tactile sensation or kinesthetic sensation. According to an embodiment, the haptic module 579 may include, for example, a motor, a piezoelectric element, or an electric stimulator.

The camera module 580 may capture a still image or moving images. According to an embodiment, the camera module 580 may include one or more lenses, image sensors, image signal processors, or flashes.

The power management module 588 may manage power supplied to the electronic device 501. According to one embodiment, the power management module 588 may be implemented as at least part of, for example, a power management integrated circuit (PMIC).

The battery 589 may supply power to at least one component of the electronic device 501. According to an embodiment, the battery 589 may include, for example, a primary cell which is not rechargeable, a secondary cell which is rechargeable, or a fuel cell.

The communication module 590 may support establishing a direct (e.g., wired) communication channel or a wireless communication channel between the electronic device 501 and the external electronic device (e.g., the electronic device 502, the electronic device 504, or the server 508) and performing communication via the established communication channel. The communication module 590 may include one or more communication processors that are operable independently from the processor 520 (e.g., the application processor (AP)) and supports a direct (e.g., wired) communication or a wireless communication. According to an embodiment, the communication module 590 may include a wireless communication module 592 (e.g., a cellular communication module, a short-range wireless communication module, or a global navigation satellite system (GNSS) communication module) or a wired communication module 594 (e.g., a local area network (LAN) communication module or a power line communication (PLC) module). A corresponding one of these communication modules may communicate with the external electronic device via the first network 598 (e.g., a short-range communication network, such as Bluetooth™, Wi-Fi direct, or infrared data association (IrDA)) or the second network 599 (e.g., a long-range communication network, such as a legacy cellular network, a 5G network, a next-generation communication network, the Internet, or a computer network (e.g., LAN or wide area network (WAN))). These various types of communication modules may be implemented as a single component (e.g., a single chip), or may be implemented as multi components (e.g., multi chips) separate from each other. The wireless communication module 592 may identify and authenticate the electronic device 501 in a communication network, such as the first network 598 or the second network 599, using subscriber information (e.g., international mobile subscriber identity (IMSI)) stored in the subscriber identification module 596.

The wireless communication module 592 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 592 may support a high-frequency band (e.g., the mmWave band) to achieve, e.g., a high data transmission rate. The wireless communication module 592 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 592 may support various requirements specified in the electronic device 501, an external electronic device (e.g., the electronic device 504), or a network system (e.g., the second network 599). According to an embodiment, the wireless communication module 592 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 597 may transmit or receive a signal or power to or from the outside (e.g., the external electronic device) of the electronic device 501. According to an embodiment, the antenna module 597 may include an antenna including a radiating element composed of a conductive material or a conductive pattern formed in or on a substrate (e.g., a printed circuit board (PCB)). According to an embodiment, the antenna module 597 may include a plurality of antennas (e.g., array antennas). In such a case, at least one antenna appropriate for a communication scheme used in the communication network, such as the first network 598 or the second network 599, may be selected, for example, by the communication module 590 (e.g., the wireless communication module 592) from the plurality of antennas. The signal or the power may then be transmitted or received between the communication module 590 and the external electronic device via the selected at least one antenna. According to an embodiment, another component (e.g., a radio frequency integrated circuit (RFIC)) other than the radiating element may be additionally formed as part of the antenna module 597.

According to various embodiments, the antenna module 597 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 501 and the external electronic device 504 via the server 508 coupled with the second network 599. Each of the electronic devices 502 or 504 may be a device of a same type as, or a different type, from the electronic device 501. According to an embodiment, all or some of operations to be executed at the electronic device 501 may be executed at one or more of the external electronic devices 502, 504, or 508. For example, if the electronic device 501 should perform a function or a service automatically, or in response to a request from a user or another device, the electronic device 501, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 501. The electronic device 501 may provide the outcome, with or without further processing of the outcome, as at least part of a reply to the request. To that end, a cloud computing, distributed computing, mobile edge computing (MEC), or client-server computing technology may be used, for example. The electronic device 501 may provide ultra low-latency services using, e.g., distributed computing or mobile edge computing. In another embodiment, the external electronic device 504 may include an internet-of-things (IoT) device. The server 508 may be an intelligent server using machine learning and/or a neural network. According to an embodiment, the external electronic device 504 or the server 508 may be included in the second network 599. The electronic device 501 may be applied to intelligent services (e.g., smart home, smart city, smart car, or healthcare) based on 5G communication technology or IoT-related technology.

Figure 25:
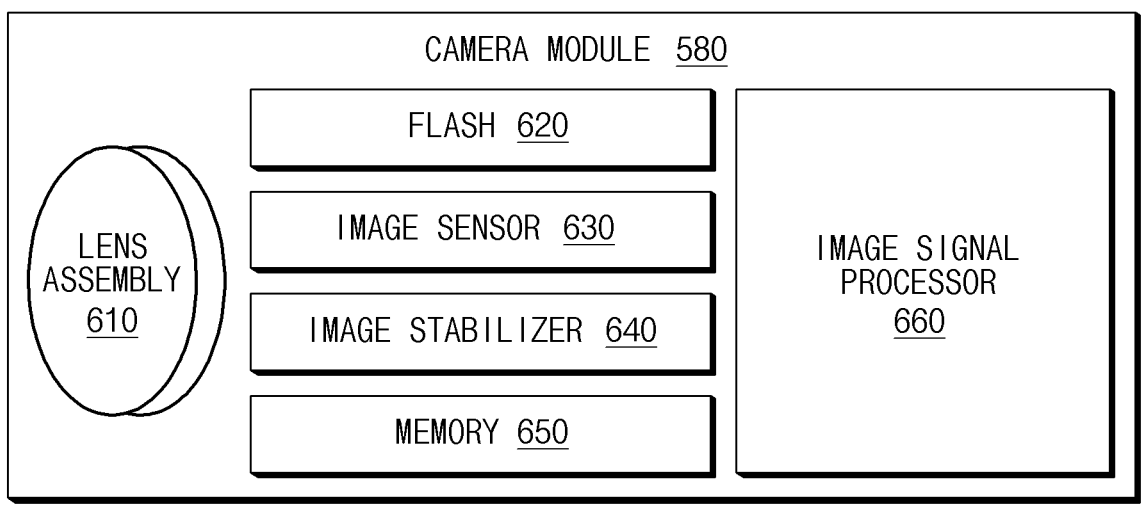
FIG. 25 is a block diagram illustrating a camera module of the electronic device according to an embodiment of the disclosure.

FIG. 25 is a block diagram illustrating the camera module according to an embodiment of the disclosure.

Referring to FIG. 25, the camera module 580 may include a lens assembly 610, a flash 620, an image sensor 630, an image stabilizer 640, memory 650 (e.g., buffer memory), or an image signal processor 660. The lens assembly 610 may collect light emitted or reflected from an object whose image is to be taken. The lens assembly 610 may include one or more lenses. According to an embodiment, the camera module 580 may include a plurality of lens assemblies 610. In such a case, the camera module 580 may form, for example, a dual camera, a 360-degree camera, or a spherical camera. Some of the plurality of lens assemblies 610 may have the same lens attribute (e.g., view angle, focal length, auto-focusing, f number, or optical zoom), or at least one lens assembly may have one or more lens attributes different from those of another lens assembly. The lens assembly 610 may include, for example, a wide-angle lens or a telephoto lens.

The flash 620 may emit light that is used to reinforce light reflected from an object. According to an embodiment, the flash 620 may include one or more light emitting diodes (LEDs) (e.g., a red-green-blue (RGB) LED, a white LED, an infrared (IR) LED, or an ultraviolet (UV) LED) or a xenon lamp. The image sensor 630 may obtain an image corresponding to an object by converting light emitted or reflected from the object and transmitted via the lens assembly 610 into an electrical signal. According to an embodiment, the image sensor 630 may include one selected from image sensors having different attributes, such as a RGB sensor, a black-and-white (BW) sensor, an IR sensor, or a UV sensor, a plurality of image sensors having the same attribute, or a plurality of image sensors having different attributes. Each image sensor included in the image sensor 630 may be implemented using, for example, a charged coupled device (CCD) sensor or a complementary metal oxide semiconductor (CMOS) sensor.

The image stabilizer 640 may move the image sensor 630 or at least one lens included in the lens assembly 610 in a particular direction, or control an operational attribute (e.g., adjust the read-out timing) of the image sensor 630 in response to the movement of the camera module 580 or the electronic device 501 including the camera module 580. This allows compensating for at least part of a negative effect (e.g., image blurring) by the movement on an image being captured. According to an embodiment, the image stabilizer 640 may sense such a movement by the camera module 580 or the electronic device 501 using a gyro sensor (not shown) or an acceleration sensor (not shown) disposed inside or outside the camera module 580. According to an embodiment, the image stabilizer 640 may be implemented, for example, as an optical image stabilizer. The memory 650 may store, at least temporarily, at least part of an image obtained via the image sensor 630 for a subsequent image processing task. For example, if image capturing is delayed due to shutter lag or multiple images are quickly captured, a raw image obtained (e.g., a Bayer-patterned image, a high-resolution image) may be stored in the memory 650, and its corresponding copy image (e.g., a low-resolution image) may be previewed via the display module 560. Thereafter, if a specified condition is met (e.g., by a user's input or system command), at least part of the raw image stored in the memory 650 may be obtained and processed, for example, by the image signal processor 660. According to an embodiment, the memory 650 may be configured as at least part of the memory 530 or as a separate memory that is operated independently from the memory 530.

The image signal processor 660 may perform one or more image processing with respect to an image obtained via the image sensor 630 or an image stored in the memory 650. The one or more image processing may include, for example, depth map generation, three-dimensional (3D) modeling, panorama generation, feature point extraction, image synthesizing, or image compensation (e.g., noise reduction, resolution adjustment, brightness adjustment, blurring, sharpening, or softening). Additionally or alternatively, the image signal processor 660 may perform control (e.g., exposure time control or read-out timing control) with respect to at least one (e.g., the image sensor 630) of the components included in the camera module 580. An image processed by the image signal processor 660 may be stored back in the memory 650 for further processing, or may be provided to an external component (e.g., the memory 530, the display module 560, the electronic device 502, the electronic device 504, or the server 508) outside the camera module 580. According to an embodiment, the image signal processor 660 may be configured as at least part of the processor 520, or as a separate processor that is operated independently from the processor 520. If the image signal processor 660 is configured as a separate processor from the processor 520, at least one image processed by the image signal processor 660 may be displayed, by the processor 520, via the display module 560 as it is or after being further processed.

According to an embodiment, the electronic device 501 may include a plurality of camera modules 580 having different attributes or functions. In such a case, at least one of the plurality of camera modules 580 may form, for example, a wide-angle camera and at least another of the plurality of camera modules 580 may forma telephoto camera. Similarly, at least one of the plurality of camera modules 580 may form, for example, a front camera and at least another of the plurality of camera modules 580 may forma rear camera.

Figure 26:
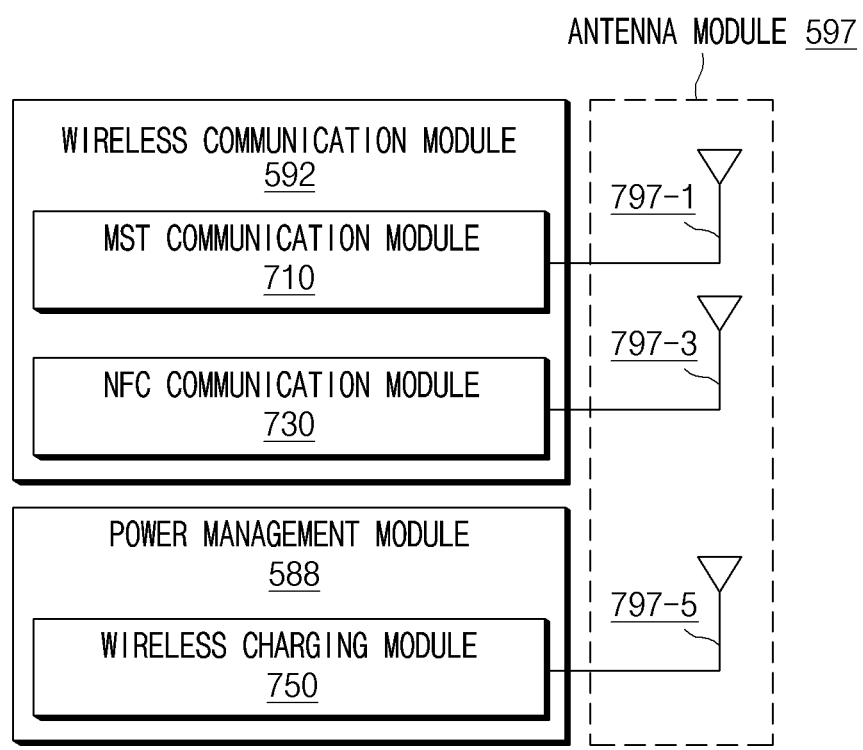
FIG. 26 is a block diagram illustrating a wireless communication module, a power management module, and an antenna module of the electronic device according to an embodiment of the disclosure.

FIG. 26 is a block diagram illustrating the wireless communication module, the power management module, and the antenna module of the electronic device according to an embodiment of the disclosure.

Referring to FIG. 26, the wireless communication module 592 may include a magnetic secure transmission (MST) communication module 710 or a near-field communication (NFC) module 730, and the power management module 588 may include a wireless charging module 750. In such a case, the antenna module 597 may include a plurality of antennas that include a MST antenna 797-1 connected with the MST communication module 710, a NFC antenna 797-3 connected with the NFC communication module 730, and a wireless charging antenna 797-5 connected with the wireless charging module 750. For ease of description, the same components as those described in regard to FIG. 24 are briefly described or omitted from the description.

The MST communication module 710 may receive a signal containing control information or payment information such as card information from the processor 520, generate a magnetic signal corresponding to the received signal, and then transfer the generated magnetic signal to the external electronic device 502 (e.g., a point-of-sale (POS) device) via the MST antenna 797-1. To generate the magnetic signal, according to an embodiment, the MST communication module 710 may include a switching module (not shown) that includes one or more switches connected with the MST antenna 797-1, and control the switching module to change the direction of voltage or current supplied to the MST antenna 797-1 according to the received signal. The change of the direction of the voltage or current allows the direction of the magnetic signal (e.g., a magnetic field) emitted from the MST antenna 797-1 to change accordingly. If detected at the external electronic device 502, the magnetic signal with its direction changing may cause an effect (e.g., a waveform) similar to that of a magnetic field that is generated when a magnetic card corresponding to the card information associated with the received signal is swiped through a card reader of the electronic device 502. According to an embodiment, for example, payment-related information and a control signal that are received by the electronic device 502 in the form of the magnetic signal may be further transmitted to an external server 508 (e.g., a payment server) via the network 599.

The NFC communication module 730 may obtain a signal containing control information or payment information such as card information from the processor 520 and transmit the obtained signal to the external electronic device 502 via the NFC antenna 797-3. According to an embodiment, the NFC communication module 730 may receive such a signal transmitted from the external electronic device 502 via the NFC antenna 797-3.

The wireless charging module 750 may wirelessly transmit power to the external electronic device 502 (e.g., a cellular phone or wearable device) via the wireless charging antenna 797-5, or wirelessly receive power from the external electronic device 502 (e.g., a wireless charging device). The wireless charging module 750 may support one or more of various wireless charging schemes including, for example, a magnetic resonance scheme or a magnetic induction scheme.

According to an embodiment, some of the MST antenna 797-1, the NFC antenna 797-3, or the wireless charging antenna 797-5 may share at least part of their radiators. For example, the radiator of the MST antenna 797-1 may be used as the radiator of the NFC antenna 797-3 or the wireless charging antenna 797-5, or vice versa. In such a case, the antenna module 597 may include a switching circuit (not shown) adapted to selectively connect (e.g., close) or disconnect (e.g. open) at least part of the antennas 797-1, 797-3, or 797-5, for example, under the control of the wireless communication module 592 (e.g., the MST communication module 710 or the NFC communication module 730) or the power management module (e.g., the wireless charging module 750). For example, when the electronic device 501 uses a wireless charging function, the NFC communication module 730 or the wireless charging module 750 may control the switching circuit to temporarily disconnect at least one portion of the radiators shared by the NFC antenna 797-3 and the wireless charging antenna 797-5 from the NFC antenna 797-3 and to connect the at least one portion of the radiators with the wireless charging antenna 797-5.

According to an embodiment, at least one function of the MST communication module 710, the NFC communication module 730, or the wireless charging module 750 may be controlled by an external processor (e.g., the processor 520). According to an embodiment, at least one specified function (e.g., a payment function) of the MST communication module 710 or the NFC communication module 730 may be performed in a trusted execution environment (TEE). According to an embodiment, the TEE may form an execution environment in which, for example, at least some designated area of the memory 530 is allocated to be used for performing a function (e.g., a financial transaction or personal information-related function) that requires a relatively high level of security. In such a case, access to the at least some designated area of the memory 530 may be restrictively permitted, for example, according to an entity accessing thereto or an application being executed in the TEE.

An electronic device 100 according to an embodiment of the disclosure may include a first structure 110, a second structure 160 coupled to the first structure so as to be slidable in a first direction D1 or a second direction D1 opposite to the first direction, a display 170 that is at least partially disposed on the second structure and that moves relative to the first structure together with the second structure, in which a size of an area of the display exposed on a front side of the electronic device is changed in response to a sliding motion of the second structure, and a driving unit 180 that connects part of the first structure and part of the second structure and generates an elastic force in the first direction or the second direction in response to a movement of the second structure. The first structure may include a rear member 120 that forms part of a rear side of the electronic device and a bracket 140 disposed between the rear member and the second structure and configured such that a partial area faces the second structure. The driving unit may be disposed between the second structure and the bracket and may have one portion coupled to the second structure and another portion coupled to the bracket.

In various embodiments, the bracket may include a first surface 141 that faces toward the second structure and a second surface 142 that faces away from the first surface. The second structure may include a third surface 164a on which the display is disposed and a fourth surface 164b that faces away from the third surface and faces the first surface of the bracket. The driving unit may be disposed between the first surface of the bracket and the fourth surface of the second structure.

In various embodiments, the second structure may be configured such that a size of an area of the fourth surface of the second structure that faces the first surface of the bracket is changed as the second structure slides relative to the bracket and the rear member.

In various embodiments, the driving unit may include a first support portion 181 coupled to the first surface of the bracket, a second support portion 183 coupled to the fourth surface of the second structure, and an elastic portion 185 that connects the first support portion and the second support portion, and the elastic portion may be compressed or uncompressed with a change in a distance between the first support portion and the second support portion.

In various embodiments, a first connecting shaft 145 may be disposed on the first surface of the bracket, and a second connecting shaft 165 may be disposed on the fourth surface of the second structure. The first support portion may be rotatably coupled to the first connecting shaft, and the second support portion may be rotatably coupled to the second connecting shaft.

In various embodiments, the first connecting shaft may vertically extend from the first surface of the bracket toward the second structure, and the second connecting shaft may vertically extend from the fourth surface of the second structure toward the bracket.

In various embodiments, the driving unit may be configured such that the distance between the first support portion and the second support portion is changed as the second support portion linearly moves together with the second structure in the sliding direction when the second structure slides relative to the bracket.

In various embodiments, when the second structure moves relative to the bracket in the first direction or the second direction, the first support portion may rotate about the first connecting shaft in a predetermined range, and the second support portion may linearly move together with the second structure relative to the first support portion in the first direction or the second direction while rotating about the second connecting shaft in a predetermined range.

In various embodiments, the elastic portion may generate the elastic force by being compressed or uncompressed in response to the linear movement of the second support portion, and the elastic force may act in a direction in which the first support portion and the second support portion move away from each other.

In various embodiments, the electronic device may further include a battery 192 that is disposed inside the first structure and that supplies electric power to at least a part of the electronic device, and the battery may be located to face the driving unit with the bracket therebetween and may be supported by the second surface of the bracket.

In various embodiments, the electronic device may further include a battery 192 that is disposed inside the first structure and that supplies electric power to at least a part of the electronic device. The battery may be formed in a shape in which a width of one partial area differs from a width of another partial area, and the widths of the battery may be defined as lengths in a direction parallel to the sliding direction.

In various embodiments, the battery may include a first portion 192a having a first width W1 and a second portion 192b extending from the first portion and having a second width W2 smaller than the first width, and the second portion may extend from the first portion in a direction perpendicular to the sliding direction.

In various embodiments, the display may include a first area 171 at least partially supported by the second structure and a second area 173 extending from the first area. The electronic device may include a first state in which the first area forms the front side of the electronic device and the second area is located inside the first structure and a second state in which part of the second area forms the front side of the electronic device together with the first area as the second structure moves in the first direction by a specified distance in the first state.

In various embodiments, the driving unit may include a first support portion 181 coupled to the bracket, a second support portion 183 coupled to the second structure, and an elastic portion 185 that connects the first support portion and the second support portion, and the second support portion may be located in the second direction with respect to the first support portion in the first state and may be located in the first direction with respect to the first support portion in the second state.

In various embodiments, the electronic device may further include a roller 191 that is coupled to one side of the bracket and that extends in a direction perpendicular to the sliding direction, and the display may be configured such that at least part thereof moves through a space between the rear member and the roller in response to the sliding motion of the second structure.

In various embodiments, the electronic device may further include a display support member 193 that supports the display together with the second structure and that includes a partially bendable portion, and the display support member may be attached to a rear surface of a partial area of the display.

In various embodiments, the roller may be coupled to the bracket so as to be rotatable about an axis of rotation R perpendicular to the sliding direction, and the display support member may be disposed to surround at least part of the roller.

In various embodiments, at least part of the display support member may be configured to slide into the space between the rear member and the roller, or slide out of the space between the rear member and the roller, by rotation of the roller when the second structure slides.

An electronic device 100 according to an embodiment of the disclosure may include a first structure 110 including a bracket 140, and a rear member 120 and a side member 130 coupled to the bracket to surround part of the bracket, a second structure 160 coupled to the first structure 110 so as to be slidable in a first direction D1 or a second direction D2 opposite to the first direction, a display 170 that is at least partially disposed on the second structure and that moves relative to the first structure together with the second structure, in which a size of an exposed area of the display that forms a front side of the electronic device is changed in response to a sliding motion of the second structure, and a driving unit 180 that is disposed between the bracket and the second structure and that generates an elastic force in the first direction or the second direction in response to a movement of the second structure. The driving unit may include a first support portion 181 coupled to the bracket, a second support portion 183 coupled to the second structure, and an elastic portion 185 that connects the first support portion and the second support portion and that is compressed or uncompressed with a change in a distance between the first support portion and the second support portion. The electronic device may include a first state in which the exposed area has a first size and a second state in which the exposed area is expanded to a second size larger than the first size as the second structure moves in the first direction by a predetermined distance in the first state. The driving unit may be configured to generate the elastic force in a direction opposite to a moving direction of the second structure in a specified section and generate the elastic force in the same direction as the moving direction of the second structure after the specified section, when the electronic device is changed to the first state or the second state.

In various embodiments, when the electronic device is viewed from the front, a position of the second support portion in the first state may be defined as a first point A1, a position of the second support portion in a state in which the elastic portion is compressed to the maximum may be defined as a second point A2, and a position of the second support portion in the second state may be defined as a third point A3. The elastic portion may be configured to apply an elastic force to the second structure in the second direction in a section between the first point and the second point and apply an elastic force to the second structure in the first direction in a section between the second point and the third point, when the electronic device is changed from the first state to the second state. The elastic portion may be configured to apply an elastic force to the second structure in the first direction in a section between the third point and the second point and apply an elastic force to the second structure in the second direction in a section between the second point and the first point, when the electronic device is changed from the second state to the first state.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively," as "coupled with," "coupled to," "connected with," or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 540) including one or more instructions that are stored in a storage medium (e.g., internal memory 536 or external memory 538) that is readable by a machine (e.g., the electronic device 501). For example, a processor (e.g., the processor 520) of the machine (e.g., the electronic device 501) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
a first structure;
a second structure coupled to the first structure so as to be slidable in a first direction or a second direction opposite to the first direction;
a display, at least part of which is disposed on the second structure, the display being configured to move relative to the first structure together with the second structure, wherein a size of an area of the display exposed on a front side of the electronic device changes in accordance with a sliding motion of the second structure;
a driving unit configured to:
connect part of the first structure and part of the second structure, and
generate an elastic force in the first direction or the second direction in response to a movement of the second structure;
a first connecting shaft disposed on a surface of the first structure and rotatably coupled to the driving unit; and
a second connecting shaft disposed on a surface of the second structure and rotatably coupled to the driving unit,
wherein the first structure includes:
a rear member configured to form part of a rear side of the electronic device, and
a bracket disposed between the rear member and the second structure and configured such that a partial area thereof faces the second structure,
wherein the driving unit is disposed between the second structure and the bracket and has one portion coupled to the second structure and another portion coupled to the bracket,
wherein the display includes a first area at least partially supported by the second structure and a second area extending from the first area,
wherein the electronic device includes:
a first state in which the first area forms the front side of the electronic device and the second area is located inside the first structure, and
a second state in which part of the second area forms the front side of the electronic device together with the first area as the second structure moves in the first direction by a specified distance based on the first state,
wherein the driving unit includes a first support portion coupled to the bracket, a second support portion coupled to the second structure, and an elastic portion configured to connect the first support portion and the second support portion, and
wherein the second support portion is located in the second direction with respect to the first support portion in the first state and is located in the first direction with respect to the first support portion in the second state.

2. The electronic device of claim 1,
wherein the bracket includes a first surface configured to face toward the second structure and a second surface configured to face away from the first surface,
wherein the second structure includes a third surface on which the display is disposed and a fourth surface configured to face away from the third surface and face the first surface of the bracket, and
wherein the driving unit is disposed between the first surface of the bracket and the fourth surface of the second structure.

3. The electronic device of claim 2, wherein the second structure is configured such that a size of an area of the fourth surface of the second structure configured to face the first surface of the bracket changes as the second structure slides relative to the bracket and the rear member.

4. The electronic device of claim 2,
wherein the driving unit includes a first support portion coupled to the first surface of the bracket, a second support portion coupled to the fourth surface of the second structure, and an elastic portion configured to connect the first support portion and the second support portion, and
wherein the elastic portion is compressed or uncompressed according to a change in a distance between the first support portion and the second support portion.

5. The electronic device of claim 4,
wherein the first connecting shaft is disposed on the first surface of the bracket,
wherein the second connecting shaft is disposed on the fourth surface of the second structure,
wherein the first support portion is rotatably coupled to the first connecting shaft, and
wherein the second support portion is rotatably coupled to the second connecting shaft.

6. The electronic device of claim 5,
wherein the first connecting shaft vertically extends from the first surface of the bracket toward the second structure, and
wherein the second connecting shaft vertically extends from the fourth surface of the second structure toward the bracket.

7. The electronic device of claim 4, wherein the driving unit is configured such that the distance between the first support portion and the second support portion changes as the second support portion moves linearly together with the second structure in the sliding direction when the second structure slides relative to the bracket.

8. The electronic device of claim 5, wherein when the second structure moves relative to the bracket in the first direction or the second direction, the first support portion rotates about the first connecting shaft in a predetermined range, and the second support portion moves linearly together with the second structure relative to the first support portion in the first direction or the second direction while rotating about the second connecting shaft in a predetermined range.

9. The electronic device of claim 7,
wherein the elastic portion generates the elastic force by being compressed or uncompressed in response to the linear movement of the second support portion, and
wherein the elastic force acts in a direction in which the first support portion and the second support portion move away from each other.

10. The electronic device of claim 4, further comprising:
a battery disposed inside the first structure and configured to supply electric power to at least a part of the electronic device,
wherein the battery is located to face the driving unit with the bracket therebetween and is supported by the second surface of the bracket.

11. The electronic device of claim 1, further comprising:
a battery disposed inside the first structure and configured to supply electric power to at least a part of the electronic device,
wherein the battery is formed in a shape in which a width of one partial area differs from a width of another partial area, and
wherein the widths of the battery are defined as lengths in a direction parallel to the sliding direction.

12. The electronic device of claim 11,
wherein the battery includes a first portion having a first width and a second portion extending from the first portion and having a second width smaller than the first width, and
wherein the second portion extends from the first portion in a direction perpendicular to the sliding direction.

13. The electronic device of claim 1, further comprising:
a roller coupled to one side of the bracket, the roller extending in a direction perpendicular to the sliding direction,
wherein the display is configured such that at least part thereof moves through a space between the rear member and the roller in response to the sliding motion of the second structure.

14. The electronic device of claim 13, further comprising:
a display support member configured to support the display together with the second structure, the display support member including a flexible portion,
wherein the display support member is attached to a rear surface of a partial area of the display.

15. The electronic device of claim 14,
wherein the roller is coupled to the bracket so as to be rotatable about an axis of rotation perpendicular to the sliding direction, and
wherein the display support member is disposed to surround at least part of the roller.

16. The electronic device of claim 14, wherein at least part of the display support member is configured to:
slide into the space between the rear member and the roller, or
slide out of the space between the rear member and the roller, by rotation of the roller when the second structure slides.

17. An electronic device comprising:
a first structure including a bracket, a rear member, and a side member coupled to the bracket to surround part of the bracket;
a second structure coupled to the first structure so as to be slidable in a first direction or a second direction opposite to the first direction;
a display, at least part of which is disposed on the second structure, the display being configured to move relative to the first structure together with the second structure, wherein a size of an exposed area of the display configured to form a front side of the electronic device changes in accordance with a sliding motion of the second structure; and
a driving unit disposed between the bracket and the second structure and configured to generate an elastic force in the first direction or the second direction in accordance with a movement of the second structure,
wherein the driving unit includes:
a first support portion coupled to the bracket,
a second support portion coupled to the second structure, and
an elastic portion configured to connect the first support portion and the second support portion and which is compressed or uncompressed according to a change in a distance between the first support portion and the second support portion,
wherein the electronic device further includes:
a first connecting shaft disposed on a surface of the first structure and rotatably coupled to the first support portion, and
a second connecting shaft disposed on a surface of the second structure and rotatably coupled to the second support portion,
wherein the electronic device includes a first state in which the exposed area has a first size and a second state in which the exposed area is expanded to a second size larger than the first size as the second structure moves in the first direction by a predetermined distance,
wherein the driving unit is configured to generate the elastic force in a direction opposite to a moving direction of the second structure in a specified section and generate the elastic force in the same direction as the moving direction of the second structure after the specified section, when the electronic device is changed to the first state or the second state,
wherein when the electronic device is viewed from the front side, a position of the second support portion in the first state is defined as a first point, a position of the second support portion in a state in which the elastic portion is compressed to a maximum is defined as a second point, and a position of the second support portion in the second state is defined as a third point,
wherein the elastic portion is configured to:
apply the elastic force to the second structure in the second direction in a section between the first point and the second point, and
apply the elastic force to the second structure in the first direction in a section between the second point and the third point.

* * * * *